(12) United States Patent
Alexander et al.

(10) Patent No.: US 6,292,717 B1
(45) Date of Patent: Sep. 18, 2001

(54) ENERGY INFORMATION DEVICE AND GRAPHICAL DISPLAY FOR A CIRCUIT BREAKER

(75) Inventors: James O. Alexander, Atlanta; William A. King, Loganville; David A. Leone, Lilburn, all of GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 09/044,716

(22) Filed: Mar. 19, 1998

(51) Int. Cl.[7] .............................. G05D 11/00; G01R 19/00
(52) U.S. Cl. .......................... 700/293; 700/292; 700/83; 702/64; 340/825.36
(58) Field of Search .................................... 700/286, 292, 700/293, 291, 21, 22, 9, 17, 83; 702/57, 58, 64, 188; 361/62, 63, 64; 340/286.01, 825.06, 825.16, 825.36, 501, 506

(56) References Cited

U.S. PATENT DOCUMENTS

| | | | |
|---|---|---|---|
| 4,086,568 | * | 4/1978 | Watts, Jr. et al. ............... 340/147 R |
| 4,351,012 | * | 9/1982 | Elms et al. ............................. 361/96 |
| 4,556,882 | * | 12/1985 | Brifman et al. ................. 340/825.06 |
| 5,170,360 | * | 12/1992 | Porter et al. ......................... 364/483 |
| 5,185,705 | * | 2/1993 | Farrington ............................ 364/483 |
| 5,926,089 | * | 7/1999 | Sekiguchi et al. ................... 340/500 |
| 5,995,911 | * | 11/1999 | Hart ....................................... 702/64 |
| 6,018,451 | * | 1/2000 | Lyke et al. .......................... 361/93.2 |
| 6,157,527 | * | 12/2000 | Spencer et al. ....................... 361/64 |

* cited by examiner

Primary Examiner—Paul P. Gordon

(57) ABSTRACT

An energy information system for use with a circuit breaker coupled between a power source and a load, the energy information system comprising: sensing apparatus for sensing at least one of i) a voltage, and ii) a current flowing between the power source and the load through the circuit breaker; detecting apparatus for detecting transitions of a sensed voltage; counting apparatus for counting a number of times the circuit breaker trips and interrupts the current flow between the power source and the load; measuring apparatus for i) measuring the current flow through the circuit breaker when the circuit breaker trips and interrupts the current flow between the power source and the load and ii) determining a plurality of energy related parameters including a measure of at least one of the voltage, the current and the frequency based on an output from the detecting apparatus, between the power source and the load; input apparatus for accepting a user input, the user input controlling at least one of the circuit breaker and a display apparatus; the display apparatus for displaying at least one of the plurality of conditions of the circuit breaker responsive to the input apparatus; and communication apparatus coupled to the input apparatus for selectively communicating at least one of the plurality of energy related parameters to a remote terminal.

49 Claims, 41 Drawing Sheets

AO VOLTAGE

PHASE BALANCE

BO VOLTAGE

CO CURRENT

FIG. 6A
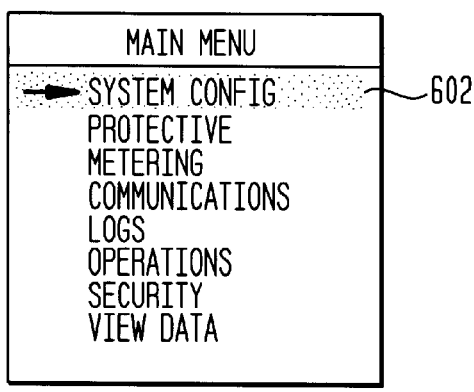
FIG. 6B
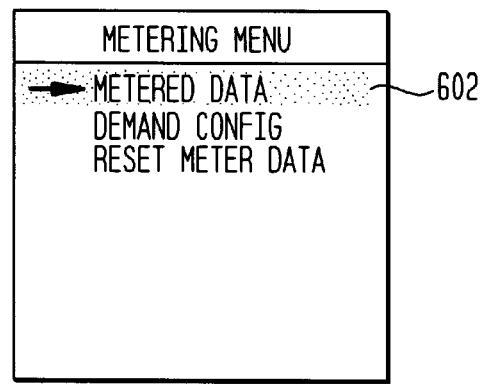
FIG. 6C
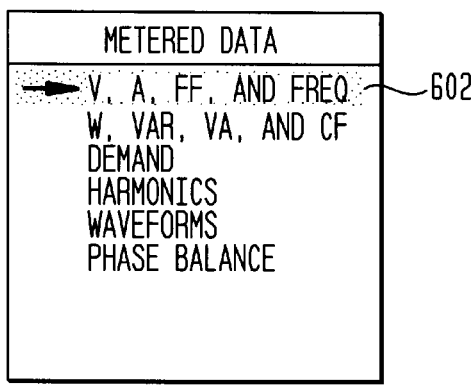
FIG. 6D
| DEMAND | |
|---|---|
| PERIOD TIME | 00:24 |
| AVG AMP DEMAND | |
| PRESENT AMPS | 1206 |
| MAX AMPS | 2011 |
| WATT DEMAND | |
| PRESENT FWD KW | 426 |
| FWD MAX KW | 711 |
| REV MAX W | 0 |
FIG. 6E
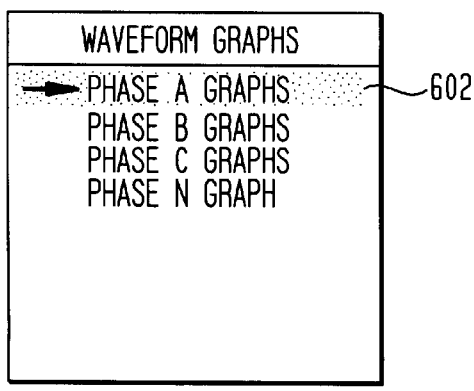
FIG. 6F
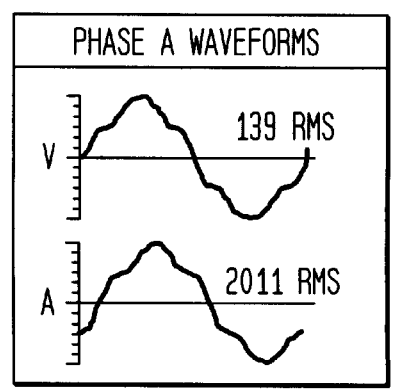

FIG. 7G

| | PROTECTIVE CONFIG | | |
|---|---|---|---|
| | PU | OLY | TYPE |
| LT | 1300 | 10 | I2T |
| ST | 10000 | .07 | FIXED |
| GF | 1100 | .40 | I2T |
| | PU | | |
| INST | 6000 | | |

FIG. 7H

| | AMPS | | VOLTS |
|---|---|---|---|
| Ao | 2011 | AB | 241 |
| Bo | 2011 | BC | 241 |
| Co | 2011 | CA | 241 |
| AVG | 2011 | AVG | 241 |
| GND | 0 | Ao | 133 |
| No | 2011 | Bo | 133 |
| | | Co | 133 |
| | PF | AVG | 133 |
| Ao | 0.00 LG | | |
| Bo | 1.00 LG | FREQ | |
| Co | 0.30 LG | 60.0 | |

FIG. 7I

| FWD KW | 711 |
|---|---|
| FWD KVAR | 420 |
| KVA | 840 |
| FWD KWH | 144 |
| REV WH | 0 |
| FWD VARH | 85463 |
| REV VARH | 0 |
| Ao CF | 1.48 |
| Bo CF | 1.46 |
| Co CF | 1.46 |

FIG. 7J

| DEMAND | |
|---|---|
| PERIOD TIME | 00:24 |
| AVG AMP DEMAND | |
| PRESENT AMPS | 1206 |
| MAX AMPS | 2011 |
| WATT DEMAND | |
| PRESENT FWD KW | 426 |
| FWD MAX KW | 711 |
| REV MAX W | 0 |

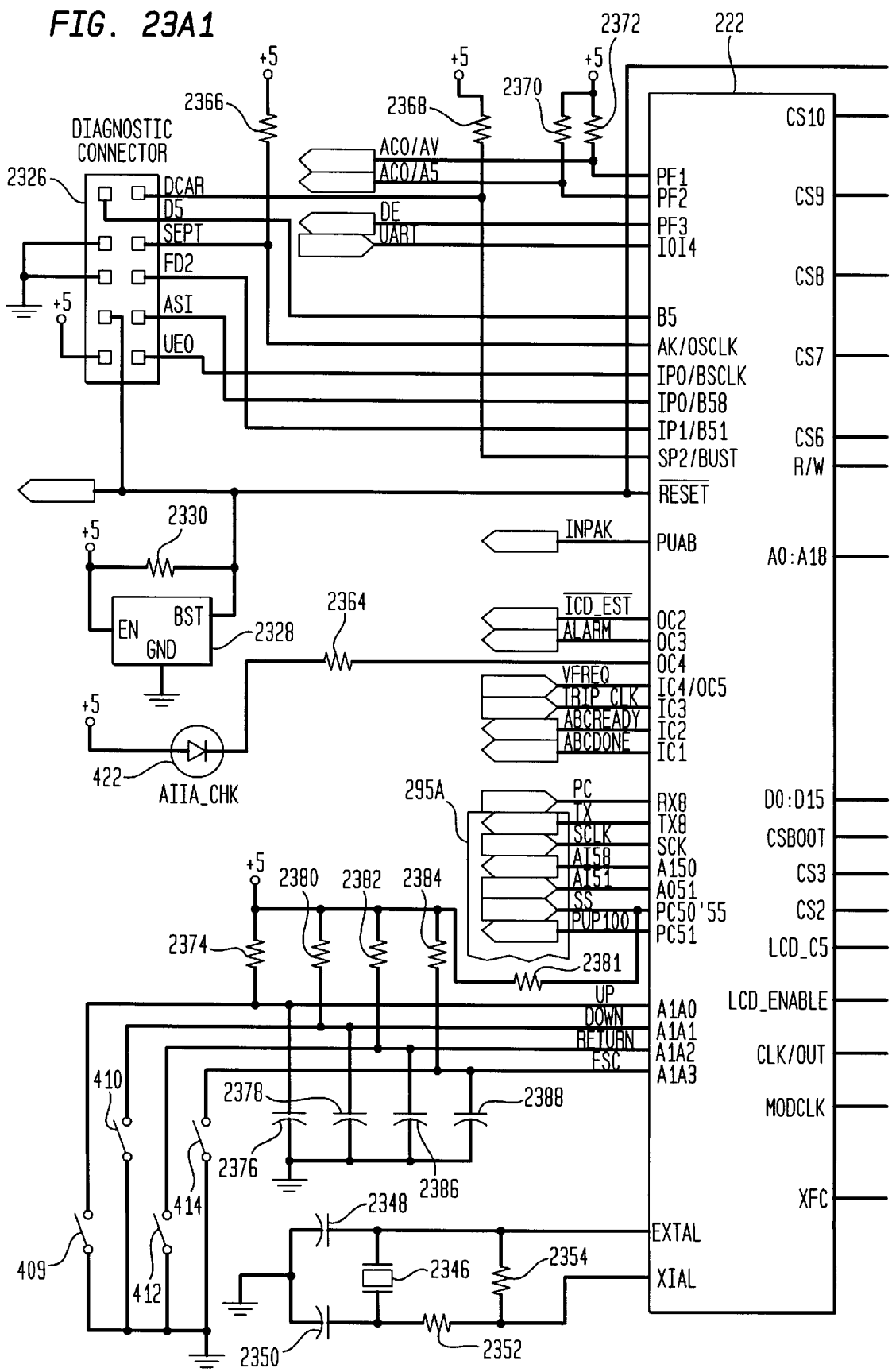
FIG. 23A1

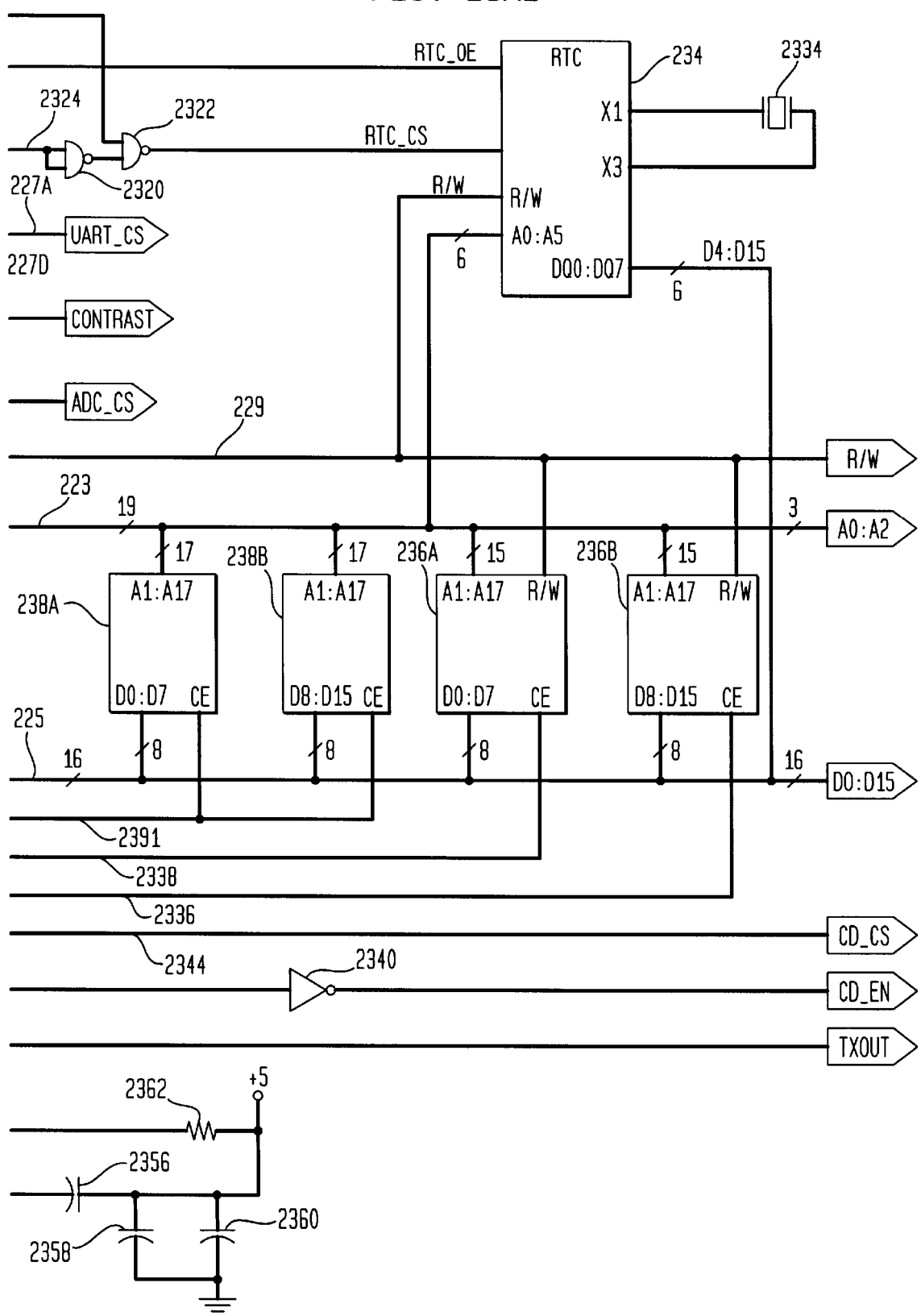
FIG. 23A2

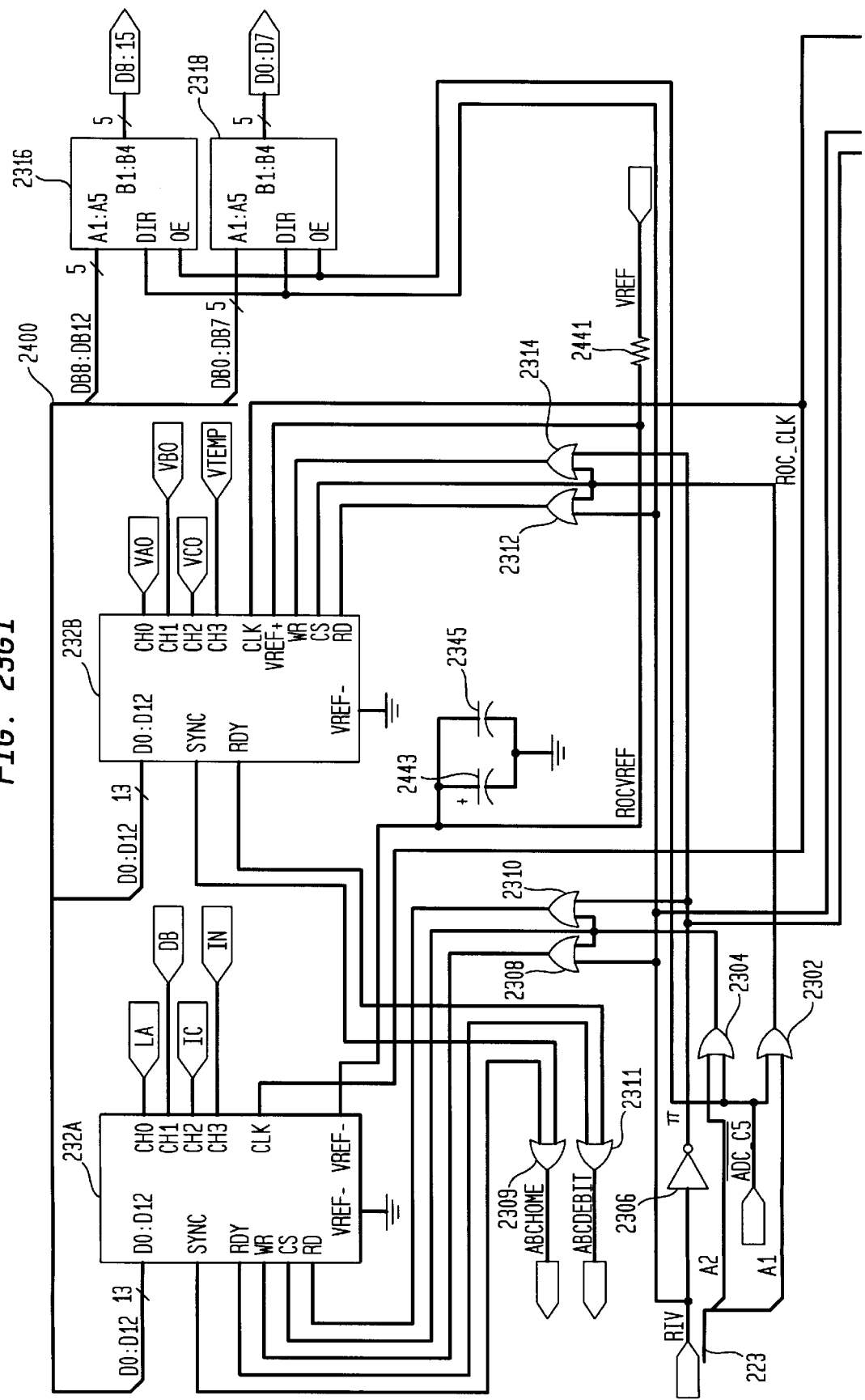
FIG. 2361

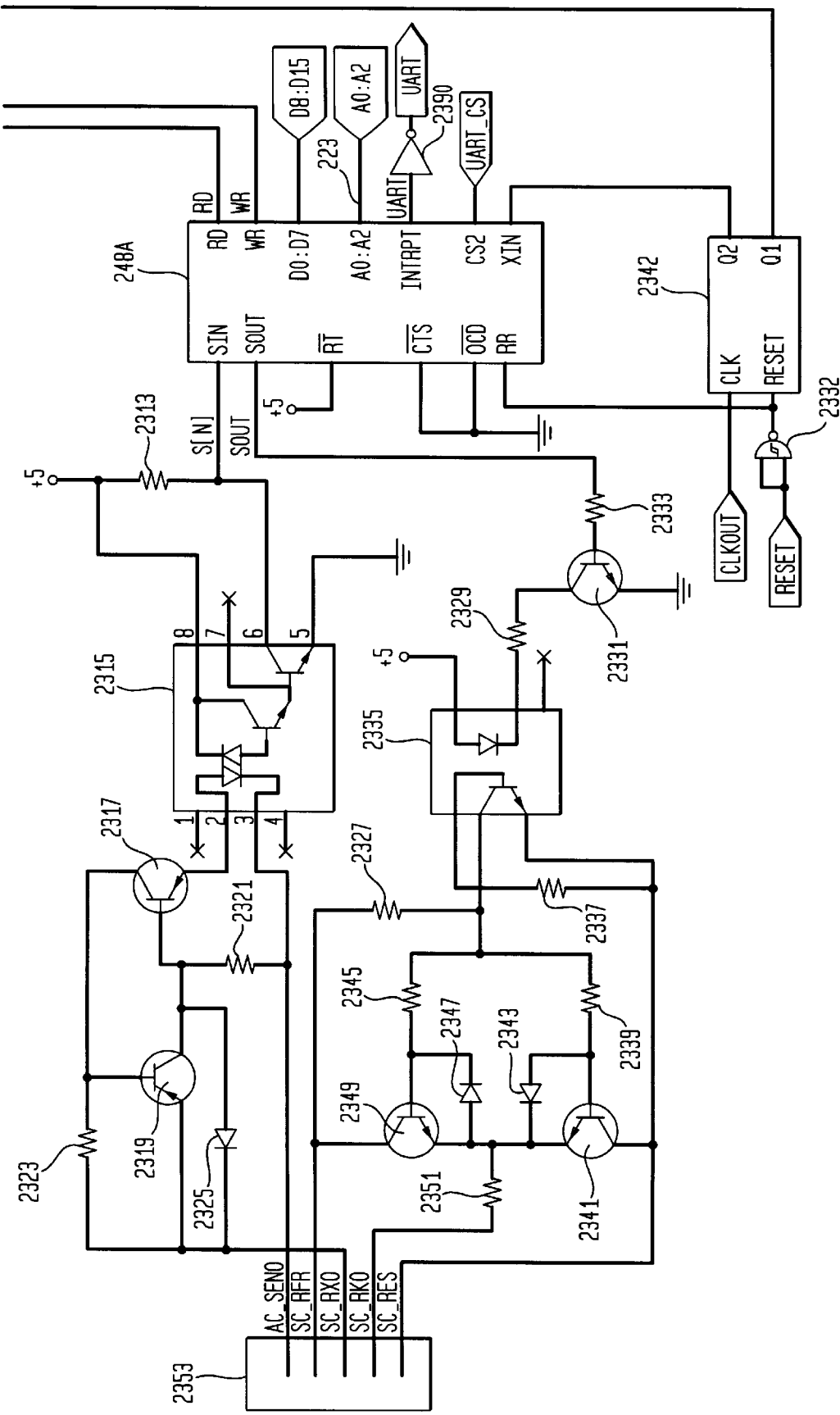
FIG. 2362

FIG. 24A1
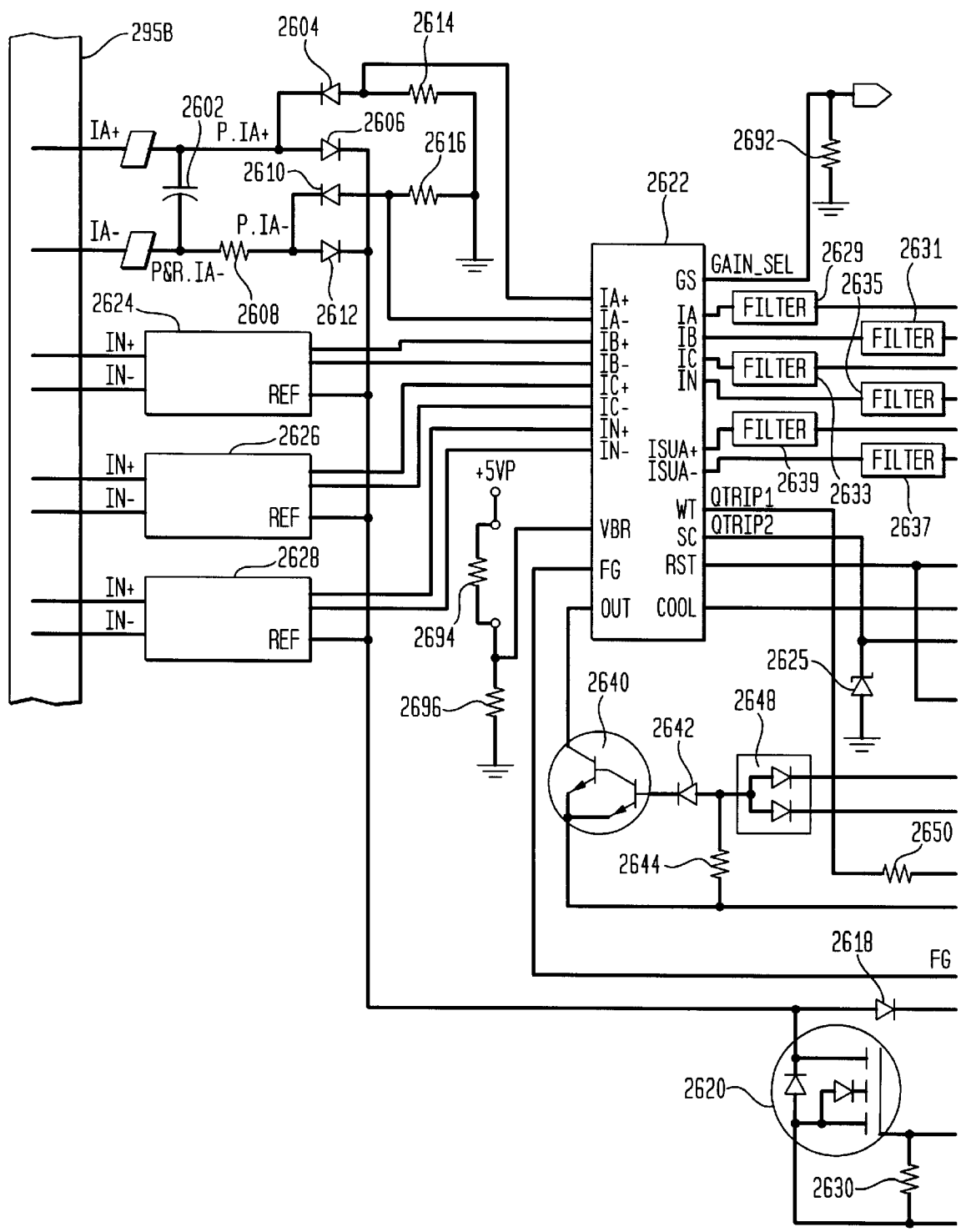

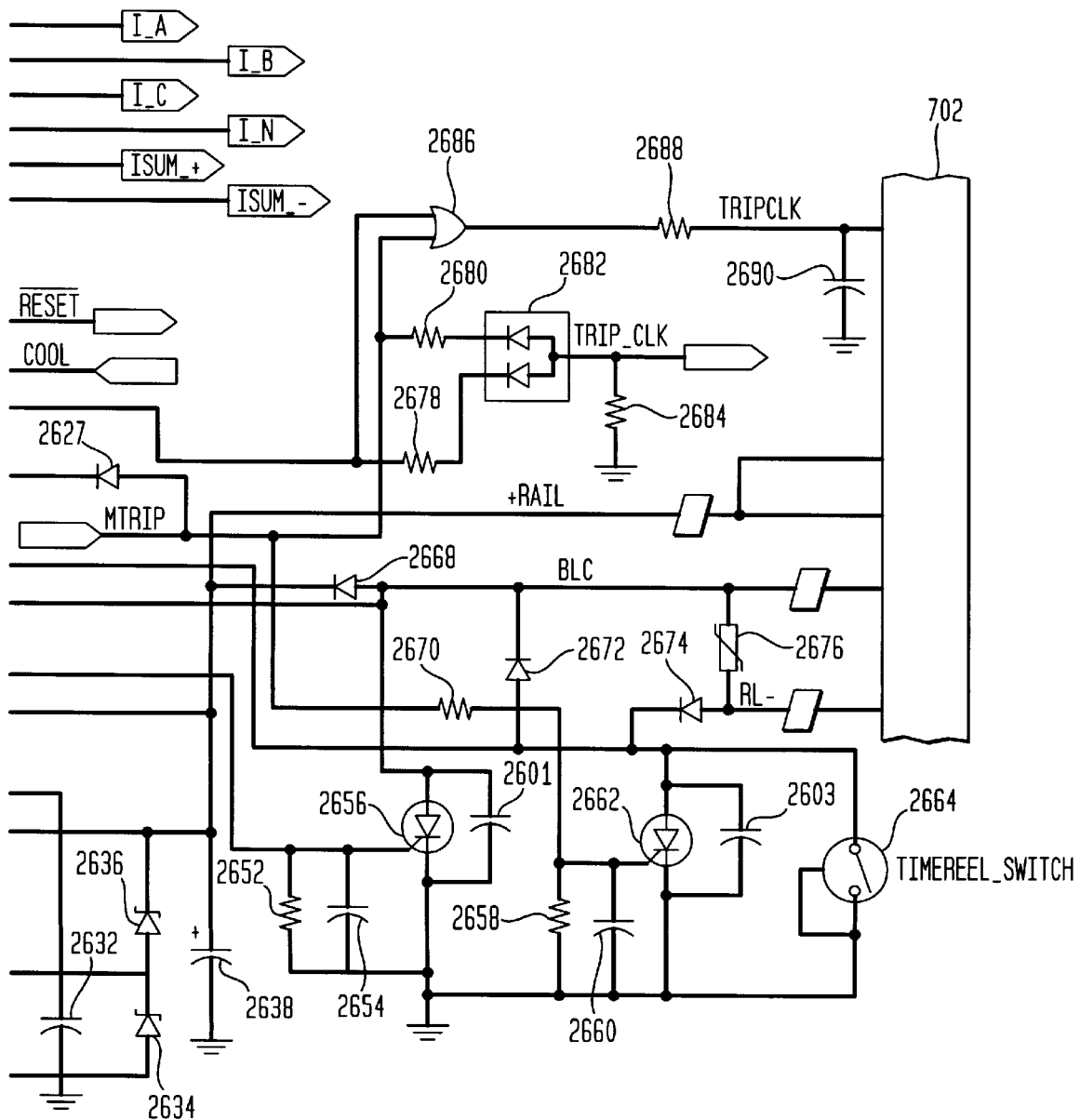
FIG. 24A2

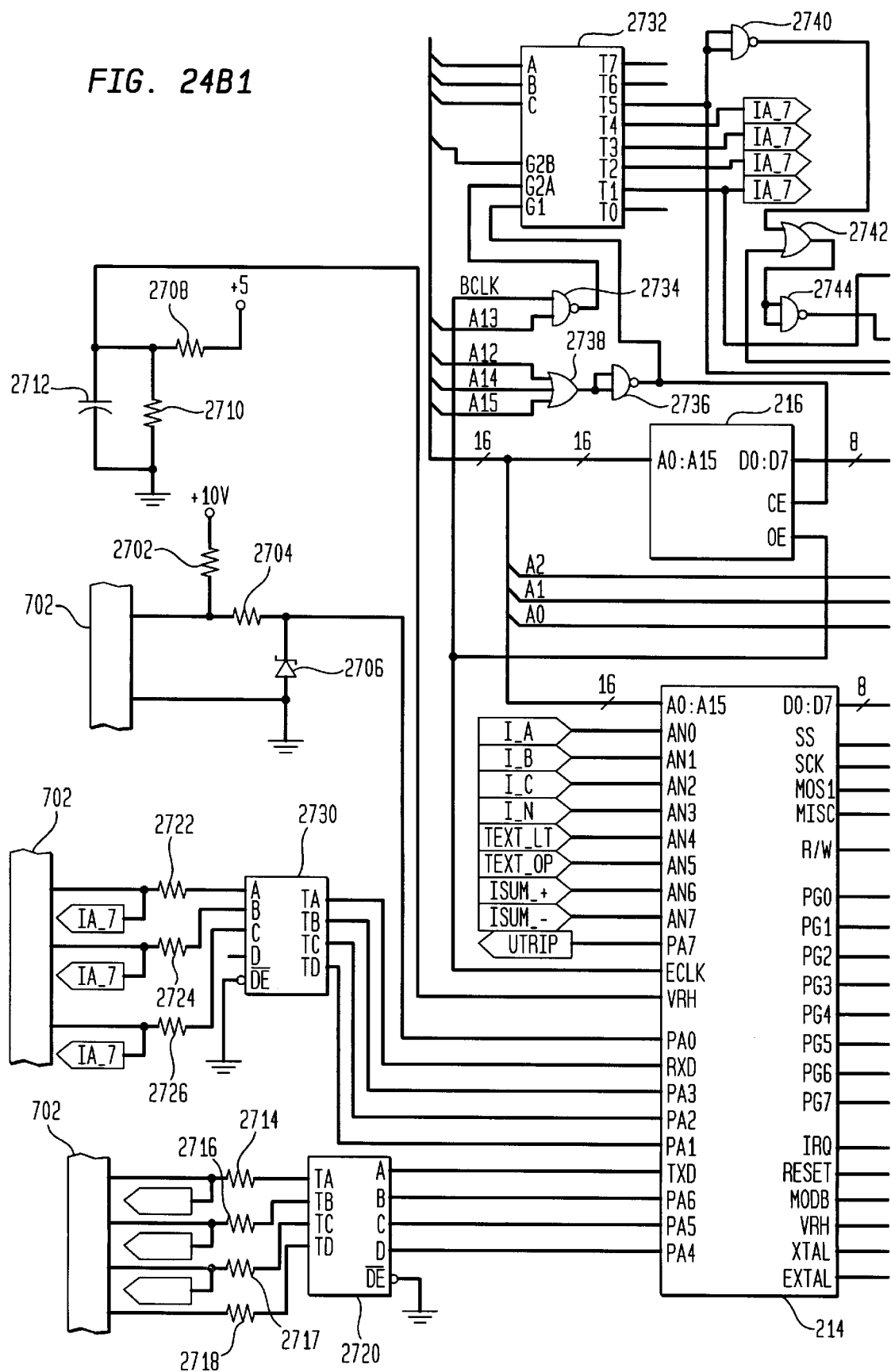
FIG. 24B1

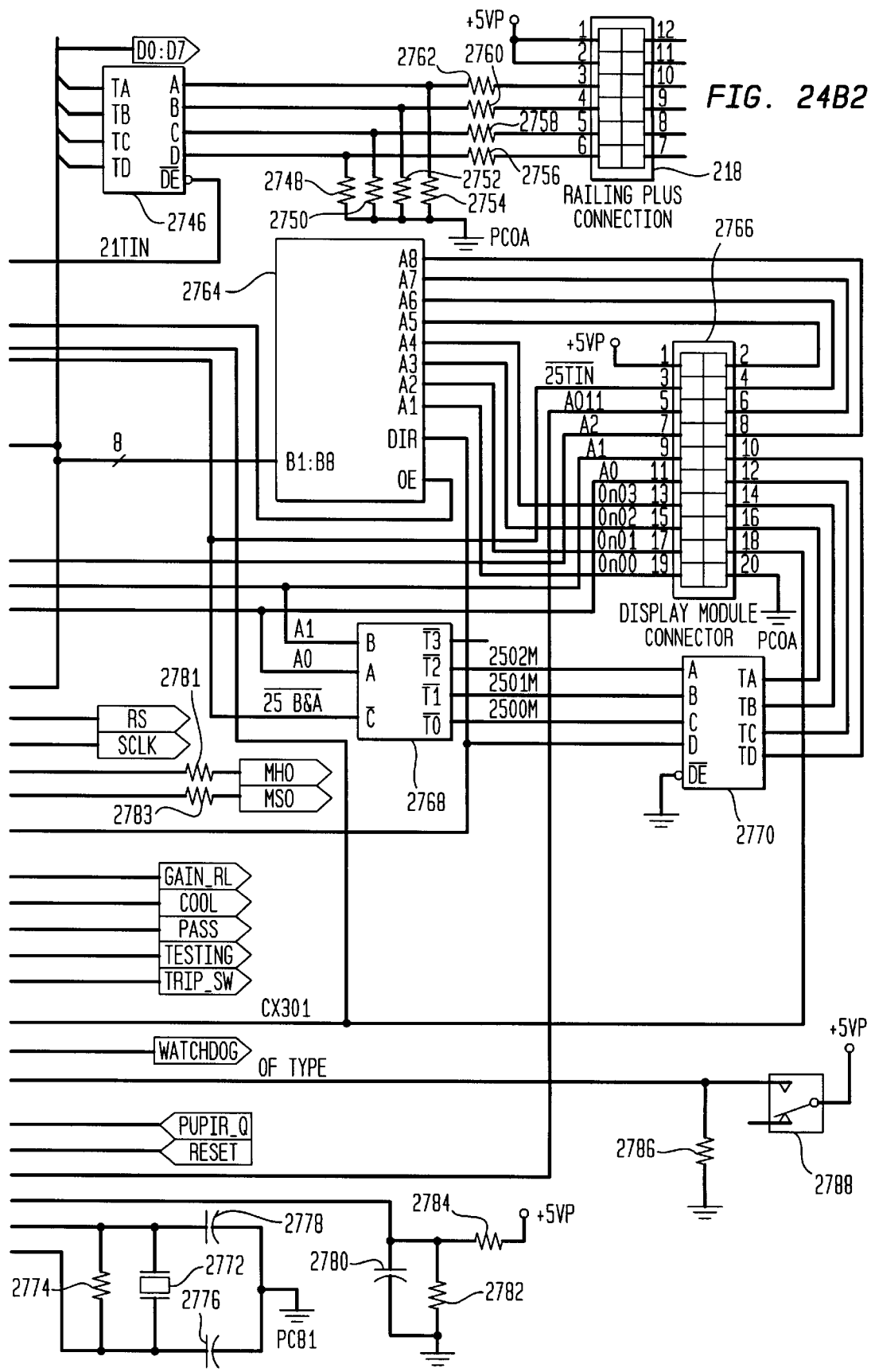
FIG. 24B2

ENERGY INFORMATION DEVICE AND GRAPHICAL DISPLAY FOR A CIRCUIT BREAKER

FIELD OF THE INVENTION

The present invention is directed to apparatus for monitoring and obtaining energy information in an electric power distribution system and in particular to a multiprocessor unit that provides circuit protection and extended monitoring and energy information features having a graphical display to display power related parameters in graphical form, and which may be controlled from a local control panel and/or a remote location using its communication features.

BACKGROUND OF THE INVENTION

In certain factory power distribution systems, relatively high-voltage power (i.e. greater than 1,000 volts) provided by the power company generation station may be stepped down to lower voltage power using a transformer. The lower voltage power may then be distributed around the factory to various power equipment such as, motors, welding machinery and large computers. Such power distribution systems of this type may be divided into branches, where each branch may supply power to a portion of the factory. The power distribution system is protected by installing low voltage fuses or circuit breakers in each branch so that a fault, such as a short circuit in a piece of equipment, supplied by one branch should not affect the power distributed to equipment coupled to the other branches. In addition to detecting large overcurrent conditions relating to short circuit faults, industrial circuit breakers may also detect long-time overcurrent conditions and excessive ground current. Relatively simple circuit breakers may be thermally tripped as a result of heating caused by an overcurrent condition, and is considered to be better for detecting relatively low level overcurrent conditions since it measures the cumulative heating effect of the low-level overcurrent condition over some time period. Such breakers may, however, respond too slowly to provide effective protection against high-current short circuit conditions.

Another type of circuit breaker monitors the current level being passed through the branch circuit and trips the breaker when the current exceeds a predefined maximum value. Such circuit breakers may include a microcontroller coupled to one or more current sensors. The microcontroller continually monitors the digitized current values using a curve which defines permissible time frames in which both low-level and high-level overcurrent conditions may exist. If an overcurrent condition is maintained for longer than its permissible time frame, the breaker is tripped. Although this breaker type is believed to provide protection against both long-time and short time overcurrent conditions, if it does not calculate Root-Mean Square (RMS) current values, it may erroneously trip the circuit when a nonlinear load, such as a welding machine, is coupled to the branch that it is protecting. Nonlinear loads may produce harmonics in the current waveform. These harmonics may distort the current waveform, causing it to exhibit peak values which are augmented at the harmonic frequencies. When the microcontroller, which assumes a sinusoidal current waveform, detects these peaks, it may trip the circuit breaker even though the heating effect of the distorted waveform may not require that the circuit be broken or otherwise interrupted.

Since the above described circuit breakers monitor overcurrent conditions, other types of faults such as over or under voltage conditions and phase imbalances may be missed unless or until they result in an overcurrent fault. Circuit protection for such faults may require special purpose line monitoring and relaying equipment, separate from the overcurrent breakers.

Another issue with certain existing circuit breakers involves the time required to restore the branch to operation once the breaker has tripped. For transient faults, such as a power surge during an electrical storm, a technician must go onto the factory floor, locate the tripped breakers and reset them. Depending on the technician's experience and knowledge, this may take a few minutes or a few hours. In this instance, however, the delay may be reduced by using a circuit breaker with an automatic recloser.

Faults caused by the equipment that is powered by the branch may be more difficult to locate. Certain circuit breakers may provide little if any information on the type of fault that caused the breaker to trip. Thus, the technician may need to install power monitors on each piece of equipment to determine if the fault was a long-time low-level overcurrent condition caused, for example, by a defective motor winding, or an intermittent short circuit fault. Such faults may take several days to locate and correct.

Another issue with existing low-voltage circuit breaker systems concerns the lack of effective backup protection if the circuit breaker fails to trip. This is more of a concern with microcontroller based trip units than with the older thermal trip units. In general, effective backup protection may include a fuse, in series with the branch line, which blows at a short-circuit current slightly higher than the short-circuit current of the breaker. If the microcontroller or any of its associated circuitry fails, a lower-level overcurrent condition may damage the distribution system and/or the equipment being protected before the backup fuse is blown.

Increasingly, the consumption of electrical power by a load is also monitored. Such power monitoring has been known at least since about the mid- 1980s. As such, equipment manufacturers are increasingly using electronic circuit protection devices with circuit breaker units. These electronic circuit protection units may sample signals to provide various information, such as current, voltage, power factor, harmonics, kilowatt hours, var-hours, va-hours, instantaneous power, phase balance/imbalance, phase loading in relation to historical numbers and a percentage of maximum level. Moreover, these values may be stored to form a database.

Such information was only available in alpha-numeric displays at the power meter or electronic trip unit. An example of a graphical display interface for displaying power information of an electronic circuit device is U.S. Pat. No. 5,675,745 issued to King et al. and assigned to Siemens Energy & Automation, Inc., which is the assignee of the present application. Other forms of display were accomplished by down loading the relevant data to another computer either directly or in a network configuration.

SUMMARY OF THE INVENTION

The present invention relates to an Energy Information Device (EID) for an Energy Information System and more specifically for the graphical interface generally for a circuit breaker which senses and measures voltage, current and frequency and determines a variety of conditions of the circuit breaker based on these measurements. The EID counts and stores the number of times the circuit breaker trips for any reason. The EID has a display to provide a combination of waveform and histogram displays to the user and a keyboard to allow the user to set a trip parameters and to control display modes. The EID also has a communications port for access of the measured parameters and conditions of the circuit breaker as well as control of the energy management unit through a remote terminal.

According to yet another aspect of the invention, an energy information system for use with a circuit breaker coupled between a power sources and a load, the energy information system comprising: sensing means for sensing at least one of i) a voltage, and ii) a current flowing between the power source and the load through the circuit breaker; detecting means for detecting transitions of a sensed voltage; counting means for counting a number of times the circuit breaker trips and interrupts the current flow between the power source and the load; measuring means for i) measuring the current flow through the circuit breaker when the circuit breaker trips and interrupts the current flow between the power source and the load and ii) determining a plurality of energy related parameters including a measure of at least one of the voltage, the current and the frequency based on an output from the detecting means, between the power source and the load; input means for accepting a user input, the user input controlling at least one of the circuit breaker and a display means; the display means for displaying at least one of the plurality of conditions of the circuit breaker responsive to the input means; and communication means coupled to the input means for selectively communicating at least one of the plurality of energy related parameters to a remote terminal.

According to yet another aspect of the invention, the energy information system described above, wherein the counting means includes: a mechanical counter means for determining a first count value based on a total number of times the circuit breaker trips; an interruption level counter means for determining a second count value, the second count value indicating a current range flowing between the power source and the load when the circuit breaker trips; and a fault counter means for determining a third count value, the third count values indicating a count of a fault condition that trips the circuit breaker.

According to yet another aspect of the invention, the energy information system described above, further comprising security means for selectively allowing access to control the energy information system.

Still another aspect of the invention, the energy information system described above, wherein said security means is a password entered using said input means.

Yet another aspect of the invention, the energy information system described above, wherein the sensing means further comprises: converting means for converting the voltage of the power source to a lower voltage; biasing means for biasing the lower voltage above a ground potential by a predetermined bias value to produce a full-wave biased voltage, wherein the measuring means processes the full-wave biased voltage to determine the plurality of conditions of the circuit breaker.

According to yet another aspect of the invention, the energy information system described above, wherein the biasing means further comprises: a generating means for generating a stable reference voltage; and a buffer means coupled to the generator for buffering the stable reference voltage and generating the predetermined biased value.

According to yet another aspect of the invention, the energy information system described above, wherein the sensing means has a voltage input range from about 50% to 125% of the voltage of the power source.

According to yet another aspect of the invention, the energy information system described above, wherein the display means displays the plurality of conditions in one of a plurality of languages based on a user selection.

According to yet another aspect of the invention, the energy information system described above, further comprising memory means for storing a date of manufacture of the circuit breaker.

According to yet another aspect of the invention, the energy information system described above, wherein the date of manufacture is at least one of i) displayed on the display means and ii) sent to the remote terminal by the communication means.

According to yet another aspect of the invention, the energy information system described above, wherein the plurality of energy related parameters includes at least one of i) an energy demand based on at least one of the current and the voltage sensed by the sensing means over a predetermined period of time and ii) a plurality of RMS parameters measured over a range of harmonics of a fundamental frequency of the power source.

Still another aspect of the invention, the energy information system described above, wherein the predetermined period of time is between about 1 and 90 minutes, the period of time selectable by the user through at least one of the input means and the communications means.

According to yet another aspect of the invention, the energy information system described above, wherein the demand is determined by calculating according to the following equation:

$$\frac{\sum_{n=1}^{T_{PRG}} \left( \frac{I_A + I_B + I_C}{3} \right)}{T_{PRG}} = AmpDemand$$

where $T_{PRG}$ is a programmable demand period, and $I_A$, $I_B$ and $I_C$ are phase currents for phases A, B and C, respectively.

According to yet another aspect of the invention, the energy information system described above, wherein the energy information system is adaptable for mounting within the circuit breaker.

According to still another aspect of the invention, the energy information system described above, wherein the energy information system is field installable within the circuit breaker.

According to yet another aspect of the invention, an energy information system for use with a circuit breaker coupled between a power source and a load, the energy information system comprising: a sensor to sense at least one of i) a voltage and ii) a current flowing between the power source and the load through the circuit breaker; a transition detector to detect transitions of a sensed voltage from the sensor, a counter coupled to the sensor to count a number of times the circuit breaker trips and interrupts the current flow between the power source and the load; a energy information controller coupled to the sensor and counter to measure the current flow through the circuit breaker when the circuit breaker trips and interrupts the current flow between the power source and the load and for measuring a plurality of related parameters, including a measure of at least one of the voltage, the current and the frequency based on an output from the transition detector; an input device coupled to the energy information controller to enter a user input for controlling at least one of the circuit breaker and a display; the display coupled to the energy information controller to display at least one of the plurality of power related parameters responsive to the user input; and a communication port coupled to the energy information controller to selectively communicate at least one of the plurality of power related parameters to a remote terminal.

According to yet another aspect of the invention, the energy information system described above, wherein the counter further includes: a mechanical counter to determine a first count value based on a total number of times the circuit breaker trips; an interruption level counter to determine a second count value, the second count value indicating a current range flowing between the power source and the load when the circuit breaker trips; and a fault counter to determine a third count value, the third count value indicating a count of a fault condition indicative of a circuit breaker trip.

According to yet another aspect of the invention, the energy information system described above, wherein the second count value is a plurality of count values of respective ranges of current flows, the ranges of current flows selected from the group consisting of i) the current flow being less about than 100% of a trip rating of the circuit breaker; ii) the current flow being between about 100% and 300% of the trip rating of the circuit breaker; iii) the current flow being between about 300% and 600% of the trip rating of the circuit breaker; iv) the current flow being between about 600% and 900% of the trip rating of the circuit breaker; and v) the current flow being greater than about 900% of the trip rating of the circuit breaker.

Still another aspect of the invention, the energy information system described above, wherein the third count value includes at least one of the group consisting of: i) an overload fault count value; ii) a short time fault count value; iii) an instantaneous fault count value; and iv) a ground fault count value.

According to yet another aspect of the invention, the energy information system described above, further comprising a security controller to selectively allow access to the energy information system by the input device.

According to yet another aspect of the invention, the energy information system described above, wherein the sensor comprises: a voltage transformer to convert a line voltage of the power source to a voltage lower than the line voltage; and a voltage shifter to bias the lower voltage above a ground potential by a predetermined voltage to produce a full-wave biased voltage signal, wherein the energy information controller measures the full-wave biased voltage signal to determine the plurality of energy related parameters.

Still another aspect of the invention, the energy information system described above, wherein the transition detector has a voltage input range from about 50% to 125% of the voltage of the power source.

According to yet another aspect of the invention, the energy information system described above, wherein the communication port comprises at least one of an RS-232 communication port and an RS-485 communication port, each of the communication ports providing for upload and download of data between the remote terminal and the energy information controller.

Yet another aspect of the invention, the energy information system described above, wherein the display displays the plurality of energy related parameters in one of a plurality of languages based on a user selection, the selection made through at least one of the input device and the communication port.

According to still another aspect of the invention, the energy information system described above, further comprising a memory for storing a date of manufacture of the circuit breaker.

According to yet another aspect of the invention, the energy information system described above, wherein the date of manufacture is at least one of displayed on the display and sent to the remote terminal through the communication port.

According to yet another aspect of the invention, the energy information system described above, wherein the plurality of energy related parameters includes at least one of i) an energy demand based on at least one of the current and the voltage sensed by the sensor over a predetermined period of time and, ii) a plurality of RMS parameters measured over a range of harmonics of a fundamental frequency of the power source.

According to still another aspect of the invention, the energy information system described above, wherein the range of harmonics includes up to at least about a 19th harmonic of the fundamental frequency.

Yet another aspect of the invention, the energy information system described above, wherein the predetermined period of time is between about 1 and 90 minutes, the period of time selectable by the user through at least one of the input device and the communication port.

According to yet another aspect of the invention, the energy information system described above, wherein the demand is determined by calculating according to the following equation:

$$\frac{\sum_{n=1}^{T_{PRG}} \left( \frac{I_A + I_B + I_C}{3} \right)}{T_{PRG}} = AmpDemand$$

where $T_{PRG}$ is a programmable demand period, and $I_A$, $I_B$ and $I_C$ are phase currents for phases A, B and C, respectively.

According to still another aspect of the invention, the energy information system described above, wherein the demand calculation is performed automatically about once a second.

Still another aspect of the invention, the energy information system described above, wherein the energy information system is adaptable for mounting within the circuit breaker.

Yet another aspect of the invention, the energy information system described above, wherein the energy information system is field installable within the circuit breaker.

Yet another aspect of the invention, the energy information system for use with a circuit breaker coupled between a power source and a load, the energy information system comprising: a sensor to sense at least one of i) a voltage and ii) a current flowing between the power source and the load through the circuit breaker; a transition detector to detect transitions of a sensed voltage from the sensor; a voltage shifter coupled to the sensor to bias the voltage above a ground potential by a predetermined voltage to produce a full-wave biased voltage waveform; a counter to determine i) a first count value based on a total number of times the circuit breaker trips; ii) a second count value indicating a current range flowing between the power source and the load when the circuit breaker trips, the current range based on percentage of a trip rating of the circuit breaker; and iii) a third count value indicating a count based on a predetermined fault condition of the circuit breaker; an energy information controller coupled to the sensor, the counter, the transition detector and the voltage shifter, the energy information controller measuring i) the current flow through the circuit breaker when the circuit breaker trips and ii) the full-wave biased voltage waveform to determine the plurality of energy related parameters of the circuit breaker; an input device coupled to the energy information controller to enter a user input for controlling at least one of the circuit breaker and a display; a memory to store a date of manufacture of the circuit breaker; the display coupled to the energy information controller to display at least one of i) the plurality of conditions and ii) the date of manufacture of the circuit breaker responsive to the user input, the plurality of energy related parameters including a) an energy demand; and b) a plurality of RMS parameters measured over a range of harmonics of a fundamental frequency of the power source based on at least one of the voltage, the current and the frequency over a predetermined period of time, a security controller to selectively allow access of the energy information system by the input device; and a communications port including at least one serial communications port, the communications port coupled to the energy information controller to selectively communicate with a remote terminal; wherein the communication pori;

provides for upload and download of data between the remote terminal and the energy information controller.

Still another aspect of the invention, an energy information system mounted within a circuit breaker coupled between a power source and a load, the energy information system comprising: a sensor to sense at least one of i) a voltage and ii) a current flowing between the power source and the load through the circuit breaker, the sensor having a voltage input range from about 50% to 125% of the voltage of the power source; a voltage transformer to convert a line voltage of the power source to a voltage lower than the line voltage; a transition detector to detect transitions of a sensed voltage from said sensor and to generate a transition signal, said transition detector comprising: i) a filter having an input coupled to an output of the voltage transformer to filter an AC signal from the transformer; ii) a comparator coupled to the filter to compare a filtered output of the filter to a voltage; iii) an amplifier for amplifying an output of the comparator; and iv) an inverter for inverting an output of the amplifier and producing a signal representative of a frequency of the AC signal; a voltage shifter to bias the lower voltage above a ground potential by a predetermined voltage to produce a full-wave biased voltage waveform; a mechanical counter to determine a first count value based on a total number of times the circuit breaker trips; an interruption level counter to determine a second count value, the second count value indicating a current range flowing between the power source and the load when the circuit breaker trips, the interruption level counter includes a plurality of count values of respective ranges of current flows, the ranges of current flows selected from the group consisting of i) the current flow being less than about 100% of a trip rating of the circuit breaker; ii) the current flow being between about 100% and 300% of the trip rating of the circuit breaker; iii) the current flow being between about 300% and 600% of the trip rating of the circuit breaker; iv) the current flow being between about 600% and 900% of the trip rating of the circuit breaker, and v) the current flow being greater than about 900% of the trip rating of the circuit breaker; a fault counter to determine a third count value, the third count value indicating a count of a fault condition that trips the circuit breaker, the fault condition being at least one of: i) an overload fault; ii) a short time fault; iii) an instantaneous fault; and iv) a ground fault; an energy information controller coupled to the sensor, the transition detector, the interruption level counter, and the voltage shifter, the energy information controller measures i) the current flow through the circuit breaker when the circuit breaker trips and interrupts the current flow between the power source and the load, and ii) the full-wave biased voltage to determine a plurality of energy related parameters using an AC signal frequency based on the transition signal; a keypad coupled to the energy information controller to enter a user input, the user input for controlling at least one of the circuit breaker and a display; a memory to store a date of manufacture of the circuit breaker; the display coupled to the energy information controller to display at least one of i) the plurality of energy related parameters and ii) the date of manufacture, of the circuit breaker responsive to the user input, the plurality of energy related parameters including: a) an energy demand calculated according to the following equation:

$$\frac{\sum_{n=1}^{T_{PRG}} \left( \frac{I_A + I_B + I_C}{3} \right)}{T_{PRG}} = AmpDemand$$

where $T_{PRG}$ is a programmable demand period, and $I_A$, $I_B$ and $I_C$ are phase currents for phases A, B and C, respectively and b) a plurality of RMS parameters measured over a range of harmonics of a fundamental frequency of the power source based on at least one of the voltage, the current and the frequency, over a predetermined period of time, the range of harmonics including up to at least about a 19th harmonic of the fundamental frequency; a security controller for selectively allowing access of the energy information system by the keypad; and a communication port including at least one of an RS-232 communication port and an RS-485 communication port, the communication ports coupled to the energy information controller to selectively communicate at least one of the plurality of energy related parameters and the date of manufacture to a remote terminal; wherein the communication ports provide for upload and download of data between the remote terminal and the energy information controller; the display displays the plurality of energy related parameters in one of a plurality of languages based on a user selection through at least one of the keypad and the communication port; and the energy information system is field installable within the circuit breaker.

According to yet another aspect of the invention, an energy information device for use with a circuit breaker having a trip unit, the energy information device coupled between a power source and a load, the device comprising: a plurality of current sensors having an input coupled to respective ones of a plurality of power lines between the power source and the load; a plurality of transformers coupled between the respective ones of the plurality of power lines and an analog to digital converter (ADC); a transition detector having an input coupled to an output of one of the plurality of transformers; an override circuit coupled to an output of the plurality of current sensors, an input of a power supply and -a first microprocessor; a trip circuit having a first input coupled to an output of the override circuit; the first microprocessor further coupled to a first programmable read only memory (PROM), a second input of the trip circuit, and al second microprocessor; and the second microprocessor further coupled to an output of the transition detector, an output of the ADC, a clock circuit, a second PROM and a random access memory (RAM).

According to still another aspect of the invention, the energy information device described above, further comprising: a first digital input/output (I/O) interface coupled to the first microprocessor; and a second digital I/O interface coupled to the second microprocessor.

Yet another aspect of the invention, the energy information device described above, further comprising a liquid crystal display (LCD) coupled to the second microprocessor.

Still another aspect of the invention, the energy information device described above, further comprising a test connector coupled to the second microprocessor.

According to yet another aspect of the invention, the energy information device described above, further comprising a rating plug coupled to the first microprocessor.

According to yet another aspect of the invention, the energy information device described above, further comprising: a first signal conditioner coupled between the plurality of current sensors and the first microprocessor, and a second signal conditioner coupled between I) the plurality of current sensors and the plurality of transformers and ii) the ADC.

Yet another aspect of the invention, the energy information device described above, wherein the transition detector comprises: a filter having an input coupled to the output of one transformer to filter an AC signal from the transformer; a comparator coupled to the filter to compare a filtered output of the filter to a voltage; an amplifier for amplifying an output of the comparator; and an inverter for inverting an output of the amplifier and producing a signal representative of an AC signal frequency, wherein transition information is supplied to the second icroprocessor based on the AC signal frequency.

According to still another aspect of the invention, an energy information device described above for use with a circuit breaker having a trip unit, the energy information device coupled between a power source and a load, the device comprising: a signal conditioner coupled to a plurality of power lines between the power source and the load providing conditioned signals based on an input signal representative of a current flowing between the power source and the load; an override circuit coupled to an output of the signal conditioner; a filter coupled to a first output of the override circuit to filter the first output of the override circuit; a microprocessor coupled to an output of the filter; a memory coupled to the microprocessor, and a trip circuit coupled to an output of the microprocessor and a further output of the override circuit, and generating a trip signal for the trip unit based on at least one of i) the further output of the override circuit and ii) the output of the microprocessor.

According to yet another aspect of the invention, the energy information device described above, further comprising a rating plug coupled to the microprocessor.

According to still another aspect of the energy information device described above, wherein the input signal is a differential input signal and the override circuit converts the differential input signal into a single ended output signal.

Still another aspect of the invention, an energy information device for use with a circuit breaker having a trip unit, the energy information device coupled between a power source and a load, the device comprising: a first amplifier coupled to a plurality of power lines between the power source and the load, providing first amplified signals based on a first input signal representative of a plurality of currents flowing between the power source and the load; a second amplifier coupled to the plurality of power lines between the power source and the load, providing second amplified signals based on a second input signal representative of a respective plurality of voltages provided by the power source to the load; a transition detector coupled to an output of the second amplifier to detect a transition of a voltage signal based on one of the plurality of voltages, and generating a transition signal used in determining a frequency of the voltage signal; a first analog-to-digital converter (ADC) coupled to an output of the first amplifier to generate a first digital output signal representative of the plurality of currents based on an offset value; a second ADC coupled to an output of the second amplifier to generate a second digital output signal representative of the plurality of voltages based on the offset value; an offset generator coupled to the first amplifier, the second amplifier, the first ADC and the second ADC, and generating the offset value; a first clock generator for generating a clock signal to control a sample timing of the first ADC and the second ADC; a microprocessor coupled to the first ADC and the second ADC, said microprocessor processing the first and second digital output signals of the first and second ADC, respectively; a second clock generator coupled to the microprocessor for generating a system time base; a first memory coupled to the microprocessor, the memory containing an executable program for the microprocessor; a second memory coupled to the microprocessor for storing data from and providing data to the microprocessor; and a communications port coupled to the microprocessor for remote access of the microprocessor.

According to yet another aspect of the invention, the energy information device described above, wherein the transition detector comprises: a filter having an input coupled to one output of the second amplifier to filter the voltage signal based on one of the plurality of voltages from the second amplifier; a comparator coupled to the filter to compare a filtered output of the filter to a voltage; an amplifier for amplifying an output if the comparator; and an inverter for inverting an output of the amplifier and producing transition information relating to a voltage signal frequency, wherein the transition information is supplied to the microprocessor, which determines the voltage signal frequency.

According to yet another aspect of the invention, the energy information device described above, wherein the communication port is at least one of an RS-232 port and an RS-485 port.

According to yet another aspect of the invention, the energy information device described above, wherein the communication port is coupled to a remote computer.

According to yet another aspect of the invention, an energy information management method for use with a circuit breaker coupled between a power source and a load, the method comprising the steps of: (a) sensing at least one of a voltage and a current flowing between the power source and the load through the circuit breaker; (b) counting a number of times the circuit breaker trips and interrupts the current flow between the power source and the load; (c) measuring the current flow through the circuit breaker when the circuit breaker trips and interrupts the current flow between the power source and the load; (d) determining a plurality of conditions of the circuit breaker; (e) accepting a user input, the user input for at least one of controlling the circuit breaker and displaying the plurality of conditions of the circuit breaker; (f) displaying at least one of the plurality of conditions of the circuit breaker responsive to the user input; and (g) communicating at least one of the plurality of conditions to a remote terminal.

According to yet another aspect of the invention, the method described above, further comprising the steps of: (h)

converting a line voltage of the power source to a voltage lower than the line voltage; and (i) biasing the lower voltage above a ground potential by a predetermined voltage to produce a full-wave biased voltage, wherein the plurality of conditions of the circuit breaker are determined from the full-wave biased voltage.

According to still another aspect of the invention, an energy information management method for use with a circuit breaker coupled between a power source and a load, the method comprising the steps of. (a) sensing at least one of a voltage, and a current flowing between the power source and the load through the circuit breaker; (b) detecting at least two transitions of a sensed voltage and determining a corresponding frequency; (c) converting the voltage of the power source to a lower voltage, (d) biasing the lower voltage above a ground potential by a predetermined voltage to produce a full-wave biased voltage; (e) counting a number of times the circuit breaker trips and interrupts the current flow between the power source and the load; (f) measuring the current flow through the circuit breaker when the circuit breaker trips and interrupts the current flow between the power source and the load; (g) determining a plurality c:

conditions of the circuit breaker based on at least one of the voltage and the current sensed in Step (a), and for the frequency determined in step (b);(h) accepting a user input for controlling the circuit breaker; (i) displaying at least one of the plurality of conditions of the circuit breaker device responsive to the input accepted in Step (h); and (j) communicating at least one of the plurality of conditions to a remote terminal.

According to yet another aspect of the invention, a method for graphically displaying a menu for selection and viewing of the load related parameters of a load connected to an AC load control device, comprising the steps of: (a) monitoring the load related parameters of the load connected to the AC load control device; (b) displaying on a graphical display device a menu of a plurality of indicia representing the monitored load related parameters; (c) scrolling through each indicia on said menu; and (d) selecting an item from said menu thereby causing the load related parameters relating to the said indicia to appear on said graphical display device as a signal representation.

According to still another aspect of the invention, a method for graphically displaying a menu for selection and viewing of the load related parameters of a load connected to an AC load control device, comprising the steps of: (a) monitoring the load related parameters of the load connected to the C load control device; (b) displaying on a graphical display device a menu of a plurality of indicia representing the monitored load related parameters; (c) scrolling through each indicia on said menu; and (d) selecting an item from said menu thereby causing the load related parameters relating to the said indicia to appear on said graphical display device in signal representation and histogram forms simultaneously.

According to still another aspect of the invention, a graphical energy information display system having a menu for user selection of energy related information for an AC load control device, comprising: a device for monitoring AC; electrical load usage of a load; a graphical display device connected to said device for monitoring AC electrical load usage, said graphical display device adapted so as to graphically display indicia and at least one parameter of the AC electrical load usage of the load said parameters being displayed as a signal representation; menu means for displaying a plurality of selections on said graphical display device, each of said plurality of selections representing at least one parameter of the AC electrical load usage; and menu selection means for selecting at least one of said plurality of selections so as to cause said graphical display device to graphically present the signal representing said at least one parameter of the AC electrical load usage associated with said selections.

According to yet another aspect of the invention, a graphical energy information display system described above, wherein said menu means displays; said indicia on said graphical display device in a hierarchical format.

According to still another aspect of the invention, a graphical energy information display system described above, wherein said menu selection means comprises a user selectable keypad input for scrolling through said indicia displayed by said menu means onto said graphical display device, thereby enabling a user to select and view the said at least one parameter of the AC electrical load usage of a load.

According to yet another aspect of the invention, a graphical energy information display system described above, wherein said user selectable keypad input comprises a touch input keypad.

According to still another aspect of the invention, a graphical energy information display system described above, wherein said user selectable keypad input comprises a touch input device overlaid onto said graphical display device.

According to yet another aspect of the invention, a graphical energy information display system described above, wherein said graphical display device comprises an LCD display.

According to still another aspect of the invention, a graphical energy information display system described above, wherein said LCD display is at least 128 pixels square.

According to yet another aspect of the invention, a graphical energy information display system described above, wherein said graphical display device comprises an Electrofluorescent display.

According to yet another aspect of the invention, a graphical energy information display system described above, wherein the graphical display device simultaneously produces multiple corresponding power related signals representing the same parameter for a plurality of different indicia of the AC electrical load usage.

According to still another aspect of the invention, a graphical energy information display system having a menu for user selection of energy related information for an AC load control device, comprising: a device to monitor AC electrical load usage of a load; a graphical display device connected to said device to monitor AC electrical load usage, said graphical display device adapted so as to graphically display indicia and at least one parameter of the AC electrical load usage of the load said parameters being displayed as a waveform; menu structure to display a plurality of selections on said graphical display device, each of said plurality of selections representing at least one parameter of the AC electrical load usage; menu selection structure to select at least one of said plurality of selections so as to cause said graphical display device to graphically present the power related signal representing said at least one parameter of the AC electrical load usage associated with said selections; and a circuit protective device to interrupt electrical power to the load responsive to said at least one parameter of the AC electrical load usage.

According to yet another aspect of the invention, a graphical energy information display system described above, wherein said circuit protective device is a circuit breaker.

According to still another aspect of the invention, a graphical energy, information display system described above, wherein the graphical display device essentially simultaneously produces graphic images of the processed signals representing voltage and current by signal representations, and harmonics and phase balance in a histogram format.

According to yet another aspect of the invention, a graphical energy information display system having a menu for user selection of energy related information for an AC load control device, comprising: a circuit protective device for interrupting electrical power to a load; means for monitoring AC electrical load usage of a load comprising a first means for controlling said circuit protective device and a second means for producing a plurality of signals representative of at least one of a current, a voltage and a power related characteristic of the load; menu means for displaying a plurality of indicia on a graphical display device, each of said plurality of indicia representing at least one parameter of the AC electrical load usage; menu selection means for selecting at least one of said plurality of indicia so as to cause the graphical display device to graphically present said at least one parame er of the AC electrical load usage associated with said indicia; and a graphical display device connected to said means for monitoring AC electrical load usage and adapted so as to graphically display at least one parameter of the AC electrical load usage of the load as a signal representation, said graphical display device comprising an energy information means connected to said second means for receiving and processing and storing said plurality of signals and for producing graphics related output image signals, and a display means connected to said energy information means and adapted to receive said graphics related output image signal for producing graphic images which are viewable by the user.

According to still another aspect of the invention, a graphical energy information display system described above, wherein said graphical display device comprises an LCD display.

According to yet another aspect of the invention, a graphical energy information display system described above, wherein said LCD display is at least 128 pixels square.

According to yet another aspect of the invention, a graphical energy information display system described above, wherein said graphical display device comprises an Electrofluorescent display.

According to yet another aspect of the invention, a graphical energy information display system described above, wherein the graphical display device simultaneously produces multiple corresponding signal representations representing the same parameter for a plurality of different indicia of the AC electrical load usage.

According to yet another aspect of the invention, a graphical energy device simultaneously produces graphic images of the processed signals representing voltage and current by signal representations, and harmonics and phase balance in a histogram format.

BRIEF DESCRIPTION OF THE DRAWINGS

FIGS. 7A, 7B, 7C, 7D, 7E, 7F, 7G, 7H, 7I, and 7J are various displays of settings and conditions of the EID shown in FIG. 2A.

FIGS. 23A, 23B, 23C, 23D, 23E, 23F, 23G, 23H, and 23I are schematic diagrams of the Energy Information circuit board of the present invention.

FIGS. 24A and 24B are schematic diagrams of the Protective circuit board of the present invention.

DETAILED DESCRIPTION

Overview

Figure 1A:
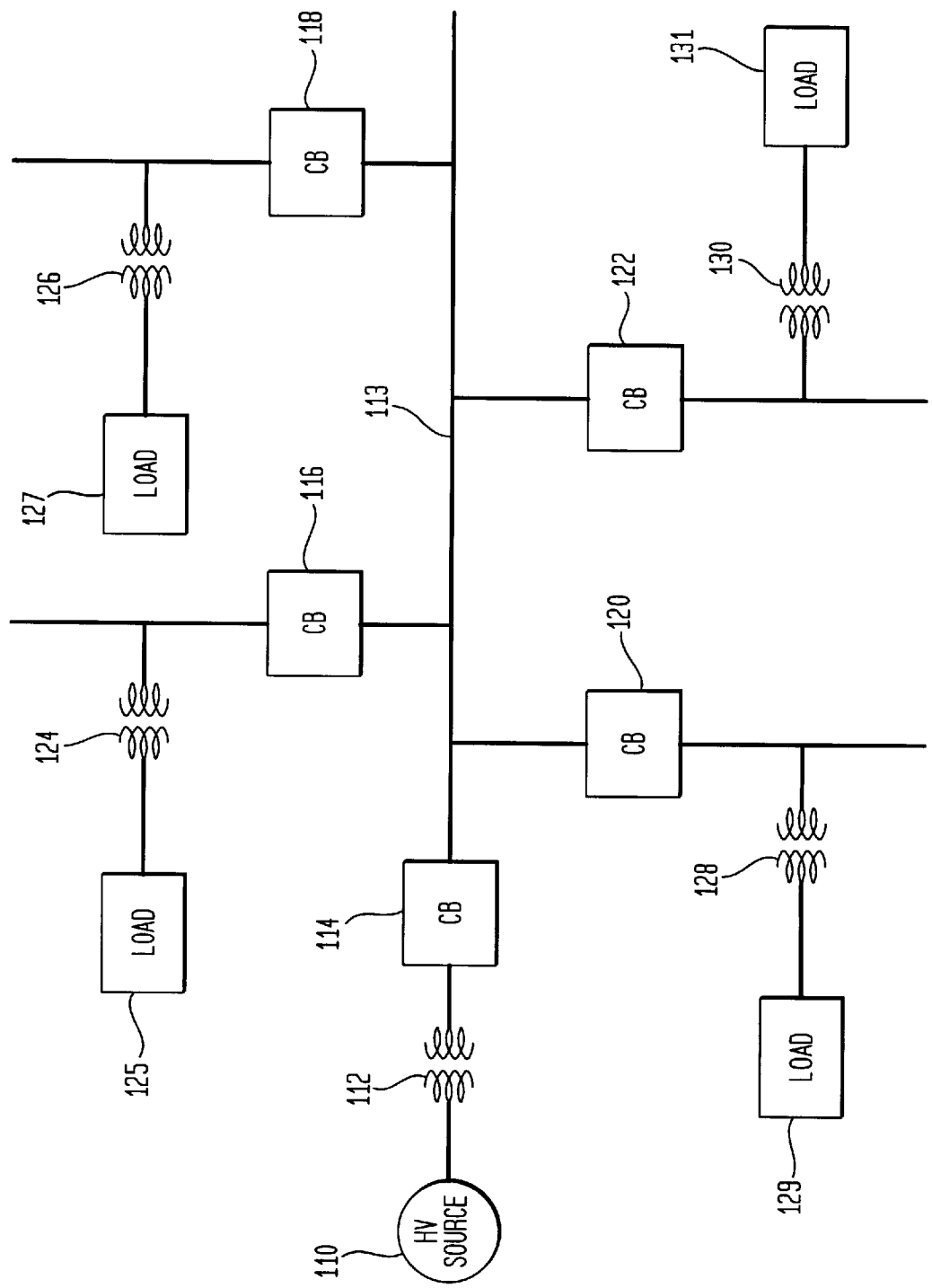
FIG. 1A is a schematic diagram, partly in block diagram form of a power distribution system which includes a circuit breaker containing an embodiment of the present invention.
Figure 2A:
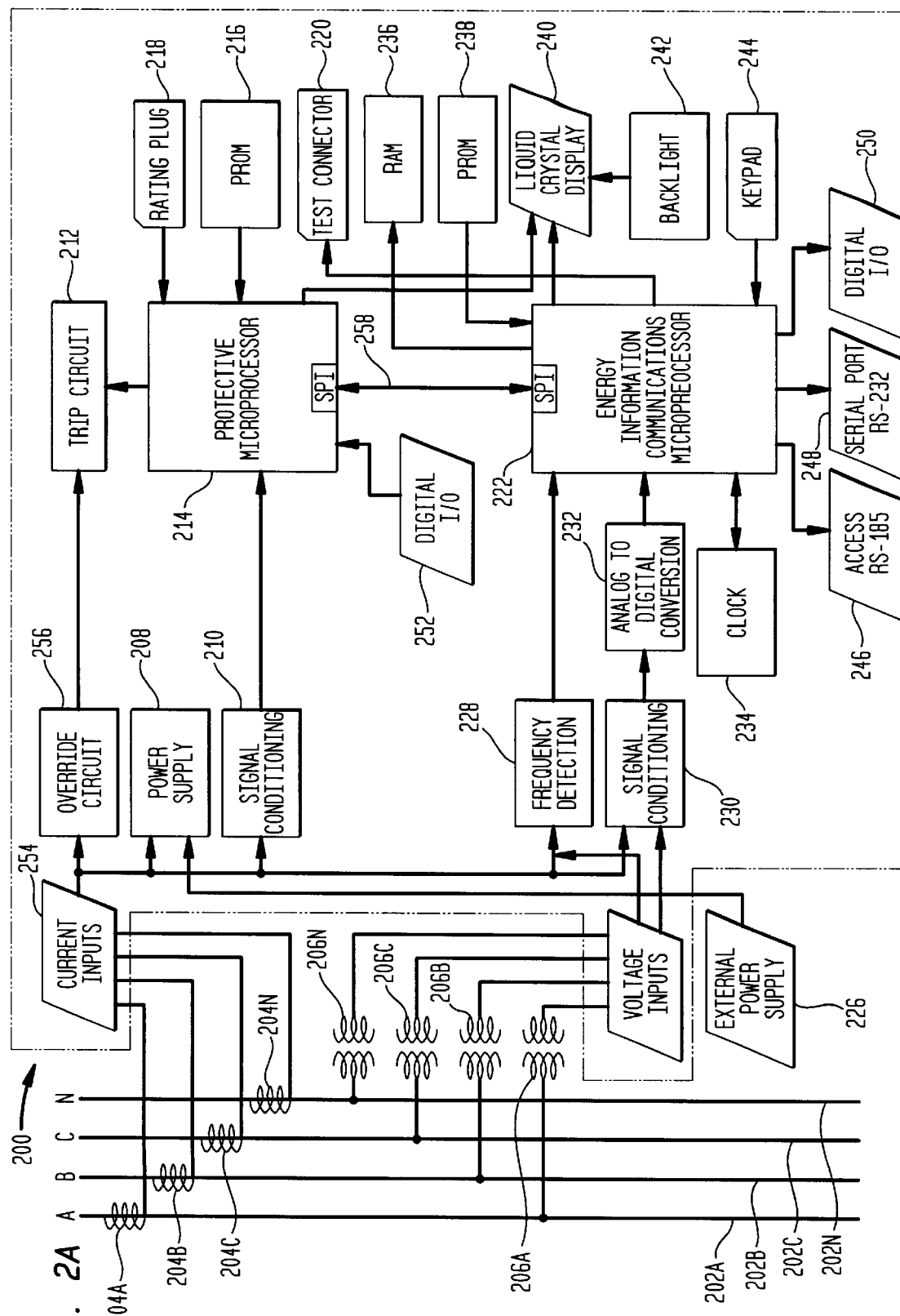
FIG. 2A is a block diagram, partly in schematic diagram form of a portion of the circuit breaker suitable for use in the system shown in FIGS. 1A and 1B.

FIG. 2A shows a dual processor circuit breaker and an energy information system, in which two processors are implemented using respective microprocessor circuits 214 and 222. The Protective microprocessor 214 monitors the current flowing through the three-phase power lines 202*a*, 202b and 202c of an exemplary three-line system to detect overcurrent conditions and to trip the circuit breaker 116 (shown in FIG. 1A) immediately if a large overcurrent is detected or if a relatively small but sustained overcurrent is detected using a programmable delay time. In a four-line system a neutral power line is also available. In the following explanation, a four-line system will be assumed although a single phase system or a three-line multiphase system is equally applicable.

The EID Protective microprocessor 214 monitors the potential developed across the power lines 202a, 202b, 202c and 202n and the current flowing through the power lines 202a, 202b, 202c and 202n. From these values, the Protective microprocessor 214 calculates the power flowing through the lines and the frequency of the power signal. Based on these parameters, the Protective microprocessor 222 can trip the breaker, update a variety of stored parameters or change the state of an alarm output signal. An alarm signal may be used to actuate an alarm device, such as a light and/or a buzzer, or it may be used, through a trip unit 302 (shown in FIG. 3), to open the circuit breaker 116 (shown in FIG. 1A).

The Energy Information/Communications microprocessor 222 is capable of logging minima and maxima for various monitored parameters, including the overcurrent conditions, also known as pickup events and trip events.

Figure 1B:
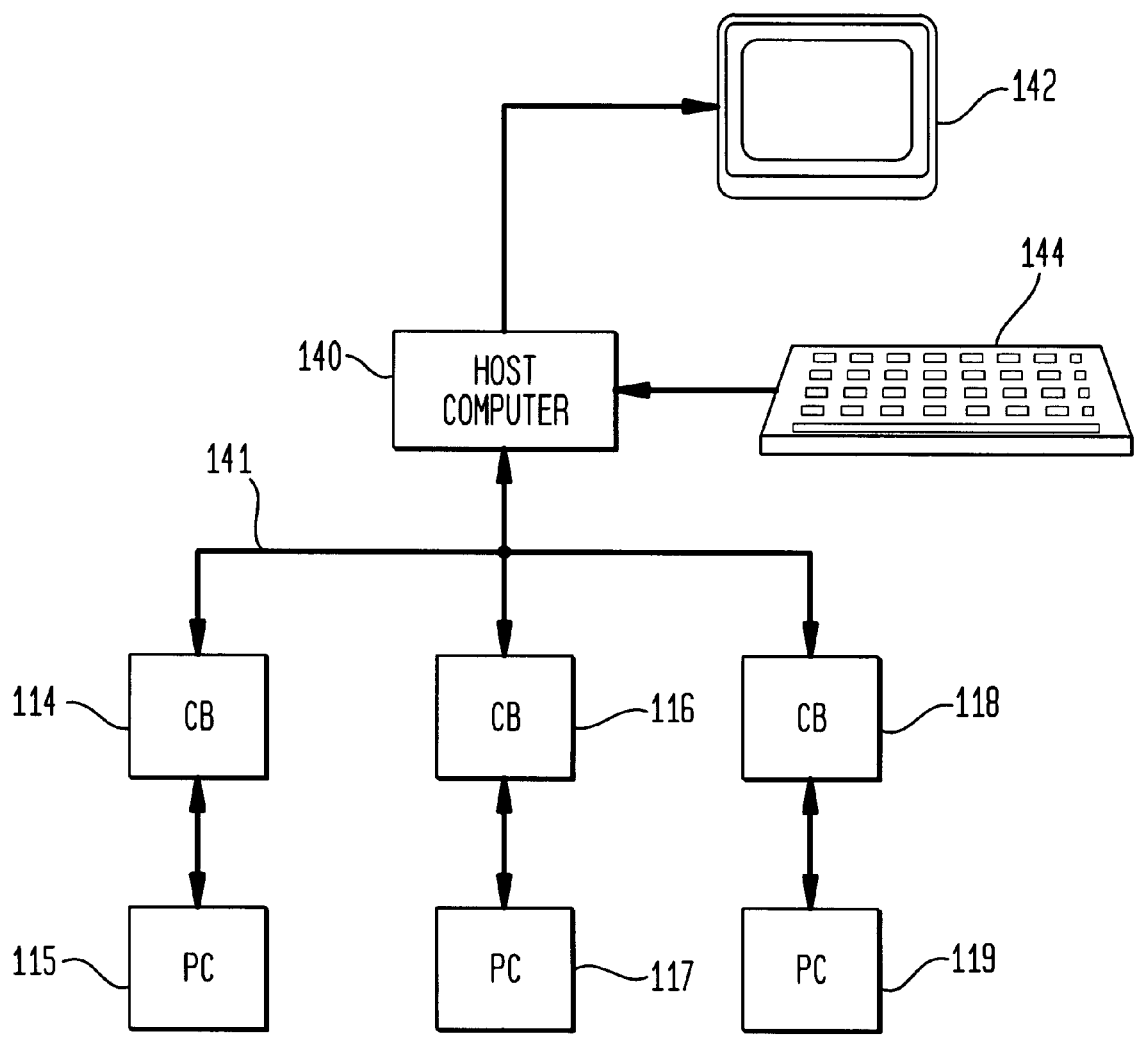
FIG. 1B is a block diagram which illustrates the data communications interconnections of selected ones of the circuit breakers shown in FIG. 1A.
Figure 4:
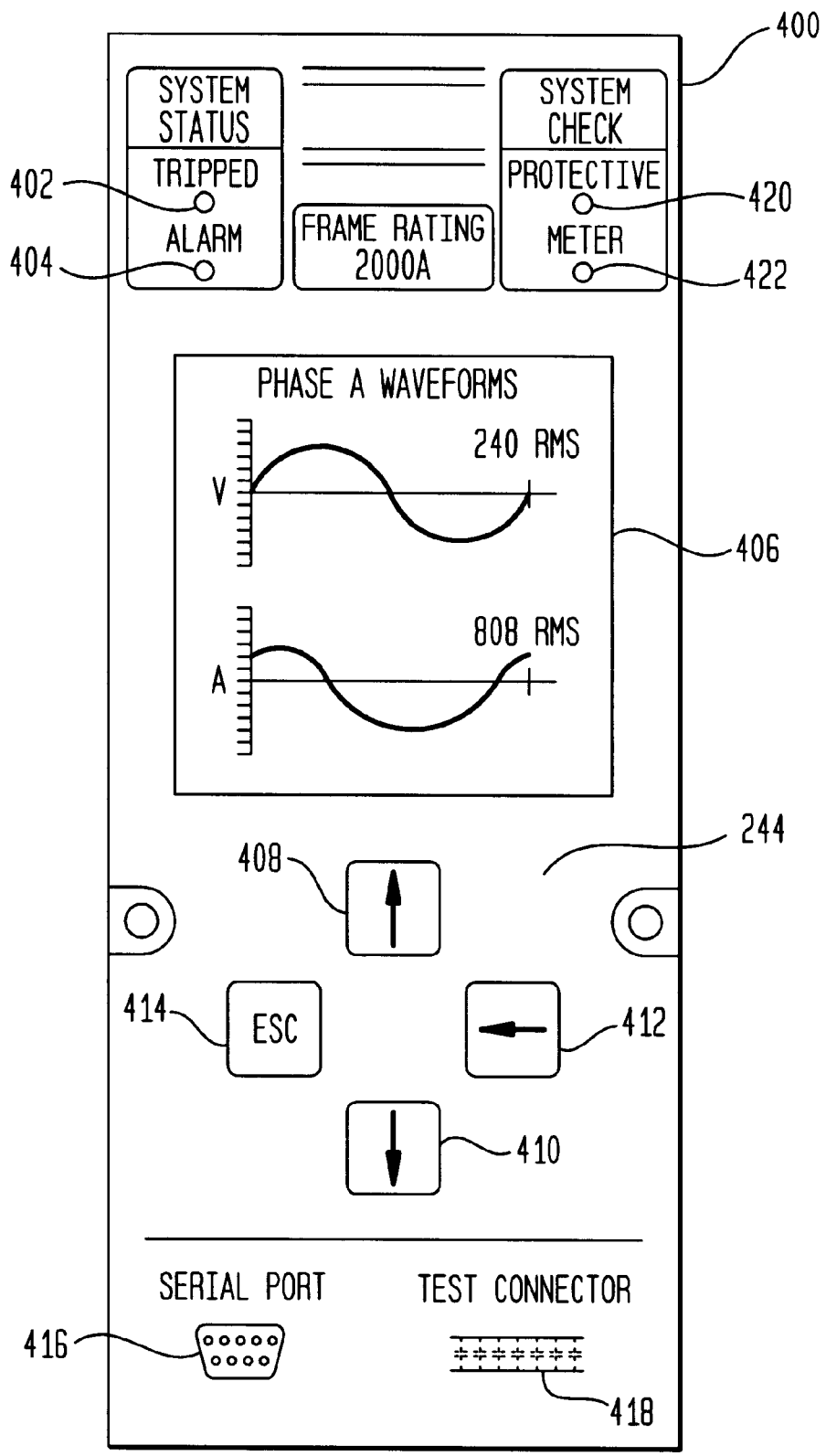
FIG. 4 is an exemplary front panel of one of the EID shown in FIGS. 2A.
Figure 5A:
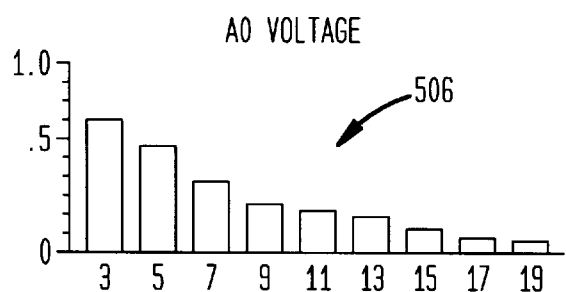
FIGS. 5A, 5C, and 5D are representative graphs and histograms of the present invention( FIGS. 6A, 6B, 6C, 6D, 6E, and 6F are various displays showing exemplary menu displays and an exemplary waveform display of the EID shown in FIG. 2A.
Figure 5B:
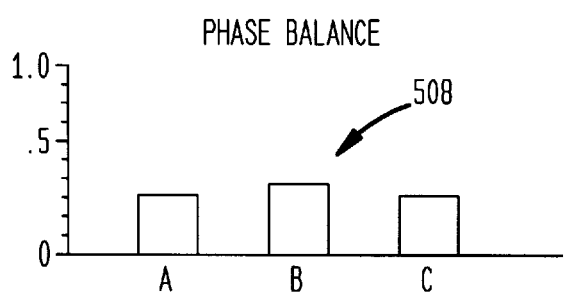
Figure 5C:
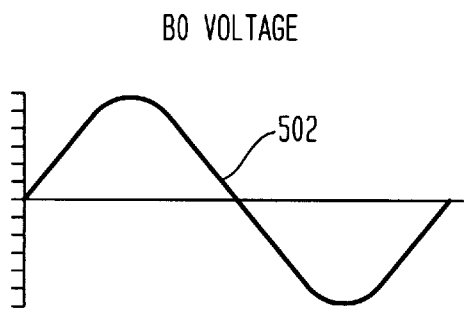
Figure 5D:
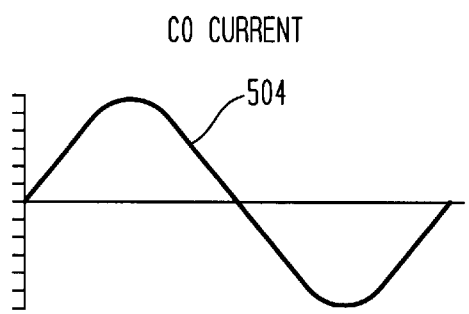

Referring to FIG. 1B, a remote host computer 140 and/or personal computers (PC) 115, 117 and 119 may obtain the logged information. The computer 140 may be coupled to multiple trip units to obtain the continuing status of the electric power distribution system. As is shown in FIG. 4, much of the logged information may be monitored using a local front panel display unit. The host computer 140 and PCs 115, 117, 119 may also be used to control respectively the operation of the circuit breakers 114, 116, 118.

Referring to FIG. 2A, all input and output signals to and from the Energy Information/Communications microprocessor 222 and Protective microprocessor 214, including the operational power signals, are electrically isolated from the outside circuitry to prevent damage to the trip unit circuitry.

DETAILED DESCRIPTION OF THE EXEMPLARY EMBODIMENT OF THE INVENTION

FIG. 1A is a simplified diagram of an electrical power distribution system. In FIG. 1, all of the power lines include three-phase lines and a neutral line, even though only one line is shown. FIG. 1A high voltage source 110, which may be a power company substation, provides a relatively high voltage electrical signal to the primary winding of a transformer 112. The secondary winding of the transformer provides, for example, three-phase low voltage to a factory power distribution system. The lower stepped-down voltage is distributed around the factory through respective step-down transformers 124, 126, 128 and 130 to provide power to equipment represented as respective loads 125, 127, 129 and 131.

The power distribution system is protected by multiple circuit breakers 114, 116,118, 120 and 122. In this configuration, the circuit breakers 116, 118, 120 and 122 each protect the system from faults occurring on a respective branch of the power distribution system. The circuit breaker 114 protects the transformer 112 from faults not handled by any of the other circuit breakers and from faults on the main distribution bus 113.

FIG. 1B schematically illustrates how the circuit breakers may be connected to the host computer 140 for monitoring the power distribution system.

While only three of circuit breakers 114, 116 and 118 are shown in FIG. 1B, other circuit breakers may be connected to the host computer 140. The host computer 140 may comprise an ACCESS™ electrical distribution communication system, available from Siemens Energy and Automation, Inc., connected to an RS-485 port of the circuit breaker. A standard PC 115,117, 119 connected to another communications port of the circuit breaker may also be used.

As shown, the host computer 140 is coupled to a display device 142 and a keyboard 144. As set forth below, the host computer 140 may periodically poll each of the trip units, using a multi-drop line 141 such as an EIA-RS-485 line, to monitor the status of the power distribution system at the main bus and at each branch bus. In addition, the host computer 140 may issue commands to the various circuit breakers causing them to open or to change the levels at which pickup and trip events occur for certain parameters. As is further shown in FIG. 1B, each of the trip units 114, 116 and 118 may be coupled to respective PCs 115, 117 and 119 by a separate data communications port, such as an EIA-RS-232 communications port. The PC may be used to monitor the status and history of the circuit breaker it is connected to as well as issue commands to the circuit breaker causing it to open or to change the levels at which pickup and trip events occur for certain ones of the monitored parameters. These monitoring and control features are generally independent of those of the host computer 140.

FIG. 2A is a block/schematic diagram of the trip unit portion of an exemplary circuit breaker 116. The circuit breaker is assumed to be the unit 116 which isolates its branch line from the main bus 113 as shown in FIG. 1A. The circuit breaker includes the Protective microprocessor 214 for implementing the overcurrent protection functions of the circuit breaker and the Energy Information/Communications microprocessor 222 for implementing data communications features and monitors certain parameters and conditions and for providing display and input control functions. The Protective microprocessor 214 includes an 68HC11 microcontroller (available from Motorola), that is connected to a Programmable Read Only Memory (PROM) 216. The PROM 216 stores program and fixed-value data.

Electrical current flowing through the three-phase lines 202a, 202b, and 202c and the neutral line 202n is sensed by four current transformers 204a, 204b, 204c and 204n. In the present embodiment, the current transformers 204a, 204b, 204c and 204n provide power for the circuit protection features. Current induced in the secondary winding of each current transformer is coupled to the Energy Information Device(EID) 200 of circuit breaker 116 through current inputs 254. These currents are then conditioned by signal conditioner 210 and provided to Protective microprocessor 214.

Figure 2B:
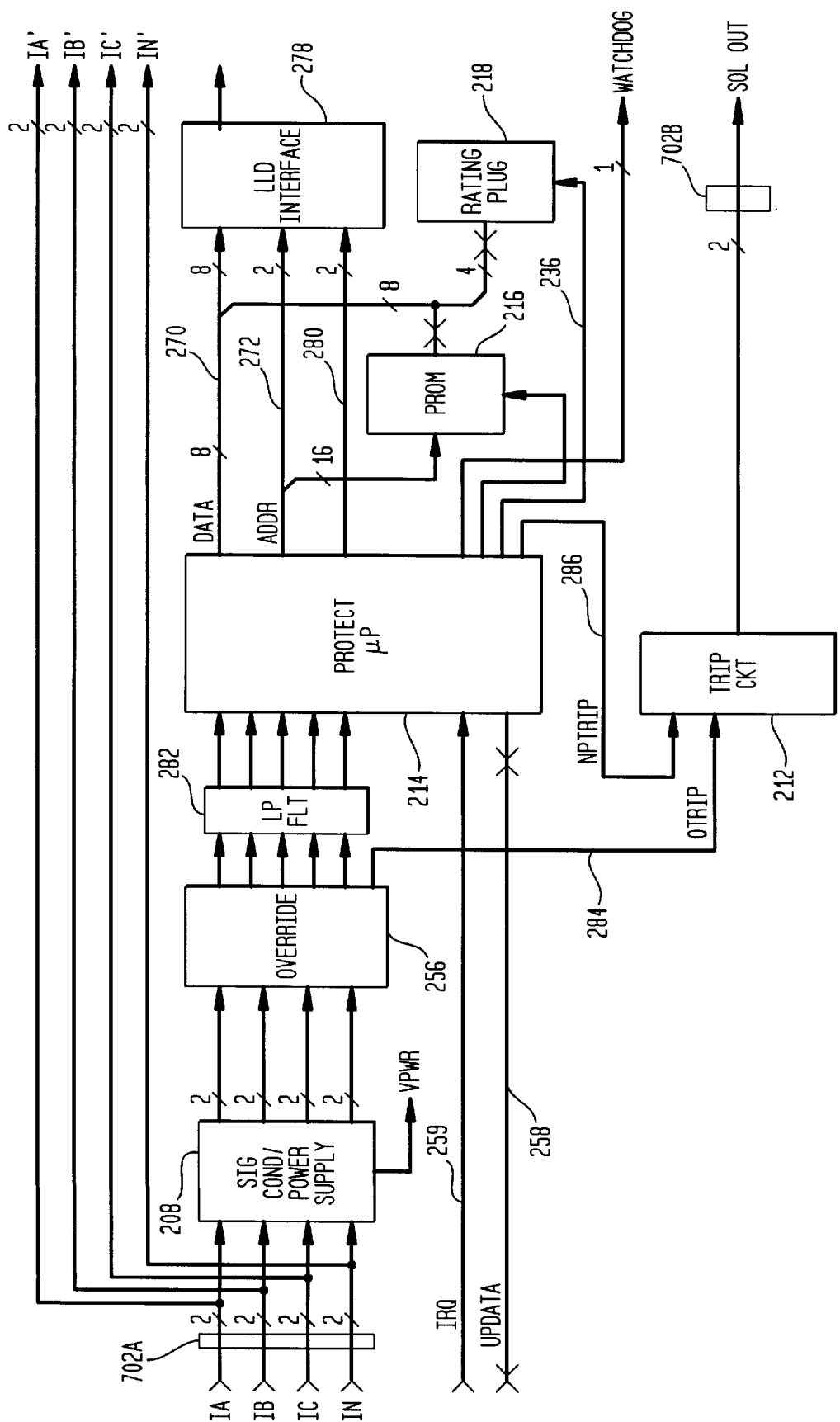
FIGS. 2B and 2C are block diagrams of circuit boards, partly in schematic diagram form detailing the bus structure and interconnection of the components of FIG. 2A.

The current transformers 204 supply operational power when the external power supply is not on. When the external power supply 226 is on, it supplies power to both the Protective microprocessor 214 and Energy Information/Communications microprocessor 222. As shown in FIGS. 2A and 2B, the secondary windings of the transformers 204a, 204b, 204c and 204n are coupled to power supply 208 of the Protective microprocessor 214. External control power required for Energy Information, communication and protective relaying functions is provided by external power supply 226. Fail-safe protection is provided by overcurrent circuit 256 which is connected to trip circuit 212. Trip circuit 212 is used to trip the contactor portion (not shown) of circuit breaker 116 under control of either override circuit 256 or Protective microprocessor 214.

Figure 3:
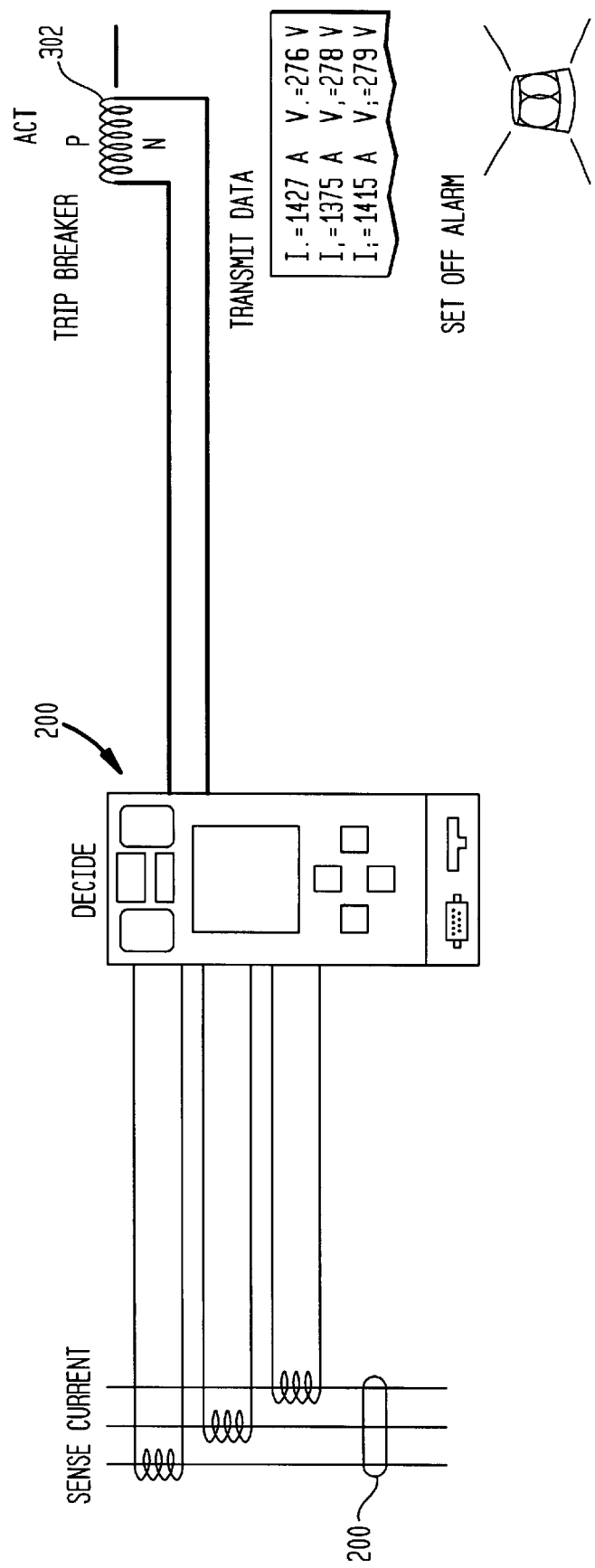
FIG. 3 is a drawing showing the interconnection of the EID of FIG. 2A and a trip unit.

If during current monitoring, the Protective microprocessor 214 detects a large overcurrent condition indicative of a short circuit condition, or a smaller overcurrent condition persisting for longer than a predefined time interval, the Protective microprocessor 214 activates the trip circuit 212, which activates trip solenoid 302 of FIG. 3 to break the connection between the branch lines 202a, 202b and 202c and the main bus 113.

Referring to FIG. 4, a front panel 400 of EID 200 has a keypad 244 for setting the pickup and trip levels used for primary overcurrent protection through a menu system (shown in Table V below). As set forth above, a pickup level is an overcurrent condition which may cause the trip unit to trip the circuit breaker, either after a delay(depending on the level) or instantaneously for relatively large overcurrent conditions. The configuration of the keypad 244 is described below with reference to FIG. 4.

Figure 2C:
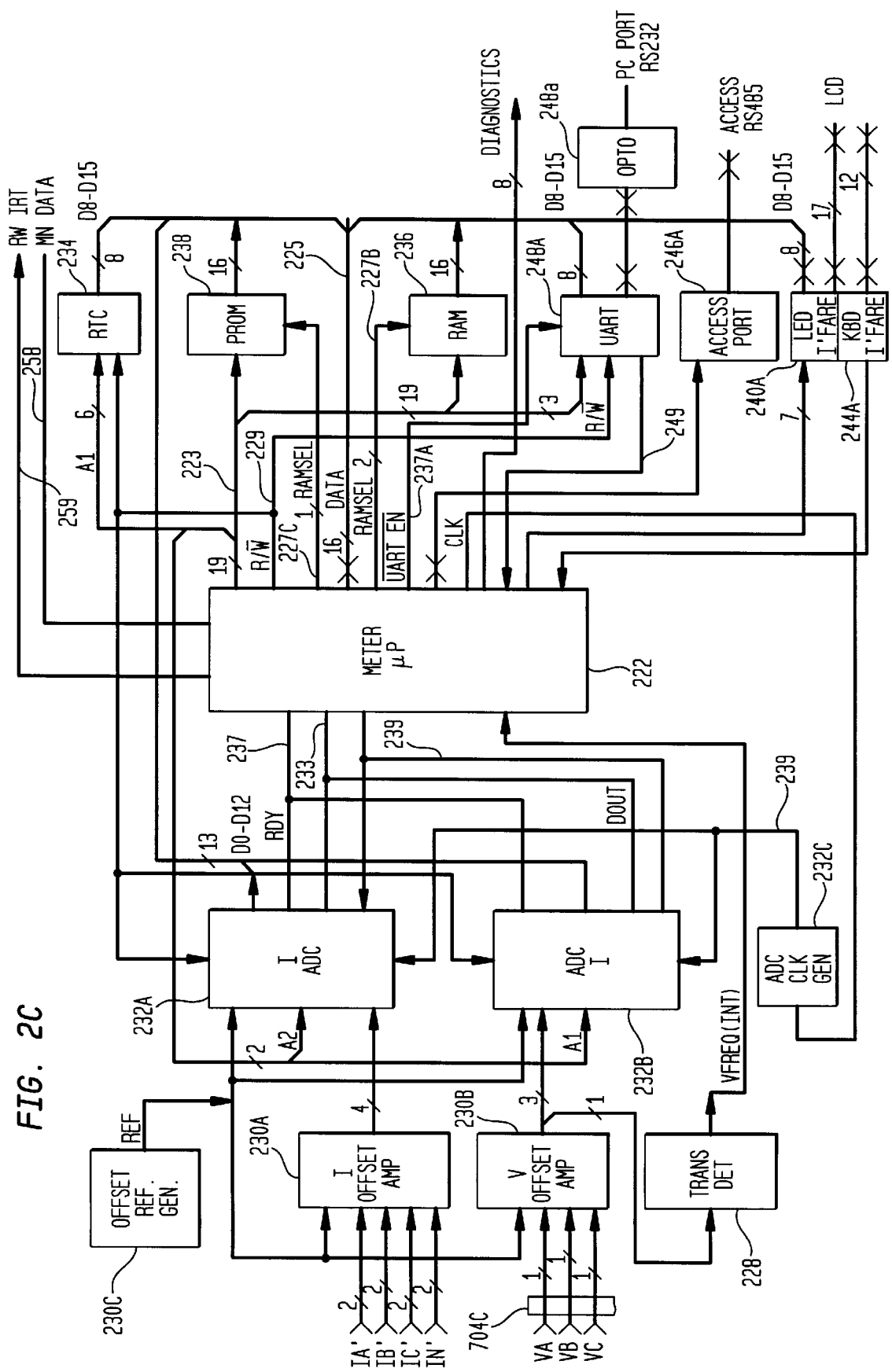

As shown in FIG. 2C, a Real-Time-Clock (RTC) 234 is used as al time stamp for Energy Information/Communications microprocessor 222 and for keeping time within the energy information system. In the present embodiment, RTC 234 is a DS1283S available from Dallas Semiconductor Corp.

Referring to FIG. 4, the Energy Information/Communications microprocessor 222 is coupled to the front panel 400 of the EID 200. The Energy Information/Communications microprocessor 222 indicates on the front panel 400 the event type, which caused the trip, by illuminating the appropriate LED display. In the present embodiment, the Energy Information/Communications microprocessor 222 can activate three light emitting diodes 402, 404, 422 (LEDs) on front panel 400. LED 402 is activated when a trip event occurs and LED 404 is, activated when an alarm condition occurs. Trip events and alarm conditions are outlined below. The status of the current, voltage and frequency is monitored by the EID. As described below, various results of this monitoring are available for display within the display area 406 on the front panel 400.

The Computer Operating Properly (COP) watchdog timer (not shown) continually monitors the status of the Protective microprocessor 214. The exemplary watchdog timer must be written to by the Protective microprocessor 214 at regular intervals. If it fails to be written to within the expected time interval, code is invoked that: 1) turns off the Protective System Check LED; (2) turns on the Protective microprocessor's Alarm line to indicate a system failure has occurred; (3) continues to provide a simplified type of over current protection such that if the instantaneous peak value of any phase current exceeds 130% of nominal, the breaker is tripped.

The Protective System Check LED 240, activated by the Protective microprocessor 214, and the Metering System Check LED 422, activated by the Energy Information/Communications microprocessor 222, provide "heartbeat" signals which provide a visual indication of the health of the respective microprocessors. In the exemplary embodiment, these LEDs flash when the respective microprocessors are operating normally.

In the present embodiment, the display area 406 is a liquid crystal display (LCD) which may display power related signals, histograms and alphanumerics representing user selected information on the status of the circuit breaker 116. The display area 406 is a 128 by 128 monochrome pixel display. Of course, other sizes may be used as well as the use of color and the like. Further, the display area 406 may also be electrofluorescent or any other suitable display type. As shown in FIGS. 5A to 5D, the types of signals 502, 504 may be voltage and/or current for any or all phases of the power system. Histograms 506, 508 may also be displayed to present information such as frequency harmonics, phase balance, pickups and delays, and other information. The alphanumerics display may provide an indication of current draw, phase voltage, phase angle, power factor, power consumption and other information.

The signals and histograms may be separately or commonly displayed in any combination as selected by the user. Information to be displayed is selected using a menu system available to the user by the display area 406.

Selections are made using the keypad 244. The menu system may also provide for housekeeping items such as contrast adjustment for the LCD display. This is accomplished by having the appropriate menu appear on the screen and using the Up or Down keys to adjust the contrast. It has been found that adjustable contrast in an electronic trip unit is a desirable feature due to the variety of lighting environments in which circuit breakers are installed. The details of the menu system are described below with reference to Table V.

Referring to FIG. 2A, The Energy Information/Communications microprocessor 222 and Protective microprocessor 214 are interconnected by data path 258 in a master-slave relationship with Protective microprocessor 214 acting as the master. Communications between microprocessors 214 and 222 are based on a fixed length messages of 32 bytes each using an interrupt scheme initiated by Energy Information/Communications microprocessor 222. Information, such as an indication that a long-time pickup event has occurred or that a trip event has occurred, are sent from Protective microprocessor 214 to Energy Information/Communications microprocessor 222 for display on the display 240 and/or communication to an external system, such as host computer 140 (FIG. 1B).

Referring again to FIG. 4, keypad 244 includes switches 408, 410, 412 and 414 for setting the various set points such as for instantaneous trip and display modes of the breaker 116 through the menu system displayed in display area 406. For example, current is specified as a multiple of the rated current of the current sensors 204 (FIG. 2A). In the present embodiment, the current may be set to between twice and fifteen times the rated current of the sensor. When a Menu screen is displayed. The Up switch 408 moves the display cursor (not shown) upward in the menu list. The Down switch 410 moves the display cursor downward in the menu list The Enter switch 412 selects the highlighted menu item and takes the user to that next lower level in the menu hierarchy. The Escape switch 414 moves the user up to the next higher level in the menu hierarchy.

When a Setting screen is displayed, the UP switch 408 increases the setting level. The Down switch 410 decreases the setting level. The Enter switch 412 moves to the next setting displayed on the screen (if more than one setting is displayed). The action of the Escape switch 414 depends on whether the user has changed a setting while a Setting screen is displayed. If no setting His changed, pressing Escape moves the user up to the next higher level in the menu hierarchy. If a setting is changed, pressing Escape causes a screen to be displayed that instructs the user to press Enter to accept and implement the change or press Escape to the reject change. When one or the other of these switches is pressed, the user is then moved up to the next higher level in the menu hierarchy. The ground fault trip parameters are also selected using the menu system. In the present embodiment, the ground-fault pickup may be set to no less than 20% and no more than 100% of the rated current of the breaker. The actual setting range allowed varies with the current rating of the specific breaker. The time delay before trip can be set to between 0.1 seconds and 0.5 seconds.

In addition to the display area 406, switches 408, 410, 412, 414, the front panel 400 includes a connector 416 which may be used by the Energy Information/Communications microprocessor 222 to implement data communications with the PC using a EIA-RS-232 communications protocol, and a connector 418 as a maintenance and test point to diagnose internal conditions of the EID 200. Referring to FIG. 9B, a rear connector 702 couples the EID 200 to the circuit breaker 116 using connector 704 which in turn uses a connector (not shown) to connect the Energy Information/Communications microprocessor 222 to the host computer 140 to implement data communications using a EIA-RS-485 communications protocol.

Referring again to FIG. 2A, the Energy Information/Communications microprocessor 222 includes a 68HC16Z1 microcontroller available from Motorola, Inc. and a memory. This memory includes an external programmable read-only memory (PROM) 238, which is used to store the program instructions and a random access memory (RAM) 236 which are external to the microcontroller. In the present embodiment, the PROM 238 is a pair of 27C01 0 integrated circuits and the RAM 236 is a pair of 62256 integrated circuits.

The Energy Information/Communications microprocessor 222 possesses both communications and monitoring capability and features. In addition to monitoring the current flowing through the lines, the Energy Information/ Communications microprocessor 222 obtains the current and voltages of the three phase lines to monitor demand, power, energy and imbalances among the three phases. Voltage on one phase is used to obtain frequency information.

Data on the current and voltage flowing through the lines 202a, 202b, 202c and 202n is collected by an analog-to-digital converter (ADC) 232 which is coupled to the current sensors 204. In addition, the ADC 232 is coupled through signal conditioner 230 to a potential transformer 206 which provides a measure of the voltage at each of the three phases. Signal conditioner 230 biases the voltage from transformers 206 and the current from transformers 204 above ground by an amount sufficient to result in a full-wave biased voltage. ADC 232 comprises a pair of ADC12048 12-bit ADCs manufactured by National Semiconductor and are coupled in parallel to Energy Information/Communications microprocessor 222 using bi-directional octal buffers (not shown). ADC 232 provides instantaneous samples of the current signals and voltage signals. The microcomputer 222 controls the ADC 232 to determine which sample to provide at any given time. Of course, it is believed that sigma-delta converters may also be used, as has been known since at least about the mid-1980's.

As set forth above, the Energy Information/Communications microprocessor 222 has two substantially independent communication ports. One port is a dedicated EIA-RS-485 communications port 246 that is coupled to the host computer 140, and the other is an EIA RS-232 port 248 through which the Energy Information/Communications microprocessor 222 may be coupled to PC 117. Both ports 246 and 248 include conventional opto-isolators to prevent any electrical connection between the Energy Information/Communications microprocessor 222 and the host computer 140 or the PC 117. The Protective microprocessor 214 is also configured with an output line to the trip circuit 212.

Figure 2D:
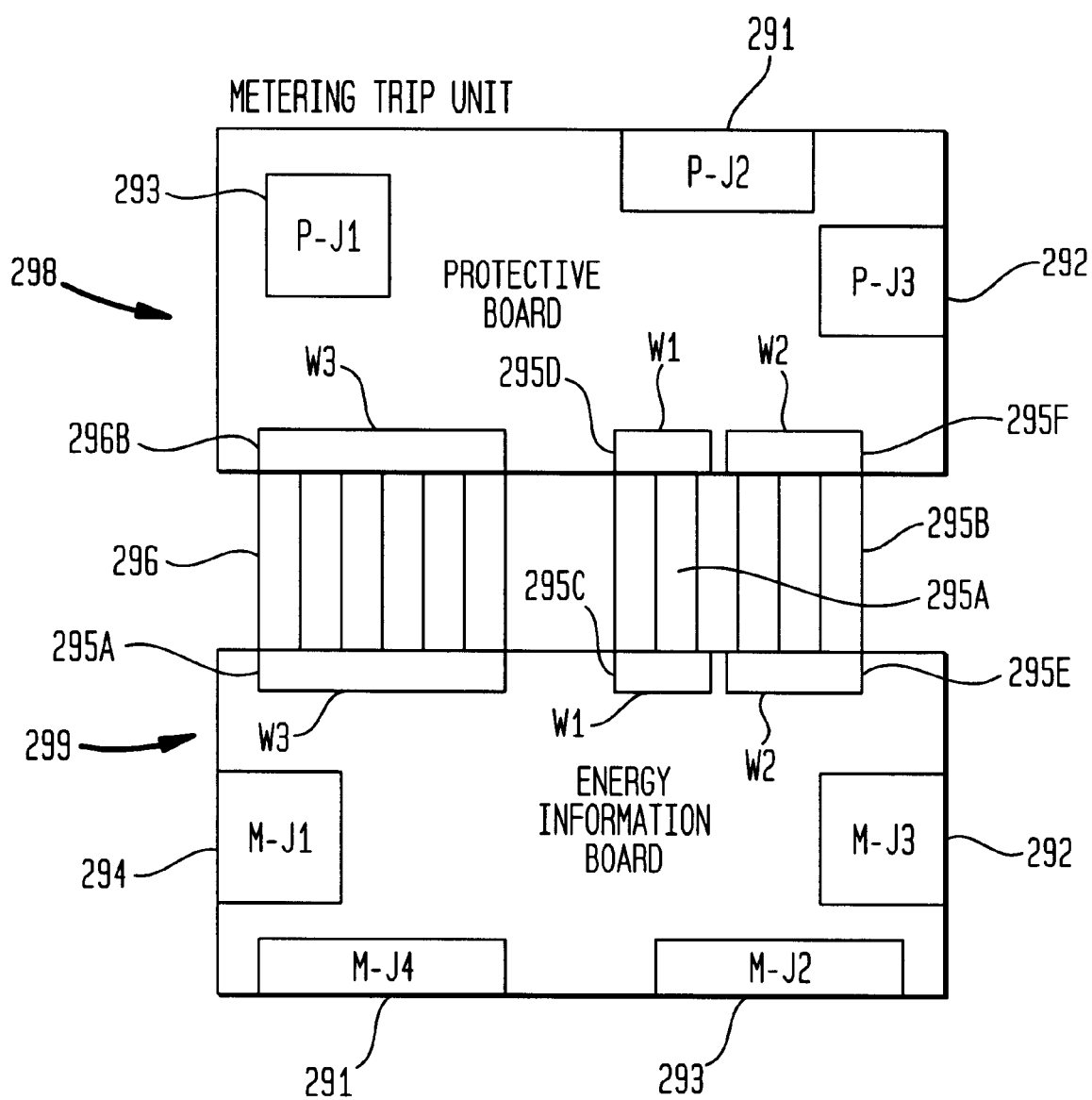
FIG. 2D is a diagram showing the interconnection of the circuit boards detailed in FIGS. 2B and 2C.

This allows Protective microprocessor 214 to trip the circuit breaker 116. FIGS. 2B, 2C and 2D provide a more detailed view of the interconnection of elements described above with respect to FIG. 2A. FIG. 2B shows the details of the protective board 298. FIG. 2C shows the details of the metering board 299. FIG. 2D shows the details of the interconnection between protective board 298, metering board 299 and certain other components of circuit breaker 116.

Referring to FIG. 2B, Protective microprocessor 214 uses an eight-bit data bus and sixteen-bit address bus 272. The eight- bit data bus 270 and sixteen-bit address bus 272 are connected to PROM 216 Protective microprocessor 214 accesses PROM 216 using select line 274. In the present embodiment, rating plug 218 uses four bits of the eight-bit data bus. The data from the rating plug 218 is accessed by Protective microprocessor 214 using select line 276. The select lines 274 and 276 are controlled by Protective microprocessor 214.

The current signals $I_A$, $I_B$, $I_C$, and $I_N$ from transformers 204 are provided through connector 702A (part of connector 702 mentioned above) to signal conditioner 210, Protective microprocessor power supply 208, and Energy Information/Communications board 299. The conditioned current signals ($I_A'$, $I_B'$, $I_C'$, and $I_N'$), are provided to override circuit 256. The power supply generates voltage from the current signals $I_A$, $I_B$, $I_C$, and $I_N$ and supplies this voltage to trip circuit 212. Trip circuit 212 is also provided with override trip signal 284 from override circuit 256 and microprocessor trip signal 286 from Protective microprocessor 212. These signals are used to activate the trip solenoid (not shown). Override circuit 256 converts the current signals ($I_A'$, $I_B'$, $I_C'$, and $I_N'$) from differential signals to single ended signals and produces a differential current sum signal $I_S'$. These signals are provided to filter 282 which low pass filters the current signals to remove high frequency noise. The filtered current signals $I_A''$, $I_B''$, $I_C''$, $I_N''$, and $I_S''$ are then provided to Protective microprocessor 212.

Referring now to FIGS. 24A and 24B the details of the interconnection of elements of the protective board 298 are explained. Referring to FIG. 24A, the IA+ signal is provided to one end of capacitor 2602, the anode of diode 2606, and the cathode of diode 2604. The IA− signal is provided to the other end of capacitor 2602 and one end of resistor 2608. The other end of resistor 2608 is connected to the cathode of diode 2610 and the anode of diode 2612. The cathode of diode 2606 is connected to the cathode of diode 2612 the REF input of circuits 2624, 2626, and 2628, and the anode of diode 2618 and the source of transistor 2620. The anode of diode 2604 is connected to one end of the resistor 2614 and the IA+ input of circuit 2622. The anode of diode 2610 is connected to one end of resistor 2616 and the IA− input of circuit 2622. The other end of resistors 2614 and 2616 are connected to ground.

Circuits 2624, 2626 and 2628 are identical to the circuits described above. Therefore, a detailed explanation of these circuits is not provided for simplicity. Circuit 2624 interfaces to the phase B current source, circuit 2626 interfaces to the phase C current source and circuit 2628 interfaces to the neutral current source respectively. Inputs IA+ and IA−, IB+ and IB−, IC+ and IC−, and IN+ and IN− are provided from connector 702 and are also connected to respective pins of connector 295B. Similar to the inputs IA+ and IA− to circuit 2622 described above, the outputs of circuits of 2624, 2626, and 2628 are connected to the IB+, IB−, IC+, IC−, IN+ and IN− inputs of circuit 2622, respectively.

The VOR input of circuit 2622 is connected to one end of resistor 2694 and one end of resistor 2696. The other end of resistor 2694 is connected to the +5 volts supply (not shown) and the second end of resistor 2696 is connected to ground. The gate of transistor 2620 is connected to one end of resistor 2630, one end of capacitor 2632, the cathode of zener diode 2634, the anode of zener diode 2636, and the FG input of circuit 2622. The drain of transistor 2620 is tied to the other end of resistor 2630, the other end of capacitor 2632, the anode of diode 2634 and ground. The cathode of diode 2618 is connected to the cathode of zener diode 2636, the positive input of capacitor 2638, one end of resistor 2644, the collector of transistor 2640, the cathode of diode 2668, and pins 9 and 5 of connector 702 (shown in FIG. 9B). The emitter of transistor 2640 is connected to the BJT input of circuit 2622. The base of transistor 2640 is connected to the cathode of diode 2642. The anode of diode 2642 is connected to the second end of resistor 2644 and the anode of diode pair 2648. One cathode of diode pair 2648 is connected to the anode of diode 2672, the cathode of diode 2674, the anode of SCR 2662, one end of capacitor 2603, and one end of switch S1 2664. The second cathode of diode pair 2648 is connected to the anode of diode 2668, the cathode of diode 2672, one end of MOV 2676, the anode of SCR 2656, one end of capacitor 2601, and pin 13 of connector 702. The UT output of circuit 2622 is connected to one end of resistor 2650. The second end of resistor 2650 is connected to one end of resistor 2652, one end of capacitor 2654, and the gate of SCR 2656. The SG output of circuit 2622 is connected to the cathode of zener diode 2625, one input of OR gate 2686, and one end of resistor 2678. The RST output of circuit 2622 is connected to the cathode of diode 2627 and the reset input of microprocessor 214. The anode of diode 2627 is connected to the second input of OR gate 2686, one end of resistor 2680, one end of resistor 2670, and the PA7 input of microprocessor 214. The second end of resistor 2670 is connected to one end of resistor 2658, one end of capacitor 2660, and the gate of SCR 2662. The cathode of SCR 2656 is connected to the cathode of SCR 2662, the second end of resistor 2652, the second end of capacitor 2654, the second end of resistor 2658, the second end of capacitor 2601, the second end of capacitor 2660, the second end capacitor 2603, the second end and case of switch 2664, and ground. The second end of zener diode 2625 is connected to ground. The second end of resistor 2678 is connected to one anode of diode pair 2682. The second end of resistor 2680 is connected to the second anode input of diode pair 2682. The cathode of diode pair 2682 is connected to one end of resistor 2684, and pin 1 of connector 296. The other end of resistor 2684 is connected to ground. The anode of diode 2674 is connected to the second end of MOV 2676 and pin 17 of connector 702. The output of OR gate 2686 is connected to one end of resistor 2688. The second end of resistor 2688 is connected to one end of capacitor 2690 and pin 1 of connector 702. The second end of capacitor 2690 is connected to ground. The second end of capacitor 2638 is connected to ground. The GS output of circuit 2622 is connected to one end of resistor 2692 and the PG0 output of microprocessor 214. The second end of resistor 2692 is connected to ground.

The IA output of circuit 2622 is connected to one end of filter 2629. The second end of filter 2629 is connected to the AN0 input of microprocessor 214. The IB output of circuit 2622 is connected to one end of filter 2631. The second end of filter 2631 is connected to the AN1 input of microprocessor 214. The IC output of circuit 2622 is connected to one end of filter 2633. The second end of filter 2633 is connected to the AN2 input of microprocessor 214. The IN output of circuit 2622 is connected to one end of filter 2635. The second end of filter 2635 is connected to the AN3 input of microprocessor 214. The ISUM+ output of circuit 2622 is connected to one end of filter 2639. The second end of filter 2639 is connected to the AN6 input of microprocessor 214. The ISUM– output of circuit 2622 is connected to one end of filter 2637. The other end of filter 2637 is connected to the AN7 input of microprocessor 214. The AN4 input of microprocessor 214 is connected to pin 21 of connector 296. The AN5 input of microprocessor 214 is connected to pin 19 of connector 296. Pin 19 of connector 702 is connected to one end of resistor 2702 and one end of resistor 2704. A second end of resistor 2702 is connected to a 10 volt power source (not shown). Pin 14 of connector 702 is connected to the anode of zener diode 2706, and to ground. The cathode of zener diode 2706 is connected to the second end of resistor 2704 and the PA0 input of microprocessor 214. The VRH input of microprocessor 214 is connected to the first end of resistor 2710, the first end of resistor 2708, and the first end of capacitor 2712. The second end of resistor 2708 is connected to the digital voltage supply. The second end of capacitor 2712 is connected to second end of resistor 2710 and to ground. Pin 28 of connector 702 is connected to one end of resistor 2714 and pin 10 of connector 295. The second end of resistor 2714 is connected to the YA input of buffer 2720. Pin 35 of connector 702 is connected to one end of resistor 2716 and pin 20 of connector 295. The second end of resistor 2716 is connected to the YB input of buffer 2720. Pin 36 of connector 702 is connected to one end of resistor 2717 and pin 18 of connector 295. The second end of resistor 2717 is connected to the YC input of buffer 2720. Pin 4 of connector 702 is connected to one end of resistor 2718. The second end of resistor 2718 is connected to the YD input of buffer 2720. Pin 32 of connector 702 is connected to one end of resistor 2722 and pin 12 of connector 295. The second end of resistor 2722 is connector A input of buffer 2730. Pin 30 of connector 702 is connected to one end of resistor 2724 and pin 14 of connector 295. The second end of resistor 2724 is connected to the B input of Buffer 2730. Pin 31 of connector 702 is connected to one end of resistor 2726 and pin 18 of connector 295. The second end of resistor 2726 is connected to the C input of buffer 2730. The OE input of buffers 2720 and 273C0 are connected to ground. The A, B, C, D outputs of buffer 2720 are connected to the TXD, PA6, PA5 and PA4 inputs of microprocessor 214, respectively. The YA, YB, YC, and YD outputs of buffer 2720 are connected to the RXD, PA3, PA2 and PA1 inputs of microprocessor 214 respectively.

The A0–A15 outputs of microprocessor 214 are connected to PROM 216. The A0 address line is further connected to the A input of selector 2768 and pin 11 of connector 2766, the A1 address line is further connected to the B input of selector 2768 and pin 9 of connector 2766. The A2 address line is further connected to pin 7 of connector 2766. The A8, A9, A10 and A11 address lines are further connected to the A, B, C and G2B inputs of selector 2732 respectively. The A13 address line is connected to an input of NAND gate 2734. The A12, A14 and A15 address lines are further connected to respective inputs of OR gate 2738. The output of NAND gate 2734 is connected to the G2A input of selector 2732. The output of OR gate 2738 is connected to both inputs of NAND gate 2736. The output of NAND gate 2736 is connected to the G1 input of selector 2732 and the CE input of PROM 216. The ECLK output of microprocessor 214 is connected to the OE input of PROM 216 and a second input of NAND gate 2734. The D0–D7 databus is output from microprocessor 214 and connected to the D0–D7 input of PROM 216, the B1–B8 input of buffer 2764, and pins 10, 8, 6, 4, 3, 5, 7 and 9 of connector 296 respectively. Data lines D0, D1, D2 and D3 are further connected to inputs YA, YB, YC and YD of buffer 2746 respectively. The Y1 output of selector 2732 is connected to OE input of buffer 2746 and pin 16 of connector 296. The Y2, Y3 and Y4 outputs of selector 2732 are connected to pins 18, 20, and 22 of connector 296, respectively. The Y5 output of selector 2732 is connected to both inputs of NAND gate 2740, the G input of selector 2768 and pin 3 of connector 2766. The output of NAND gate 2740 is connected to an input of OR gate 2742. The second input of OR gate 2742 is connected to the PG5 output of microprocessor 214 and pin 18 of connector 2766. The output of OR gate 2742 is connected to both inputs of NAND gate 2744. The output of NAND gate 2744 is connected to the OE input of buffer 2764. The R/W output of microprocessor 214 is connected to the DIR input of buffer 2764 and to the D input of buffer 2770.

The A1, A2, A3, A4, A5, A6, A7 and A8 outputs of buffer 2764 are connected to pins 19, 17, 15, 13, 2, 4, 6 and 8, respectively of connector 2766. The MODB output of microprocessor 214 is connected to pin 5 of connector 2766. The SS output of microprocessor 214 is connected to pin 20 of connector 295. The SCK output (SCLK signal) from microprocessor 214 is connected to pin 24 of connector 295A. The MOSI output of microprocessor 214 is connected to one end of resistor 2781. The second end of resistor 2481 is connected to pin 16 of connector 295A. The MISO output of microprocessor 214 is connected to one end of resistor 2783. The second end of resistor 2783 is connected to pin 18 of connector 295A. The PG1 signal is connected between microprocessor 214 and the COOL input of circuit 2622. The PG2 output of microprocessor 214 is connected to pin 11 of connector 296. The PG3 output of microprocessor 214 is connected to pin 13 of connector 296. The PG4 signal is connected between microprocessor 214 and pin 15 of connector 296. The IRQ signal is connected between the microprocessor 214 and pin 14 of connector 295A. The XTAL input of microprocessor 214 is connected to a first end of resistor 2774, a first end of crystal 2772, and a first end of capacitor 2778. The EXTAL input of microprocessor 214 is connected to the second end of resistor 2774, the second end of crystal 2772, and the first end of capacitor 2776. The second end of capacitor 2776 is connected to the second end of the capacitor 2778 and to ground. The VRH input of microprocessor 214 is connected to the first end of capacitor 2780, a first end of resistor 2782 and a first end of resistor 2784. The second end of the resistor 2784 is connected to the logic voltage supply. The second end of capacitor 2780 and the second end of the resistor 2782 are connected to ground.

The PG7 input of microprocessor 214 is connected to the first end of resistor 2786 and a normally open contact of switch 2788. The second end of resistor 2786 is connected to ground. The common pole of switch 2788 is connected to the logic supply. The Y0, Y1 and Y2 outputs of selector 2768 are connected to the C, B and A inputs, respectively, of buffer 2770. The OE input of buffer 2770 is connected to ground. The YA, YB, YC and YD outputs of buffer 2770 are connected to pins 16, 14, 12 and 10, respectively, of connector 2776. The A output of buffer 2746 is connected to a first end of resistor 2754 and a first end of resistor 2762. The second end of resistor 2762 is connected to pin 3 of connector 218. The B output of buffer 2746 is connected to a first input of resistor 2752 and a first end of resistor 2760. The second end of resistor 2760 is connected to pin 4 of connector 218. The C output of buffer 2746 is connected to a first end of resistor 2750 and a first end of resistor 2758.

The second end of resistor 2758 is connected to pin 5 of connector 218. The D output of buffer 2746 is connected to a first end of resistor 2748 and a first end of resistor 2756. The second end of resistor 2756 is connected to pin 6 of connector 218. The second end of resistors 2748, 2750, 2752 and 2754 are connected to ground.

As mentioned above, the Protective microprocessor 212 communicates with Energy Information/Communications microprocessor 222.

The communication interface is shown in FIGS. 2B and 2C. Protective microprocessor 212 is connected with Energy Information/Communications microprocessor 222 using SPI data line 258 and SPI interrupt line 259. The transfer of data between Protective microprocessor 212 and Energy Information/Communications microprocessor 222 is further described below.

FIG. 2D shows the interconnection of protective board 298 and Energy Information board 299. FIG. 2D Protective board 298 and metering board 299 are interconnected with wire bundles 295A, 295B and 296 through connectors 295C/295D, 295E/295F, and 296A/296B, respectively. In the present embodiment, wire bundles 295 and 296 may be ribbon cable or discrete wires, for example. The protective board 298 is also connected to the rating plug 218 and the-circuit breaker 116 using connectors 291, 292 and 293, respectively. The metering board 299 is connected to test connector 220, LCD 240, keypad 244, and serial port 248 using connectors 291, 292, 293 and 294, respectively.

Referring now to FIGS. 23A–23I, a detailed schematic diagram of the Energy Information board 299 is shown. Elements identical to those in FIG. 2C use identical reference numbers. Information Energy/Communications microprocessor 222 is connected to PROM 238A, 238B and to RAM 236A 236B by the address bus 223 and address bits A1–A17 and $A_1$–A15, respectively. Information Energy/Communications microprocessor 222 is connected to RTC 234 through address bits A0–A5 via address bus 223. Address bus 223 is also connected to UART 248A by address bits A0–A2, to OR gate 2302 with address bit A1, and OR gate 2304 with address bit A2. R/W signal 229 is connected between Information Energy/Communication microprocessor 222, RTC 234, RAM 236A, 236B, the input of inverter 2306, one input of NOR gate 2308, one input of OR gate 2312, one input of UART 248A, one input (DIR) of buffer 2316, and one input (DIR) of buffer 2318. Chip select 2324 (CS9) is connected from Energy Information/ Communication microprocessor 222 to the inputs of NAND gate 2320. The output of NAND gate 2320 is connected to one input of NAND gate 2322. The other input of NAND gate 2322 is connected to the reset input of Energy Information/Communication microprocessor 222, a pin output of diagnostic connector 2326, the output of reset circuit 2328, one end of resistor 2330, and the inputs of NAND gate 2332. The output of NAND gate 2322 is connected to the chip enable of RTC 234. The CS10 output of Energy Information/Communication microprocessor 222 is connected to the output enable input of RTC 234. One end of crystal 2334 is connected to an input (X1) of RTC 234 and the other end of crystal 2334 is connected to another input (X2) of RTC 234. In the present embodiment, crystal 2334 is a 32.768 KHz crystal. Databus 225 is connected between Energy Information/Communication microprocessor 222 PROM 238A, 238B, RAM 236A, 236B, RTC 234, UART 248A, Buffer 2316, Buffer 2318, and LCD interface 240A. In the present embodiment, databus 225 is a 16-byte bus with bits D0–D7 connected to PROM 238A, RAM 236A, and Buffer 2318, and bits D8–D15 connected to PROM 238B, RAM 236B, RTC 234, UART 248A, LCD interface 240A, and Buffer 2316. In the present embodiment, LCD interface 240A is an 8-bit latch such as a 74HC373.

The input of reset circuit 2328 is connected to the other end of resistor 2330 and the logic voltage source (not shown). It is understood that logic, and analog voltages are supplied to various circuits of Energy Information board 299 but are not shown for simplicity. CS boot signal 2391 is output from Energy Information/Communication microprocessor 222 and connected to an input (CE) of PROM 238A, 238B. CS2 signal 2336 is connected from an output of Energy Information/Communication microprocessor 222 to an input (CE) of RAM 236B. CS3 signal 2338 is connected between Energy Information/Communication microprocessor 222 and an input (CE) of RAM 236A. The LCD enable signal (LCD__ENABLE) is output (CS5) from Energy Information/Communication microprocessor 222 to the input of inverter 2340. The output of inverter 2340 is connected to pin of LCD connector 292. The CLKOUT signal is output (CLKOUT) from Energy Information/ Communication microprocessor 222 to an input (CLK) of Counter 2342. The output of NAND gate 2332 is connected to an input (CLK) of Counter 2342 and an input (MR) of UART 248A. An output (Q2) of counter 2342 is connected to an input (XIN) of UART 248A. Another output (Q1) of counter 2342 is connected to an input (CLK) of ADC 232A and to an input (CLK) of ADC 232B. LCD__CS signal 2344 is connected between an output (CS4) of Energy Information/Communication microprocessor 222 and the LCD connector 292. One end of crystal 2346 is connected to one end of capacitor 2348, a first end of resistor 2354 and an input (EXTAL) of Energy Information/Communication microprocessor 222. The other end of crystal 2346 is connected to one end of capacitor 2350 and one end of resistor 2352. The other end of resistor 2352 is connected to the second end of resistor 2354 and to an input (XTAL) of Energy Information/Communication microprocessor 222. The second end of capacitor 2348 is connected to the second end of capacitor 2350 and to ground. One end of capacitor 2356 is connected to an input (XFC) of Energy Information/ Communication microprocessor 222. The other end of capacitor 235E) is connected to one end of capacitor 2358, one end of capacitor 2360, and to the digital voltage supply. The other end of capacitor 2358 and the other end of capacitor 2360 are connected to ground. One end of resistor 2362 is connected to an input (MODCLK) of Energy Information/Communication microprocessor 222, and the other end of resistor 2362 is connected to the digital voltage supply. UART select (UART_CS) 227A is output (CS8) from Energy Information/Communication microprocessor 222 and connected to an input (CS2) of UART 248A An interrupt (INTRPT) of UART 248A is connected to an input of inverter 2390 and the output of inverter 2390 is connected to an interrupt input (IRQ4) of Energy Information/Communication microprocessor 222. Contrast control signal 227D is output (CS7) from Energy Information/Communication microprocessor 222 to both inputs of NAND gate 2392. The output of NAND gate 2392 is connected to a latch enable input of LCD interface 240A. Each of the 8 latched outputs (Q0:Q7) from LCD interface 240A are respectively connected to one end of resistors 2394A–2394I. The second ends of resistors 2394A–2394I are connected to one another and to one end of resistor 2396 and to an inverting input of OPAMP 2398. The non-inverting input of OPAMP 2398 is connected to ground and the output of OPAMP 2398 is connected to the other end of resistor 2396 and to pins of the LCD connector 292. A first pin of diagnostic connector 2326 is connected to one end of resistor 2368 and an input (BERR) of Energy Information/ Communication microprocessor 222. The other end of resistor 2368 is connected to the digital voltage supply. A second pin of connector 2326 is connected to an input (DS) of Energy Information/Communication microprocessor 222. A third pin of connector 2326 is connected to one end of resistor 2366 and an input (BK(DSCLK) of Energy Information/Communication microprocessor 222. The other end of resistor 2366 is connected to the digital voltage supply. Two additional pins of connector 2326 are connected to digital ground. One additional pin of connector 2326 is connected to the digital voltage supply. Three additional pins of connector 2326 are connected to respective inputs (IP0/ IDS0, IP1/DS1, FRZ/QUOT)of Energy Information/ Communication microprocessor 222. The LCD__RST signal is connected between the LCD connector 292 and an output (OC2) of Energy Information/Communication microprocessor 222. The alarm output (OC3) of Energy Information/ Communication microprocessor 222 is connected an input of NAND gate 2402. The other input of NAND gate 2402 is connected to one end of capacitor 2404 and one end of resistor 2406. The other end of capacitor 2404 is connected to ground. The other end of resistor 2406 is connected to the output of NAND gate 2402 and one end of resistor 2408. The other end of resistor 2408 is connected to alarm LED 404 and the other end of alarm LED 404 is connected to the logic voltage supply.

The TRPMB signal (PWMB) from Energy Information/ Communication microprocessor 222 is connected to one end of resistor 2410. The second end of resistor 2410 is connected to the base of transistor 2412. The emitter of transmitter 2412 is connected to ground, and the collector is connected to one end of resistor 2414. The second end of resistor 2414 is connected to trip LED 402 and the other end of trip LED 402 is connected to the logic voltage supply. One end of resistor 2416 is connected to watchdog signal from the microprocessor 214 (PG6) on the protective circuit board via pin 12 of connector 296. The other end of resistor 2416 is connected to the base of transistor 2418. The emitter of transistor 2418 is connected to ground and the collector is connected to one end of resistor 2420. The other end of resistor 2420 is connected to protective LED 420 on front panel 400. METR__CHK signal is output (OC4) from Energy Information/ Communication microprocessor 222 to one end of resistor 2364. The other end of resistor 2364 is connected to one end of meter LED 422 and the other end of meter LED 422 is connected to the logic voltage supply. One end of switch 408 is connected to one end of resistor 2374, one end of capacitor 2376, and the UP signal input (ADA0) to Energy Information/Communication microprocessor 222. One end of switch 410 is connected to one end of resistor 2380, one end of capacitor 2378, and the DOWN signal input (ADA1) of Energy Information/Communication microprocessor 222. One end of switch 412 is connected to one end of resistor 2382, one end of capacitor 2386, and the RETURN input (ADA2) of Energy Information/ Communication microprocessor 222. One end of switch 414 is connected to resistor 2384, one end of capacitor 2388, and the ESC input (ADA3) of Energy Information/ Communication microprocessor 222. The other end of switches 408, 410, 412, 414, and the second end of capacitors 2376, 2378, 2386 and 2388 are connected to ground. The second end of resistors 2374, 2380, 2382, 2384 are connected to the digital voltage supply.

The ADC__CS signal is connected between Energy Information/ Communication microprocessor 222 (CS6) and an input of OR gate 2302, an input of OR gate 2304, enable input (OE) of buffer 2316, and enable input (OE) of buffer 2318. The output of OR gate 2304 is connected to an input of OR gate 2308, an input of OR gate 2310, and a chip select input (CS) of ADC 232A. The output of OR gate 2302 is connected to an input of OR gate 2312, an input of OR gate 2314, and a chip select input (CS) of ADC 232B. An output of inverter 2306 is connected to the other input of OR gate 2310, the other input of OR gate 2314, and the RD input of UART 248A. The output of OR GATE 2308 is connected to the WR input of ADC 232A. The output of OR GATE 2310 is connected to the RD input of ADC 232A. The output of OR GATE 2312 is connected to the WR input of ADC 232B. The output of OR GATE 2314 is connected to the RD input of ADC 232B. Bi-directional data inputs D0–D7 of ADC 232A are connected to the D0–D7 bi-directional data inputs of ADC 232B and the bi-directional data inputs (A1:A8) of buffer 2318. The D8–D12 bi-directional data inputs of ADC 232A are connected to the D8–D12 bi-directional data inputs of ADC 232B and to the A1–A5 inputs of buffer 2316. The SYNC output of ADC 232A is connected to an input of OR gate 2309. The SYNC output of ADC 232B is connected to the other output of OR gate, 2309. The RDY output of ADC 232A is connected to an input of OR gate 2311. The RDY output of ADC 232B is connected to the other input of OR gate 2311. The output of OR gate 2309 is connected to the ADCDONE input (IC1) of Energy Information/ Communication microprocessor 222. The output of OR gate 2311 is connected to the ADCREADY input (IC2) of Energy Information/Communication microprocessor 222.

The SOUT signal is connected between UART 248A and one end of resistor 2333. The other end of resistor 2333 is connected to the base of transistor 2331. The emitter of transistor 2331 is connected to ground. The collector of transistor 2331 is connected to one end of resistor 2329, and the other end of resistor 2329 is connected to the cathode of optoisolator 2335. The anode, of optoisolator 2335 is connected to the digital voltage supply. The base of optoisolator 2335 is connected to one end of resistor 2337. The other end of resistor 2337 is connected to the emitter of optoisolator 2335, the collector of transistor 2341 and an output pin of connector 2353. The base of transistor 2341 is connected to the anode of diode 2343 and one end of resistor 2339. The other end of resistor 2339 is connected to the collector of optoisolator 2335, one end of resistor 2327, and one end of resistor 2345. The other end of resistor 2327 is connected to the collector of transistor 2349 and a pin of connector 2353. The other end of resistor 2345 is connected to the base of transistor 2349 and the cathode of diode 2347. The anode of diode 2347 is connected to the emitter of transistor 2349, the emitter of transistor 2341, the cathode of diode 2343, and one end of the resistor 2351. The other end of resistor 2351 is connected to a pin of connector 2353. The SIN input of UART 24A is connected to one end of resistor 2313 and a collector of optoisolator 2315. The emitter of optoisolator 2315 is connected to ground. A second collector of optoisolator 2315 is connected to the other end of resistor 2313 and to the digital voltage supply. The cathode of optoisolator 2315 is connected to one end of resistor 2321 and a pin of connector 2353. The other end of resistor 2321 is connected to the base of transistor 2317, the collector of transistor 2319 and the anode of diode 2325. The cathode of diode 2325 is connected to the emitter of transistor 2319, one end of resistor 2323, and a pin of connector 2353. The base of transistor 2319 is connected to the other end of resistor 2323 and to the emitter of transistor 2317. The RI input of UART 248A is connected to the digital voltage supply and the CTS and DCD inputs of UART 248A to connected ground.

The PF3 signal of Energy Information/Communication microprocessor 222 is connected to one end of the resistor 2359. The other end of resistor 2359 is connected to the DE input of UART 246A. The TXD output of Energy Information/Communication microprocessor 222 is connected to one end of resistor 2357, and the other end of resistor of 2357 is connected to the Dl input of UART 246A The RO output of UART 246A is connected to one end of resistor of 2361 and the input of inverter 2363. The other end of resistor 2361 is connected to the digital voltage supply. The output of inverter 2363 is connected to the RX input (RCD) of Energy Information/Communication microprocessor 222. One end of resistor 2365 is connected to the IRO LED input of UART 246A and the other end of resistor 2365 is connected to the IRODRV input of UART 246A. One end of resistor 2367 is connected to the IDEDRV and IDEIN inputs of UART 246A. The other end of resistor 2367 is connected to one end of resistor 2369 and to the IVCCB and IBCCA inputs of UART 246A. The other end of resistor 2369 is connected to the IDIIN and IDIDRV inputs of UART 246A. The A input of UART 246A is connected to one end of temperature compensating resistor 2373 and one end of diode 2375. The other end of diode 2375 is connected to ground and the other end of temperature compensating resistor 2373 is connected to a pin of connector 295A. The B input of UART 246A is connected to one end of temperature compensating resistor 2371 and one end of diode 2377. The other end of 2377 is connected to ground and the other end of temperature compensating resistor 2371 is connected to a pin of connector 295A.

The signals SCLK MISO, MOSI, SS, and PUPIRQ (SCK, MISO, MOSI, PCSO/SS, PCS1) of Energy Information/ Communication microprocessor 222 are connected to the protective board via respective pins of connector 295A. One end of resistor 2381 is connected to the SS input of Energy Information/Communication microprocessor 222 and the other end of resistor 2381 is connected to the digital voltage supply. The PF1 input of Energy Information/ Communication microprocessor 222 is connected to one end of resistor 2372 and a pin of LCD connector 292. The PF2 input of Energy Information/Communication microprocessor 222 is connected to one end of resistor 2370 and a pin of LCD connector 292. The other end of resistor 2370 is connected to the other end of resistor 2372 and to the digital voltage supply. The IC3 (signal TRIP_CLK) input of Energy Information/Communication microprocessor 222 is connected to a pin of connector 296. The IC4/OC5 input (signal VFREQ) of Energy Information/ Communication microprocessor 222 is connected to the output of inverter 1032 shown in FIG. 10.

VOLTAGE AND CURRENT SENSING

The VIN input of temperature compensating circuit 2355 is connected to the analog voltage supply. The TEMP output of temperature compensating circuit 2355 is connected to the non-inverting input of comparator 2457. The GND input of temperature compensating circuit 2355 is connected to ground. The COMP output of temperature compensating circuit 2355 is connected to one end of capacitor 2465. The other end of capacitor 2465 is connected to the VOUT output of temperature compensating circuit 2355, one end of capacitor 2463, and the inverting input of comparator 2467. The output of comparator 2457 is connected to one end of resistor 2459. The other end of resistor 2459 is connected to the inverting input of comparator 2457, one end of resistor 2461 and the CH3 input of ADC 232B. The other end of resistor 2461 is connected to ground. The output of comparator 2467 is connected to the base of transistor 2469, the base of transistor 2473, and one end of capacitor 2471. The other end of capacitor 2471 is connected to the emitter of transistor 2469, the emitter of transistor 2473, the non inverting input of comparator 2467, one end of resistor 2401, one end of resistor 2441, and the VREF inputs of circuits 2429, 2431, 2433, 2435, 2437, and 2439. The collector of transistor 2469 is connected to the positive analog voltage supply, and the collector of transistor 2473 is connected to the negative analog voltage supply. The other end of capacitor 2463 is connected to ground.

The circuitry of voltage offset circuits for phase A 2455, phase B 2439, and phase C 2437 is identical and for brevity will only be described with reference to the voltage offset circuit for phase A 2455. In the phase A voltage offset circuit 2455, the VREF signal is connected to one end of resistor 2401. Thea second end of resistor 2401 is connected to one end of resistor 2403 and to an output VAO to the CH0 input of ADC 232B as the phase A voltage. Circuits 2439 and 2437 have corresponding outputs VB0 and VC0 which are connected to the CH1 and CH2 inputs of the ADC 232B respectively. The VA input to circuit 2455 is received from a pin of connector 295 and is connected to one end of resistor 2415 and one end of capacitor 2419. Circuits 2439 and 2437 have corresponding inputs VB and VC from connector 295. The other end of capacitor 2419 is connected to ground. The other end of resistor 2415 is connected to one end of capacitor of 2417, one end of resistor 2413, and the non-inverting input of comparator 2409. The inverting input of comparator 2409 is connected to one end of resistor 2411, one end of capacitor 2405, and one end of the resistor 2407.

The other ends of capacitor 2417, resistor 2413, and resistor 2411 are connected to ground. The output of comparator 2409 is connected to one end of resistor 2421, the other end of resistor 2407, the other end of capacitor 2405, and the other end of resistor 2403. The other end of resistor 2421 is connected to one end of resistor 2425, one end of capacitor 2423, and the inverting input of comparator 2427. The non-inverting input of comparator 2427 is connected to ground. The other end of capacitor 2423 is connected to the other end of resistor 2425 and the output of comparator 2427 and one end of resistor 1038 shown in 315 FIG. 10 (input 1002 of amplifier 1004).

The circuitry of current offset circuits for phase A 2429, phase B 2431, phase C 2433, and neutral 2435 are identical and will be described below with reference to the current offset circuit for phase A as shown in FIG. 231, the M.IC+ signal is connected from pin on connector 295 to one end of resistor 2500. Phase A, B, and neutral current offset circuits have corresponding signals M.IA+, M.IB+, and M.IN+ respectively. The other end of resistor 2500 is connected to one end of capacitor 2504 and one end of resistor 2506. The P&M. IC– signal is connected from a pin on connector 295 to one end of resistor 2502. Phase A, B, and neutral current offset circuits have corresponding signals P&M.IA–, P&M.IB–, and P&M.IN–, respectively, connected to pins on connector 295. The other end of resistor 2502 is connected to the second end of capacitor 2504 and one end of resistor 2508. The other end of resistor 2508 is connected to one end of resistor 2516, and one end of resistor 2510. The second end of resistor 2506 is connected to one end of resistor 2512 and one end of resistor 2518. The other end of resistor 2516 is connected to one end of resistor 2520 and the inverting input of comparator 2522. The other end of resistor 2518 is connected to one end of resistor 2514 and the non-inverting input of comparator 2522. The second end of resistors 2510, 2512, and 2514 are connected to ground. The output of comparator 2522 is connected to the other end of resistor 2520 and one end of 2524. The other end of resistor 2524 is connected to one end of resistor 2526 and to the CH2 input of ADC 232A as signal IC. Phase A, B, and neutral current offset circuits have corresponding signals IA, IB, and IN connected to inputs CH0, CH1, and CH3 of ADC 232A respectively. The second end of resistor 2526 is connected to the VREF source. Phase A, B, and neutral current offset circuits have corresponding connections to the VREF source.

The second end of resistor 2441 is connected to the VREF+ input of ADC 232A and the VREF+ input of ADC 232B, one end of capacitor 2443 and one end of capacitor 2445. The other end of capacitors 2443 and 2445 are connected to ground.

Referring to FIG. 2C, current signals $I_A$, $I_B$, $I_C$, and $I_N$ are provided from protective board 298 by wire bundle 295 to current offset amp 230A. Voltage signals $V_A$, $V_B$, and $V_C$ are provided from circuit breaker 116 through connector 704C to voltage offset amp 230B. Offset generator 230C generates a fixed offset voltage and provides this offset voltage to current offset amp 230A and voltage offset amp 230B to offset the current and voltage, respectively, such that the resulting signals are full wave signals offset above ground potential. This allows EID 200 to process full wave voltage and current signals rather than full wave rectified signals. The exemplary offset reference generator 230C supplies a stable 4.096V reference voltage. The offset amplified current signals are supplied to current ADC 232A and the offset amplified voltage signals are supplied to voltage ADC 232B. Phase A of the offset amplified voltage signal is also provided to zero-crossing frequency sensor 228, which is shown in greater detail in FIG. 10.

Figure 10:
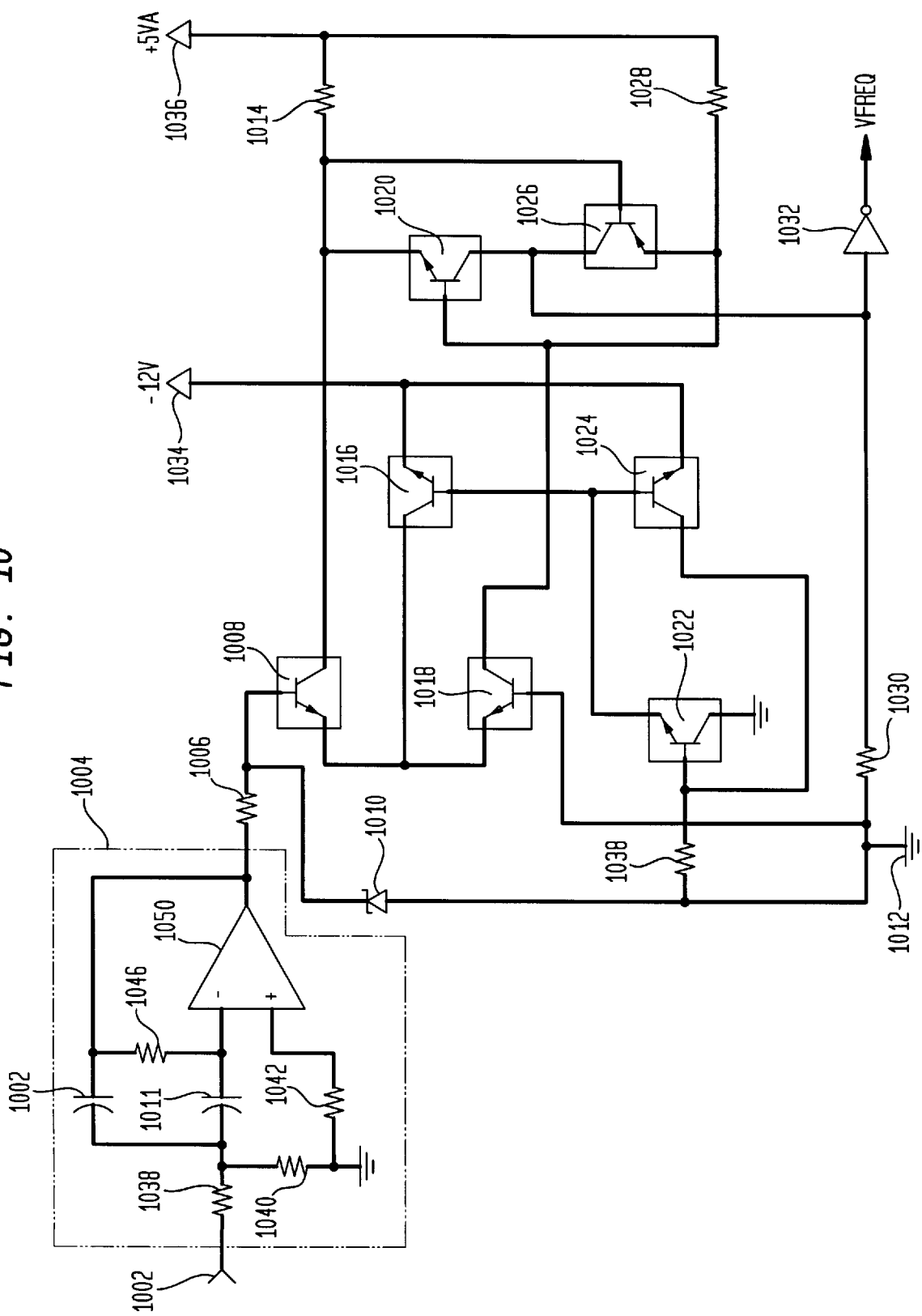
FIG. 10 is a schematic of an exemplary transition detector of the EID of FIG. 2A.

FIG. 10 shows the circuit of the transition detector 228. The offset amplified phase A voltage signal is provided at input 1002 of amplifier 1004. The output of amplifier 1004 is coupled to resistor 1006 to provide current limiting. The other end of resistor 1006 is connected to the base of transistor 1008 and the cathode of diode 1010. In the present embodiment, diode 1010 is a zener diode. The anode of diode 1010 is connected to analog signal ground reference 1012. Diode 1010 clips the output signal of amplified 1004 to approximately the avalanche voltage of diode 1010. The collector of transistor 1008 is connected to one end of resistor 1014 and the emitter of transistor 1020. The other end of resistor 1014 is connected to +5V analog supply 1036. The emitter of transistor 1008 is connected to the collector of transistor 1016 and the emitter of transistor 1018. The emitter of transistor 1016 is connected to the emitter of transistor 1024 and the –12V supply 1034. The base of transistor 1018 is connected to analog signal ground reference 1012. The collector of transistor 1018 is connected to the base of transistor 1020, the emitter of transistor 1026 and one end of resistor 1028. The other end of resistor 1028 is connect to the +5V analog supply 1036. The base of transistor 1016 is connected to the base of transistor 1024 and the emitter of transistor 1022. The base of transistor 1022 is connected to the collector of transistor 1024 and one end of resistor 1038. The other end of resistor 1038 as well as the collector of transistor 1022 are connected to analog signal ground reference 1012. The collector of transistor 1020 is connected to the collector of transistor 1026, one end of resistor 1030, and the input of inverter 1032. The output of inverter 1032 provides signal VFREQ as an interrupt to the Energy Information/communication microprocessor 222.

The voltage signal from voltage offset amp 230B is further amplified by amplifier 1004. The resultant signal is coupled to resistor 1006 to provide current limiting. Diode 1010 limits the output signal to less than or equal to the avalanche voltage, which in the exemplary embodiment is 4.7V. The transistors 1008, 1016, 1018,1020, 1022, 1024 and 1026 and their associated biasing resistors 1014, 1028, 1030 and 1038 are arranged such that the voltage signal presented at the cathode of diode 1010 will be converted to a "1" to "0" transition when the voltage signal from voltage offset amp 230B has a zero crossing. This "1" to "0" transition is inverted by inverter 1032 to a "0" to "1" transition which results in an interrupt to Energy Information/Communications microprocessor 222 for an input voltage transition or zero crossing.

Energy Information/Communications microprocessor 222 uses a 16-bit data bus 225 and a 19-bit address bus 223 to communicate with current ADC 232A, voltage ADC 232B, PROM 238, RAM 236, UART 248A, RTC 234 and LCD interface 240A. Energy Information/Communications microprocessor 222 also uses a combination of unique select lines 227A, 227B, 227C as well as read/write (RIN) signal 229 to control data flow to and from these devices. Not all devices use the entire 16 bits of data bus 225 and all 19 bits of address bus 223. For example, 17 bits of address bus 223 are connected to PROM 238, and address bits A1–A17 are connected to PROM 238 and 15 bits of address bus 223 are connected to RAM 236.

To access the data stored in PROM 238, Energy Information/Communications microprocessor 222 selects PROM 238 by invoking ROMSEL 227C. When ROMSEL 227C is set to a logic level of "0" (active low) the 16 bit data stored in PROM 238 corresponding to the address represented by A1–A17 will be placed on data bus 225 by PROM 238. RAM 236 is accessed in a similar manner with the following exceptions. Two select lines 227B are used to select either or both a low byte of data or a high byte of data from RAM 236. In addition, R/W signal 229 is appropriately set if data is to be written (R/W set to a logic "0") or read (R/W set to a logic "1") from RAM 236. As above, as long as the appropriate select lines are active, data corresponding to address lines A1–A15 will be read from or written to RAM 236.

In the present embodiment, two National ADC 12048 twelve-bit A/D converters (ADC) 232A, 232B are used. ADC 232A samples current and ADC 232B samples voltage. The ADC 232A, 232B provide 12-bits of resolution plus a sign bit and a 13-bit parallel output port. When used in the 13-bit mode, only a single read is required to retrieve the data from a conversion. As mentioned above, since data bus 225 is 16 bits wide, a single read returns all 13 bits of the voltage data and another read returns all 13 bits of the current data. ADC 232A, and ADC 232B each use 3 control lines, a chip select, an active low read enable and an active low write enable to read and write. A configuration register inside the A/D (not shown) is written to set up which channel (0–7) will be converted. The addressing logic (not shown) is set up such that a single write is received by ADC 232A, 232B essentially simultaneously. On the other hand, each ADC 232A, 232B is read using individual commands and addressing to prevent bus contention problems which might corrupt the data.

In the present embodiment, chip select 6 of the Energy Information/Communications microprocessor maps ADC 232A, 232B into a 2K memory block starting at address 7E800 hex (see Table IX below). Chip Select 6 enables ADC 232A, 232B for reads and writes. Bits A1 and A2 of address bus 223, in conjunction with R/W line 229 enable writes to both ADC 232A and 232B for address 7E800, reads of ADC 232A for current samples at address 7E802, and reads of ADC 232B for voltage samples at address 7E804. An A/D conversion is started by writing into the configuration register of ADC 232A, 232B a command indicating the start mode with the channel of interest selected. The next read of ADC 232A, 232B will start a conversion in the respective ADC. The RDY 237 and DONE 233 outputs from ADC 232A, 232B will be driven high while the conversion is in progress, then they will go low when the conversion is complete. The falling edge of the DONE 233 line will cause an interrupt to Energy Information/ Communications microprocessor 222. At this time the results of the conversion may be read from ADC 232A, 232B.

A reference voltage for ADC 232A, 232B is provided by offset reference generator 230C and is set to 4.096 V in the present embodiment. This configures ADC 232A, 232B to accept signals ranging from 0V to +4.096V. This corresponds to approximately 1 mV per bit. The center point of the range which corresponds to a 0 output is 2.048V so that ADC 232A, 232B operates in the positive domain. Therefore, the 13th bit (sign bit) is not used and the 12th bit represents the sign bit. In addition, ADC 232A, 232B are isolated from possible noise on data bus 225 by two bidirectional octal buffers 2316 and 2318 (shown in FIG. 23G). ADC 232A, 232B is also supplied with an ADC CLK signal 239 of approximately 8 Mhz from ADC CLK generator 232C. This clock is derived from a 15.991 Mhz clock generated by Energy Information/Communications microprocessor 222. As a result, a maximum conversion time of about 5.5 $\mu$s is obtained.

The Energy Information/Communications microprocessor 222 monitors line current and voltage for each of the branch lines 202 through the ADC 232 and, from these values calculates other values which indicate the status of the lines 202. It also controls communication between the host computer 140, PC 117, keypad 244 and LCD 240. The monitoring feature involves obtaining voltage and current samples from the branch lines 202, calculating and storing various parameters derived from these samples which indicate certain events and, logging certain of these events as they occur. Table I lists the parameters which may be determined by the Energy Information/Communications microprocessor 222.

TABLE I

| Parameter | Parameter |
|---|---|
| Phase A current | Phase A voltage (to neutral) |
| Phase B current | Phase B voltage (to neutral) |
| Phase C current | Phase C voltage (to neutral) |
| Average current (A, B & C) | Average phase voltage |
| Neutral current[1] | Crest Factor (peak/RMS for each phase) |
| Ground Fault current | |
| Present Current Demand | Real power |
| Maximum Current Demand | Reactive power |
| Line voltage A-B | Apparent power |
| Line voltage B-C | Frequency |
| Line voltage C-A | Kilowatt hours forward |
| Power factor (each phase and Avg.) | Kilowatt hours reverse |
| Avg. line-line voltage | kVAR |
| Avg. L-N voltage (each phase) | Kilowatt demand |
| Demand period time | |
| Harmonic analysis (THD, each phase & neutral) | |

Note:
[1]Neutral data is calculated in 4 wire systems only.

For each parameter, the Energy Information/ Communications microprocessor 222 records in a log the present value, as well as the maximum and minimum values, that have occurred since the last time the log was cleared. The monitored voltage and current values are RMS values generated from sample values taken, for example, over a one-second interval. The frequency is determined by measuring the time interval between zero-crossing points of the measured voltage signal for only one of the three phases, doubling the measured interval and inverting it to convert it into a frequency. Sixty-four (64) samples are taken each cycle with each phase being sampled over 6 cycles once per second resulting in 384 samples per second. The EID has a nominal frequency input range of about 40 Hz to 70 Hz. Frequency is not believed to be essential to measuring the various parameters. Without using the frequency of one phase, the accuracy of various measurements, such as power factor, may be slightly degraded. If a measured frequency is not available, then a user selected pre- programmed frequency of either 60 Hz (U.S.) or 50 Hz (European) is used.

Power measurements are determined using the measured voltage, current and determined frequency. As is well known to those of ordinary skill, the power calculations include active (real) power, apparent power, reactive power and power factor, which may be determined using the following equations:

Active Power (Watts)

$$P = V_{rms} \times I_{rms} \times \cos\phi = \frac{1}{N} \sum_N (V_{inst} \times I_{inst})$$ Equation 1

Apparent Power (VA)

$$S = V_{rms} \times I_{rms}$$ Equation 2

Reactive Power (VARs)

$$Q = V_{rms} \times I_{rms} \times \sin\phi = \frac{1}{N} \sum_N (V_{inst} \times I_{-2})$$ Equation 3

Power Factor $$PF = \cos\phi = \frac{\text{Active Power (Watts)}}{\text{Apparent Power }(VA)}$$ Equation 4

Where:
V nst=Instantaneous Voltage Sample
I inst=Instantaneous Current Sample
φ=Phase Angle between V & I
I-2=I inst shifted 90 electrical degrees $$V_{rms} = \sqrt{\frac{1}{N} \sum_{n=1}^{N} V_n^2}$$

$$I_{rms} = \sqrt{\frac{1}{N} \sum_{n=1}^{N} I_n^2}$$

N = number of samples taken

Note that the VAR calculation requires that each current sample be shifted by 90 degrees, which is referred to in the equations as $I_{-2}$. The VAR calculation produces a signed quantity. A negative VAR quantity indicates a leading power factor and a positive VAR quantity indicates a lagging power factor.

The number of samples per cycle is 64 (64 is divisible by 4, which allows a more accurate 90 degree phase shift and thus is believed to significantly reduce the VAR calculation error.)

The demand period for kW Demand and Amp Demand is the same and consists of a "programmable demand period ($T_{PRG}$)" from 1 to 90 minutes in step such as 1, 2, 5, 10, 16, 20, 30, 60, and 90. During this demand period, the demand is calculated by first averaging the three phase currents and then summing the currents each time a new value is calculated. At the end of the period the sum is divided by the number of samples taken during the period (see Equation 5, below). The maximum demand is calculated based on the user selected "number of demand periods ($N_T$)" (1 to 15). If $N_T$ is 1, then the maximum demand is the largest demand value that has been calculated since demand was last cleared. Setting the number of demand periods $N_T$ equal to a number greater than one allows for a sliding window calculation method. The maximum demand is the largest average demand over $N_T$ periods. Each time a new demand value is calculated, the oldest calculation is discarded and the new one is used to generate a new average.

$$\frac{\sum_{n=1}^{} \left(\frac{I_A + I_B + I_C}{3}\right)}{T_{PRG}} = AmpDemand$$ Equation 5

Where: $T_{PRG}$ is a programmable demand period, and $I_A$, $I_B$ and $I_C$ are phase currents for phases A, B and C, respectively. The kW, kW Demand, kVAR and kW Hour calculations account for reverse power flow, and indicate this with forward (line to load ) and reverse (load to line) power displays on LCD 240. Alarm and trip set-point limits may also be set for forward and reverse power levels. The Power Factor calculation indicates leading and lagging conditions.

Voltage and current are sampled such that the data of one phase is calculated while the data of another phase is sampled. For example, phase A data is calculated while phase B data is sampled, phase B data is calculated while phase C data is sampled, and phase C data is calculated while neutral data is sampled. Either the host computer 140, PC 117 or EID 200 may retrieve monitored parameter values and clear the monitored parameter log.

The protective features implemented in the Protective microprocessor 214 and the Protective Relay functions implemented in the Energy Information/Communications microprocessor 222 allow it to trip the contactor portion of circuit breaker 116 when certain events occur or to activate the alarm signal to either sound an alarm or open the circuit breaker 116, depending on the system configuration selected by the user. Table II lists the events for which the Protective microprocessor 214 may trip the circuit breaker 116 and the parameters that may be stored in the trip log when the circuit breaker is tripped. In particular, $I_X$ indicates the present current in phase X. $V_{X-Y}$ indicates the present voltage measured from phase X to phase Y, $V_{AVE}$ indicates the average phase-to-phase voltage, KW, KBAR and KVA indicate the present value of real power, reactive power and apparent power, respectively.

TABLE II

| Cause of Trip | Parameters logged |
| --- | --- |
| Long Time | $I_A$, $I_B$, $I_C$, $I_N$, & $I_G$ |
| Short Time | $I_A$, $I_B$, $I_C$, $I_N$, & $I_G$ |
| Instantaneous | $_A$, $I_B$, $I_C$, $I_N$ & $I_G$ |
| Ground Fault | $I_A$, $I_B$, $I_C$, $I_N$ & $I_G$ |
| Over Neutral Current | $I_A$, $I_B$, $I_C$, $I_N$ & $I_G$ |
| Current Unbalance | $I_A$, $I_B$, $I_C$, $I_N$ & $I_G$ |
| Over Voltage | $V_{A-B}$, $V_{B-C}$, $V_{C-A}$ & $V_{AVE}$ |

TABLE II-continued

| Cause of Trip | Parameters logged |
|---|---|
| Under Voltage | $V_{A-B}$, $V_{B-C}$, $V_{C-A}$ & $V_{AVE}$ |
| Voltage Unbalance | $V_{A-B}$, $V_{B-C}$, $V_{C-A}$ & $V_{AVE}$ |
| Over Frequency | Freq., $V_{A-B}$, $V_{B-C}$, $V_{C-A}$ & $V_{AVE}$ |
| Under Frequency | Freq., $V_{A-B}$, $V_{B-C}$, $V_{C-A}$ & $V_{AVE}$ |
| Reverse Power | KW, KVAR, and KVA |

Table III lists the events and associated parameters that are logged in the event log.

TABLE III

| | |
|---|---|
| Over Neutral Current | $I_A$, $I_B$, $I_C$, $I_N$ & $I_G$ |
| Current Unbalance | $I_A$, $I_B$, $I_C$, $I_N$ & $I_G$ |
| Under Voltage | $V_{A-B}$, $V_{B-C}$, $V_{C-A}$ & $V_{AVE}$ |
| Voltage Unbalance | $V_{A-B}$, $V_{B-C}$, $V_{C-A}$ & $V_{AVE}$ |
| Over Voltage | $V_{A-B}$, $V_{B-C}$, $V_{C-A}$ & $V_{AVE}$ |
| Reverse Power | KW, KVAR, and KVA |
| Over Frequency | Freq., $V_{A-B}$, $V_{B-C}$, $V_{C-A}$ & $V_{AVE}$ |
| Under Frequency | Freq., $V_{A-B}$, $V_{B-C}$, $V_{C-A}$ & $V_{AVE}$ |
| Over Current | $I_A$, $I_B$, $I_C$, $I_N$ & $I_G$ |
| Ground Over Current | $I_A$, $I_B$, $I_C$, $I_N$ & $I_G$ |
| Over Amp Demand | Amp Demand, $I_A$, $I_B$, $I_C$ |
| Over KW | KW, KVARs, KVA |
| Over KW Demand | Watt Demand, Instantaneous Watts |
| Over KVA | KW, KVARs, KVA |
| Over KVAR | KW, KVARs, KVA |
| Over Leading PF | Total Power Factor, $I_A$, $I_B$, $I_C$ |
| Under Lagging PF | Total Power Factor, $I_A$, $I_B$, $I_C$ |
| Over THD | Total Harmonic Distortion, $I_A$, $I_B$, $I_C$, $I_N$ |

The Protective Relay features include: Neutral Over Current, Current Unbalance, Under Voltage, Voltage Unbalance, Over Voltage, Reverse Power, Over Frequency, and Under Frequency appear in both the Trip Log and the Event Log. The Protective Relay features can be configured by the user to alarm or to alarm and trip (alarm is automatically enabled when trip is enabled). When a Protective Relay feature's alarm is enabled and the alarm pickup and delay are exceeded, the event is logged in the Event Log and the Protective microprocessor, 214 is instructed to signal the alarm. When the trip's pickup and delay settings are exceeded, the event is logged in the Trip Log and the Protective microprocessor 214 is instructed to trip.

The Alarm features include: Over Current, Ground Over Current, Over Amp Demand, Over KW, Over KW Demand, Over KVA, Over KOAR, Over Leading Power Factor, Under Lagging Power Factor, and Over Total Harmonic Distortion only appear when an Alarm function is enabled. When its pickup and delay are exceeded, the event is logged in the Event Log and the Protective microprocessor 214 is instructed to signal the alarm. The alarm features which the EID may recognize are listed in Table III. All of these events are recognized by the Protective microprocessor 214 or Energy Information/Communications microprocessor 222.

Table IV lists exemplary alarm ranges of various parameters measured by EID 200.

TABLE IV

| Alarm event | Measured Parameter | Alarm Range |
|---|---|---|
| Over current (phase) | $I_A$, $I_B$ & $I_C$ | 115%–250% of Ir |
| Over current (ground) | $I_G$ | 20%–100% of In |
| Over current (demand) | $I_A$, $I_B$ & $I_C$ | 60%–100% of Ir |
| Total Harmonic Distortion | Frequency | 5%–50% |
| Over KW | KW | 20–5300 kW |
| Over KW Demand | KW | 20–5300 kW |
| Over KVA | KVA | 20–5300 kVA |
| Over KVAR | KVAR | 20–5300 kW |
| Over Power factor (leading) | PF | .50–.95 |
| Under Power Factor (lagging) | PF | .50–.95 |

The protective features which the EID may recognize are listed in Table V. These events are recognized by the Protective microprocessor 214 or Energy Information/Communications microprocessor 222.

TABLE V

| Protective Function | Measured Parameter | Pick-up Range |
|---|---|---|
| Over current (neutral) | $I_N$ | 115%–250% of Ir |
| Current Unbalance | $I_A$, $I_B$ & $I_C$ | 5%–50% |
| Under Voltage | $V_{A-B}$, $V_{B-C}$ & $V_{C-A}$ | 50%–95% of Vr |
| Voltage Imbalance | $V_{A-B}$, $V_{B-C}$ & $V_{C-A}$ | 5%–50% |
| Over Voltage | $V_{A-B}$, $V_{B-C}$ & $V_{C-A}$ | 105%–125% of Vr |
| Over Reverse Power | Reverse KW | 20–5300 kW |
| Over Frequency | Frequency | 1–12 Hz above nominal |
| Under Frequency | Frequency | 1–12 Hz below nominal |

The Energy Information/Communications microcomputer 222 maintains three logs for reporting significant events: the trip log, the event log and the min/max log. The trip log is a nonvolatile memory which holds the last five trip events that have occurred. The trip log stores the data and time of the event, as well as the data associated with the event. The event log is a volatile memory which holds the ten most recent alarm events, including the start time and date of each event, the end time and date of each event and the data associated with each event. The minimax log holds the minimum and/or maximum energy information values in a volatile memory. The min/max values are time stamped to the nearest second. Examples of the data stored in the min/max log are: current, voltage, VA, watt demand, frequency, crest factor, watts, VARS, power factor, and THD. The data contained in each log is available at the LCD 240. These logs may also be read by the host computer 140 and PC 117. EID 200 also has operation counters to record the number and types of events that occur in the circuit breaker 116. In the present embodiment, three count values are maintained in non-volatile memory by the EID 200: 1) a mechanical count value; 2) an interruption level count value; and 3) a fault count value. The information held by each count value is further described below.

The mechanical count value records the total number of circuit breaker openings, but does not determine the reason the circuit breaker opened. For example, the mechanical count may reflect the number of circuit breaker openings due to electrical overload, the number of fault openings and the number of operator induced openings. The mechanical count may be displayed on LCD 240 through a menu selection. In the present embodiment, the mechanical count and the circuit breaker serial number may be displayed. This count may also be read using the communication ports by the host computer 140 or PC 117. The interruption level count records the number of times the circuit breaker tripped and a respective current range representing the circuit breaker current when the trip occurred.

The number and span of the current ranges may be user selectable or predetermined in the EID software. In the present embodiment, the ranges are preset to: 1) less than 100% of contact rating (CT); 2) 100% to 300% CT; 3) 300% to 600% CT; 4) 600% to 900% CT: and 5) greater than 900% CT. These ranges are exemplary and any suitably appropriate number ranges and range spans may be used. The interruption level count may be displayed on LCD 240 through a menu selection. This count may also be read using the communication ports by the host computer 140 or PC 117. Finally, the fault count value reflects the faults and the number of trips. In the present embodiment the faults are listed by type of protection, such as: 1) overload; 2) short time; 3) instantaneous; and 4) ground fault. The display lists the fault type in one column and the respective fault count in a second column. In addition, the total number of trips due to these faults may also be displayed.

As discussed above, a menu system is used to select and control a variety of display modes, pick-up points, delays, etc. of the EID 200. On startup, the highest level menu selections are displayed. The exemplary selections are: "SYSTEM CONFIG"; "PROTECTIVE"; "METERING"; "COMMUNICATIONS"; "LOGS"; "OPERATIONS"; "SECURITY"; and "VIEW DATA". The main menu of the present invention is shown in FIG. 6A. When the EID 200 has been inactive for approximately five minutes, it enters an idle display mode. The idle display mode may be a blank screen or a cyclic display of informational screens, such as date, time, etc. Pressing any key, such as the ESC 414 key terminates the idle display mode and activates the highest level menu.

The System Configuration menu has selections for Viewing Configuration Information and Frequency, Wiring, PT Rating, Short Circuit Protection, External Neutral Sensor, Time & Date, LCD Contrast, and Breaker Serial Number settings. The Protective menu has selections for the Viewing Protective Settings, and establishing the Long Time, Short Time, Instantaneous, Ground Fault, Alarms and Relay settings. The energy information or metering menu has selections for Metered Data, Demand Configuration and Resetting the Metered Data. Additionally, the Communication menu has selections for Viewing the Communication Configuration, setting ACCESS/EIA-485 baud rate, setting the EMU's ACCESS device address, setting EIA-232 baud rate and Remote Trip/Open enable/disable. The Logs menu has selections for the Event Log, the Trip Log, and the Min-Max Log as well as clearing each of the logs. The Operations menu has selections for Breaker Test and the various counters; mechanical operations, fault by level and faults by type. The Security menu has selections for entering and changing passwords and enabling security. Table VI provides an outline of the menu system hierarchy of the present embodiment as follows.

TABLE VI

System Config
    View Config
        Frequency
        Wiring
        PT Rating
        Short Circuit Prot
        Ext. Neutral Sensor
        Time and Date
        LCD Contrast
        Breaker S/N
Protective
    View Settings
    Long Time
    Short Time
    Instantaneous
    Ground Fault
    Alarms TABLE VI-continued Over Current
        Ground Over Current
        Over Amp Demand
        Total Harmonics
        Over KW
        Over KW Demand
        Over KVAR
        Over KVA
        Under Power Factor Lagging
        Over Power Factor Leading
    Protective Relays
        Neutral Over Current
        Current Unbalance
        Under Voltage
        Voltage Unbalance
        Over Voltage
        Over Reverse Power
        Over Frequency
        Under Frequency
Metering
    Metered Data
        Volts, Amps, Power Factor, and Frequency
        Watts, Volt-Amps Reactive, Volt-Amps, and Crest Factor
        Demand
        Harmonics
            Current Data
            A Current Graphs
            B Current Graphs
            C Current Graphs
            N Current Graphs
        Waveforms
            Phase A Graphs
            Phase B Graphs
            Phase C Graphs
            Phase N Graphs
        Phase Balance
            Voltage Balance
            Current Balance
    Demand Config
    Reset Meter Data
        Energy Registers
        Demand
Communication
    View Communications Configuration
    ACCESS BAUD Rate
    Slave Address
    RS232 BAUD Rate
    Remote Trip/Close
Logs
    View Event Log
        ↑ (Scroll up through Log)
        ↓ (Scroll down through Log)
    Reset Event Log
    View Trip Log
        ↑ (Scroll up through Log)
        ↓ (Scroll down through Log)
    Reset Trip Log
    View Min/Max Log
        Amps and Crest Factor
            Phase A Amps
            Phase B Amps
            Phase C Amps
            Average Phase Amps
            Phase N Amps
            Ground Amps
            Amps Demand
            Phase A Crest Factor
            Phase B Crest Factor
            Phase C Crest Factor
        Volts
            Phase A Volts
            Phase B Volts
            Phase C Volts
            AB Line Volts
            BC Line Volts
            CA Line Volts
            Average Line Volts TABLE VI-continued Power
    Instantaneous Watts
    Instantaneous VARs
    Instantaneous VA
    Watt Demand
    Power Factor and Frequency
        Phase A Power Factor
        Phase B Power Factor
        Phase C Power Factor
        Total Power Factor
        Frequency
    Total Harmonic Distortion
        Phase A THD
        Phase B THD
        Phase C THD
        Neutral THD
    Reset Min/Max Log
Operations
    Breaker Test
    Mechanical Counter
    Interruption Level
    Fault Counter
Security
    Enable Security
    Change Password
    Enter Password
View Data By using the menu system, the user may select and display any number of conditions of the EID 200 in various combinations. For example, the user may select a histogram display of phase frequency harmonics in combination with a voltage signal display. The number and combination of displays is generally limited by the display resolution and the capacity of the display memory.

Referring to FIGS. 6A–6F, a procedure for using the menu system is now described. Once the main menu (FIG. 6A) is displayed (at power on or exit of idle display mode) the operator may press keys 408 and 410 to scroll up and down, respectively, through the available selections to highlight one of the displayed selections. To activate a highlighted selection, the operator presses key 412. For example, from the main menu, if the operator wishes to enter the energy information or metering feature, key 410 may be pressed twice or key 408 may be pressed five times (to scroll from the last displayed selection). Alternatively, keys 410 or 412 may be pressed and held by the operator to allow the highlighted selection to automatically scroll through the selections. The operator releases the depressed key when the desired selection is highlighted by highlight bar 602. Highlight bar 602 may be accomplished, for example, by inverting the selected item, flashing the selected item, or changing the color of the selected item.

FIG. 6B shows the metering menu selected as described above. As is shown in FIG. 6B and in Table V, this menu shows another layer of selections. In this example, "METERED DATA", "DEMAND CONFIG" and "RESET METER DATA" are available. Again, by moving the highlight bar 602 with keys 408 and 410, and selecting with key 412 yet another menu layer may be displayed. Assuming that the operator selected "METERED DATA" then the FIG. 6C menu is displayed. Referring to FIG. 6C, the data display provides "V, A, PF, and Freq", "W, VAR, VA, and CF, Demand, Harmonics, "WAVEFORMS", and "PHASE BALANCE" selections. Once again, by moving the highlight bar 602 with keys 408 and 410 and selecting with key 412, another menu layer or data may be displayed. If the operator selected "DEMAND", the FIG. 6D demand data screen is displayed providing the operator with an alphanumeric display of current and power demand. As mentioned above, waveform data may also be displayed on display 240. In this example, if the operator highlights and selects "WAVEFORMS", the FIG. 6E WAVEFORM GRAPHS menu is displayed. Selecting the "PHASE A GRAPHS" option results in the display of the FIG. 6F waveforms.

As mentioned above, the present embodiment is not limited to displaying singular menu selection data. Multiple waveforms, waveforms and histograms, waveforms and alphanumeric data, histograms and alphanumeric data, etc. may be displayed on display 240 using the appropriate menu selections. Furthermore, the menu selections shown in Table 5 are exemplary and any other appropriate menu hierarchy and selection options may be used depending on system requirements. The menu system may further include a language selection allowing the operator to set the system language to a language other than English, such as, for example: French, German and Italian.

Figure 7A:
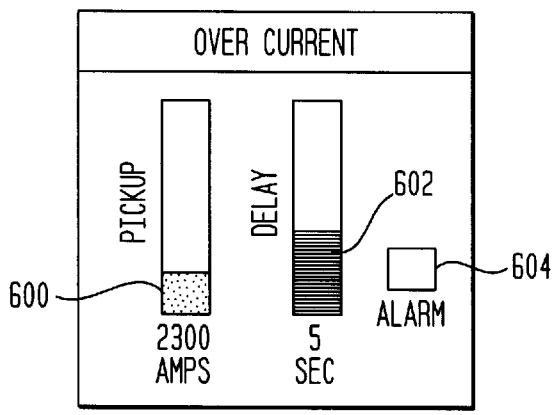
Figure 7B:
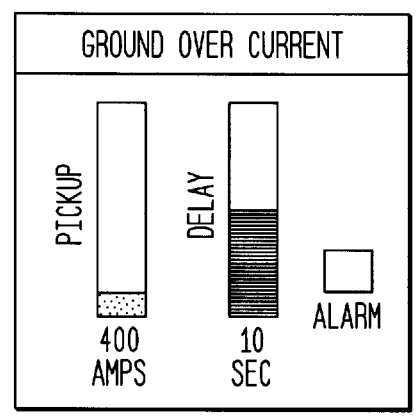
Figure 7C:
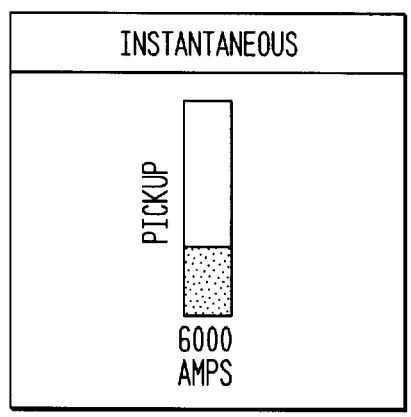
Figure 7D:
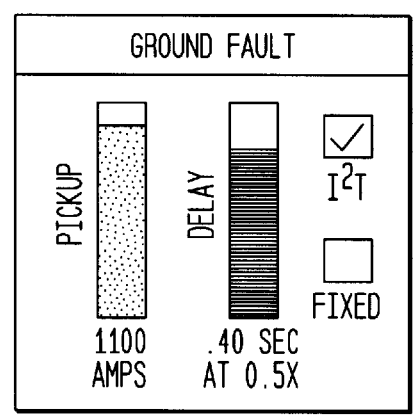
Figure 7E:
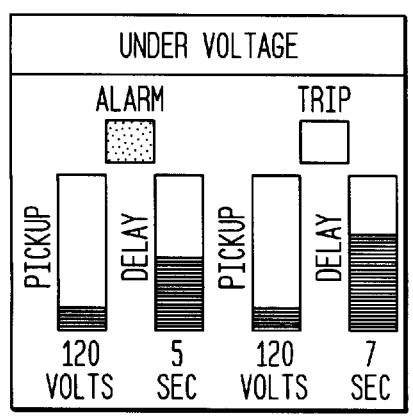
Figure 7F:
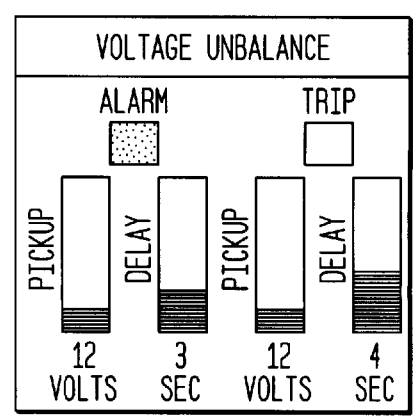

FIGS. 7A–7J further show various display types available to the user for setting a variety of pick-up points and delays, as well as alphanumeric readouts of the circuit breaker conditions. It is understood that FIGS. 7A–7J are exemplary and do not reflect the entire extent to which the present system may be used to set and display parameters of circuit breaker 116. As set forth above, multiple displays such as those shown in FIGS. 7A–7J may be simultaneously displayed on display 240. As shown in FIG. 7A, over current pick-up 700 and delay 702 may be set in a bar graph mode. In addition, an alarm condition may be activated by selecting over current alarm 704. FIGS. 7B–7F show other exemplary settings available in EID 200 through front panel 400. These settings may also be made using the communications ports 246, 248. FIGS. 7G through 7J show alphanumeric displays of the protective configuration, voltage, current and phase conditions, and demand of the EID 200. The information shown in FIGS. 7A to 7J are merely exemplary of the data available to the user.

Security is a concern in any industrial environment. Inadvertent and purposeful interruptions of power to a section of a factory may have severe financial, safety, and other impacts. Furthermore, tampering with the set-points of a programmable circuit breaker may ultimately damage the protected equipment.

The present embodiment is believed to address such concerns by incorporating security features accessible through the menu system. The exemplary security system may be accessed by selecting the SECURITY entry point of the main menu. This allows a user with a valid password to enable or disable the security features, as well as to change the security password. To prevent lockout if the password is lost or forgotten, the security system has a backdoor password which may for example be based on the current date. A password protection system sets a flag when security is active and checks the flag before executing any routine interpreting data from the front panel, except when the front panel data contains the proper password. In addition, the menu based security system will not affect host computer 140 or PC 117 accessibility of the circuit breaker 116. It is contemplated that the resident software in each of the host computer 140 or and PC 117 includes another security system.

Figure 8A:
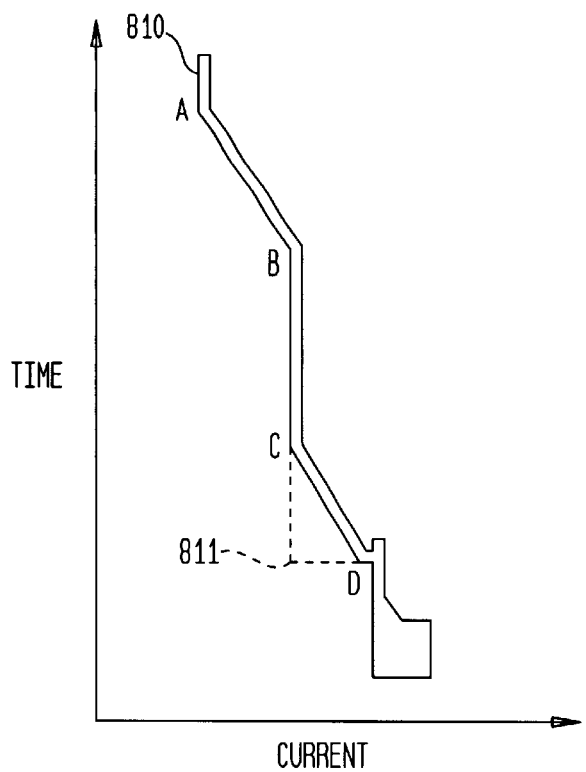
FIGS. 8A and 8B are graphs of current versus time which are useful in describing the operation of the EID of FIG. 2A.
Figure 8B:
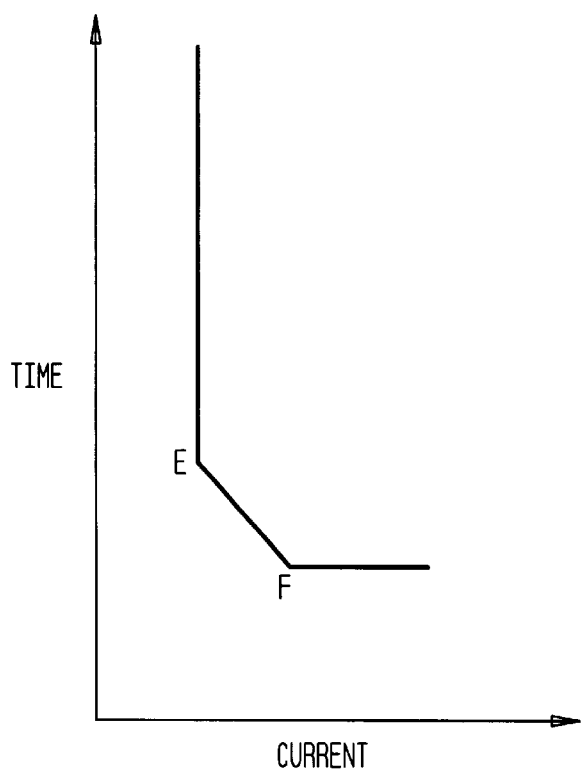

FIG. 8A is a graph of the trip curve 810, and FIG. 8B is a curve illustrating how the ground-fault trip function is implemented on a system that provides a ground sensor input signal to the trip unit. In FIG. 8A, the point A coordinates on the solid-line curve 810 represent the pickup current and delay parameters of the long-time trip setting. The point C coordinates represent pickup current and delay parameters for the short-time trip setting and the point D current coordinate represents the instantaneous trip current. Point B on the curve 810 is determined as the intersection of a fixed slope line, originating at the long-time trip coordinates, and a line drawn vertically from the short-time trip coordinate. This line is referred to as an I$^2$T curve. The sloped line between points C and D is a fixed-slope line originating at the short-time trip coordinates and intersecting ai line drawn vertically from the instantaneous trip coordinate. The broken line 811 illustrates the trip function without this short-time I$^2$T curve. The solid line 810 defines the pickup and trip functions performed by the Protective microprocessor 214. A pickup occurs whenever the current sensed on one of the phases can be mapped onto the curve 810. The circuit breaker 116 is not tripped, however, until after the time delay indicated by the time coordinate of the trip curve at the pickup current value. Finally, the ground fault curve shown in FIG. 8B consists of two points, a variable trip coordinate E, which may be specified by the operator using the front-panel switches 410, 412, 414, and a short-time trip coordinate F which is automatically set to a current that is 1.5 times the specified ground-fault pickup value and a delay of one-half second. The slope between the points E and F is a fixed-slope I$^2$T curve drawn between the variable trip coordinate and the resulting short-time trip coordinate.

Figure 9A:
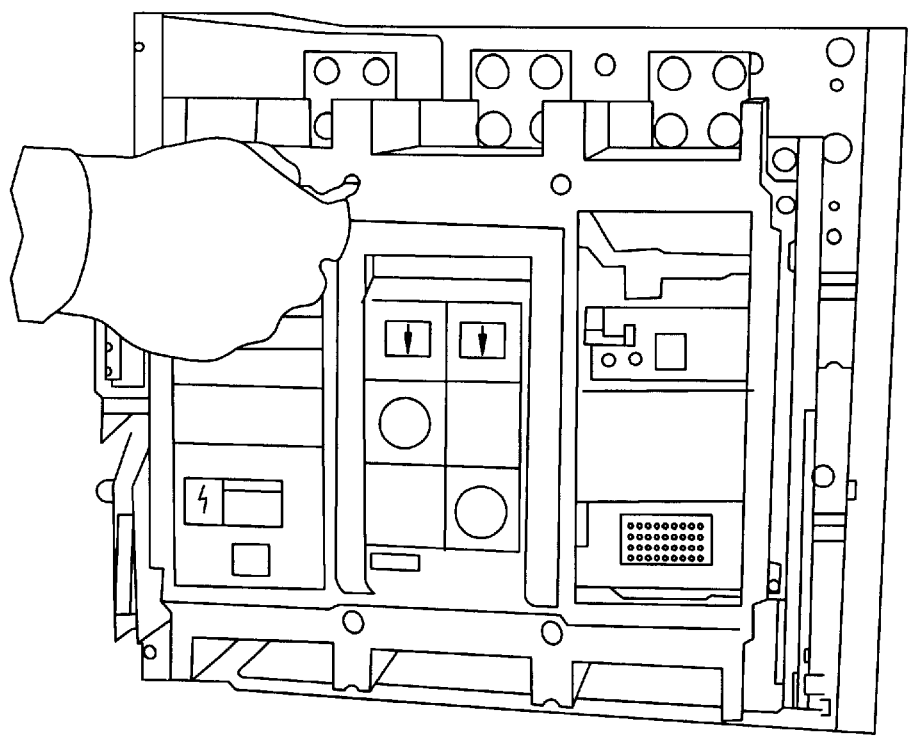
FIGS. 9A, 9B, and 9C are perspective drawings which show the installation of the EID of FIG. 2A in a circuit breaker.
Figure 9B:
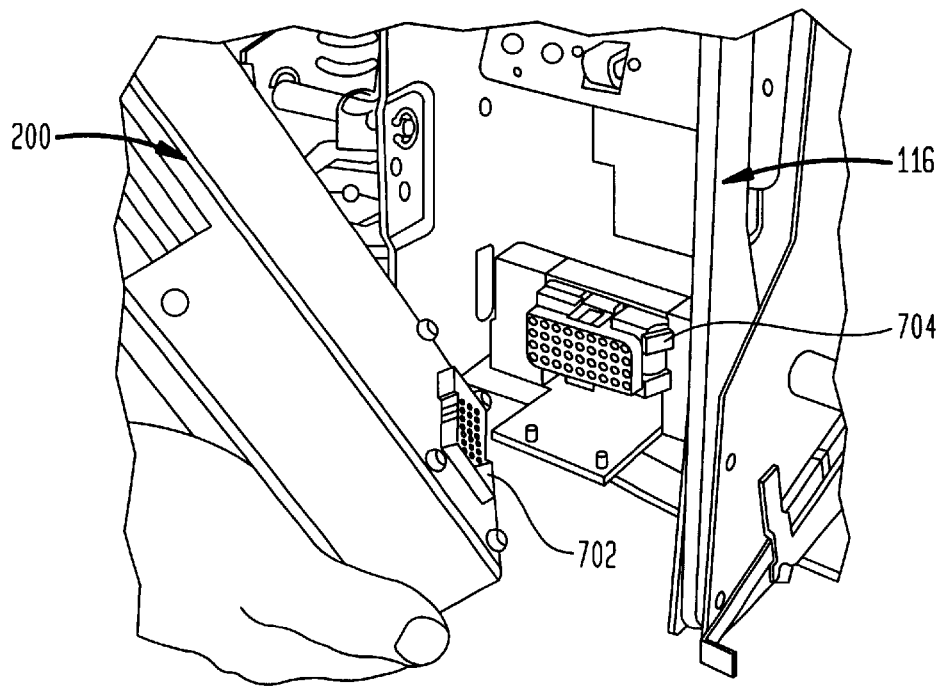
Figure 9C:
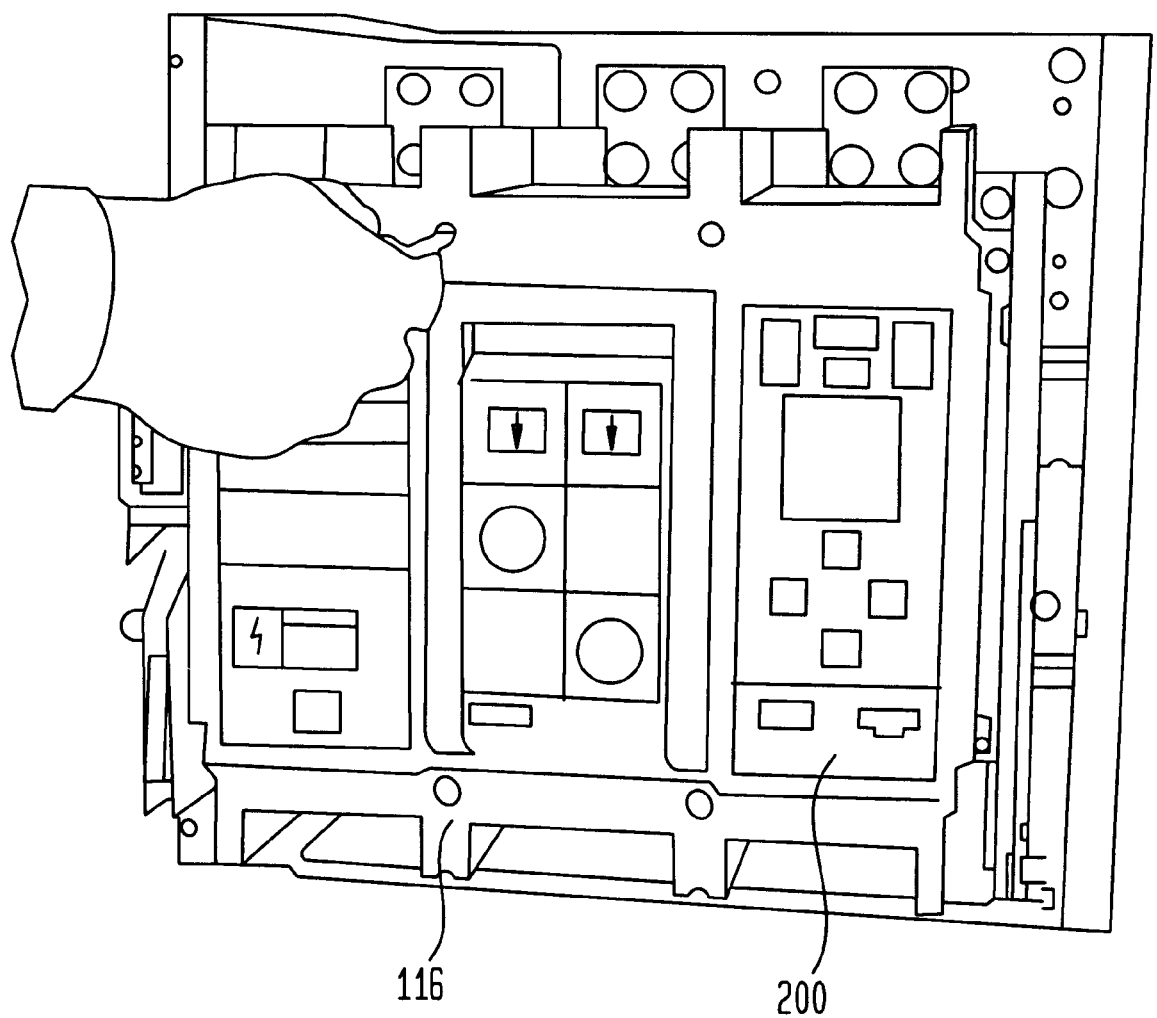

Referring to FIG. 9A, circuit breaker 116 is shown in a relatively simple configuration as installed in the field. As shown in FIG. 9B, circuit breaker 116 may be upgraded in the field by the user by installing EID 200 into circuit breaker 116. A connector 702 in the rear portion of EID 200 mates with a connector 704 of circuit breaker 116. Referring to FIG. 9C, EID 200 is shown installed in circuit breaker 200.

Energy Information/Communications microprocessor 222 uses an interrupt scheme to direct control to components that requiring attention. This interrupt structure and operation are as follows:

For Energy Information/Communications microprocessor 222, each interrupt source, whether internal or external, has an associated Interrupt Level, Interrupt Arbitration Value and Interrupt Vector Value. The Interrupt Level establishes the interrupt priority. The Interrupt Arbitration Value is used by the Energy Information/Communications microprocessor 222 to settle contention between two equal priority interrupts. The Interrupt Vector Number determines which interrupt handler will service the interrupt. It is believed to be preferable to assign Interrupt Levels and Interrupt Arbitration Values for each software module used by Energy Information/Communications microprocessor 222 that will generate interrupts. It is also believed to be preferable to provide a Vector Value for each user defined interrupt. Certain interrupts, such as Reset for example, have pre-defined Interrupt Vector Values.

In the present embodiment, there are seven interrupt levels. In the present embodiment, interrupt level 1 has the lowest priority and interrupt level 7 has the highest priority. Interrupt recognition is based on the states of the interrupt request signals 1 through 7 and the 3-bit interrupt priority (IP) field in the Energy Information/Communications microprocessor 222 Condition Code Register (CCR). Binary values of 000 to 11 provide eight priority masks. All interrupts having priorities less than 7 may be masked (disabled). When the IP field equals 000, no interrupts are masked. Only interrupts with a priority greater than the IP field mask are recognized and processed. During interrupt processing the IP field is set to the priority of the interrupt being serviced. Exception processing for multiple exceptions is done by priority, from highest to lowest. If an interrupt request of equal or lower priority than the current IP mask value is generated, Energy Information/Communications microprocessor 222 does not recognize the interrupt. Therefore, for an interrupt to be serviced it must remain active until acknowledged by Energy Information/Communications microprocessor 222.

Each software module that generates an interrupt has a 4-bit Interrupt Arbitration (IARB) field in its configuration register. These bits may be assigned a value from 0001 (lowest priority) to 1111 (highest priority). A value of 0000 in an IARB field causes Energy Information/Communications microprocessor 222 to process a spurious interrupt exception when an interrupt from that module is recognized. When two or more modules, which have been assigned the same priority level, request interrupt service essentially simultaneously, the IARB fields of the requesting modules are used to determine which interrupt request is recognized. Therefore, each module must have a unique IARB field. If two contending modules have their IARB fields set to the same value, Energy Information/Communications microprocessor 222 may interpret multiple vector values simultaneously with unpredictable consequences. When arbitration is complete, the dominant module supplies an Interrupt Vector Value.

As mentioned above, each interrupt has an associated vector value. The vector value is used to calculate a vector address in a data structure called the Exception Vector Table. An exception is an event, such as an interrupt, that can preempt the normal instruction process. In the present embodiment, the Exception Vector Table is located in the first 512 bytes of Energy Information/Communications microprocessor 222 address space. The Exception Vector Table contains the addresses of the exception (interrupt) handler routines. All vectors except the Reset vector consist of one word (2 bytes). The Reset vector consists of 4 words (8 bytes). There are 52 pre-defined or reserved vector values, and approximately 200 user assignable vector values. There is a direct mapping of vector number to vector table address. Energy Information/Communications microprocessor 222 multiplies the vector value by two to convert it to a vector table address. Table VII is an exemplary Exception Vector Table.

TABLE VII

| VECTOR VALUE | VECTOR TABLE ADDRESS | TYPE OF EXCEPTION |
|---|---|---|
| 00 | 0000-0006 | Reset |
| 04 | 0008 | Breakpoint |
| 05 | 000A | Bus Error |
| 06 | 000C | Software Interrupt |
| 07 | 000E | Illegal Instruction |
| 08 | 0010 | Division by Zero |
| 09-0E | 0012-001C | Unassigned, Reserved |
| 0F | 001E | Uninitialized Interrupt |
| 10 | 0020 | Unassigned, Reserved |
| 11 | 0022 | Level 1 Interrupt Autovector |
| 12 | 0024 | Level 2 Interrupt Autovector |
| 13 | 0026 | Level 3 Interrupt Autovector |
| 14 | 0028 | Level 4 Interrupt Autovector |
| 15 | 002A | Level 5 Interrupt Autovector |
| 16 | 002C | Level 6 Interrupt Autovector |
| 17 | 002E | Level 7 Interrupt Autovector |
| 18 | 0030 | Spurious Interrupt |
| 19-37 | 0032-006E | Unassigned, Reserved |
| 38-FF | 0070-01FE | User Defined Interrupts |

Exception processing may be performed in four distinct phases.

1. The priority of all pending exceptions is evaluated and the highest priority exception is processed first.

2. The processor state is stacked, then the CCR PK extension field is cleared.
3. An Interrupt Vector Value is acquired and converted to a vector table address that is used to select the address of an exception handler routine from the vector table.
4. The address of the selected exception handler routine is loaded into the program counter and the processor jumps to the exception handler routine. All addresses for exception handler routines, except for Reset, are 16-bit addresses. Therefore, it is preferable that the routines be located either within the first 512 bytes of memory or that the vectors point to a jump table.

The present embodiment also uses up to nine external interrupts sources. The external interrupts may be divided into external system interrupts and external device interrupts. The external system interrupts are Reset and Breakpoint. Their Interrupt Vector Values and respective priorities are pre-defined. The external device interrupts are IRQ1 through IRQ7 and are associated with interrupt levels 1 through 7, respectively. As mentioned above, level 1 has the lowest priority and level 7 has the highest priority. In the present embodiment, IRQ1 through IRQ6 are active-low level sensitive inputs, while IRQ7 is an active-low edge sensitive input. Interrupts IRQ1 through IRQ6 are maskable, while IRQ7 is non-maskable. Energy Information/Communications microprocessor 222 treats external interrupt sources as though they are part of the System Integration Module (SIM). Therefore the IARB field in the SIM's configuration register is used to arbitrate between external interrupts and interrupts generated by other internal modules.

When an external device interrupt wins arbitration, a vector value is supplied to invoke the appropriate interrupt handler. The external device that generated the interrupt signal can supply a vector value or Energy Information/Communications microprocessor 222 can supply an autovector number. In the present embodiment, there are 7 autovectors. Each one is associated with an external interrupt. There are five ways the response can be implemented when an external device interrupt wins arbitration, and they are as follows:

1. The external device that generated the interrupt signal can provide Energy Information/Communications microprocessor 222 with the Interrupt Vector Value of an interrupt handler and generate a Data Size Acknowledge (DSACK) response for Energy Information/Communications microprocessor 222. The external device that requested interrupt service decodes the priority value on address lines A1–A3. If the priority value equals that device's priority level, the external device places a vector value on data lines D8 through D15 (if the device is an 8-bit port) or data lines D0 through D7 (if the device is a 16-bit port) and generates the appropriate 8-bit or 16-bit DSACK signal. If the SIM module wins arbitration, the Interrupt Vector Value supplied by the external device is used to select the interrupt handler.

2. The external device that generated the interrupt signal can pull the Autovector (AVEC) input to Energy Information/Communications microprocessor 222 low to request that Energy Information/Communications microprocessor 222 supply the appropriate Autovector value. The external device that requested interrupt service decodes the priority value on address lines A1 through A3. If the priority value equals that device's priority level, the external device asserts the AVEC signal. If the SIM module wins arbitration, the appropriate Autovector value is generated.

3. A chip select pin of Energy Information/Communications microprocessor 222 can be programmed to decode the interrupt acknowledge bus cycle, generate an interrupt acknowledge signal to the external device, and generate a Data Size Acknowledge (DSACK) response for Energy Information/Communications microprocessor 222. Program the appropriate chip select pin assignment register (CSPAR0 or CSPAR1) to configure the chip select to select an 8-bit port (10) or a 16-bit port (11). Program the base address register (CSBAR) of the chip select with a base address field (bit A3 through A15) of all ones. The block size is programmed to no more than about 64K bytes so that the address comparator checks address lines A16 through A19 against the corresponding bits in the base address register. The appropriate chip select options register (CSOR) are programmed as follows:

a. Set the MODE bit to asynchronous mode (0).
   b. Set the BYTE field to lower byte (01) when using a 16 bit port, since the external vector for a 16 bit port is fetched from the lower byte. Set the BYTE field to upper byte (10) when using a 8 bit port.
   c. Set the R/W field to read only (01).
   d. Set the STRB bit to synchronize with AS (0).
   e. Set the DSACK field to the desired number of wait states. Select External (1111) if the external device will generate DSACK signals.
   f. Set the SPACE field to CPU space (00).
   g. Set the IPL field to respond to the desired interrupt request level, or to 000 to respond to all request levels.
   h. Set the AVEC bit to 0 to disable autovector generation.

4. A chip select can be programmed to generate an AVEC response instructing Energy information/Communications microprocessor 222 to supply the appropriate autovector value.

a. Program the appropriate chip select pin assignment register (CSPAR0 or CSPAR1) to configure the chip select pin you have chosen for either discrete output (00) or its alternate function (01). This prevents the pin from being asserted during interrupt acknowledge cycles.
   b. In the base address register (CSBAR) of the chip select pin you have chosen, program the base address field (bit 3 through 15) to all ones. Program the block size to no more than 64K so that the address comparator checks address lines 16 through 19 against the corresponding bills in the base address register. (The CPU places the CPU space type on address lines 16 through 19.)
   c. Program the appropriate chip select options register (CSOR) as follows:
   i. Set the MODE bit to asynchronous mode (0).
   ii. Set the BYTE field to both bytes (11).
   iii. Set the R/W field to read/write (11).
   iv. Set the STRB bit to synchronize with AS (0).
   v. Set the DSACK field to 0 wait (0000).
   vi. Set the space field to Supervisor space (10).
   vii. Set IPL to respond to the desired interrupt request level, or to 000 to respond to all request levels.
   viii. Set the AVEC bit to 1 to enable autovector generation.

5. The Energy Information/Communications microprocessor 222 AVEC pin may be permanently wired low (asserted) to generate the appropriate Autovector value for any external interrupt request that wins arbitration. When the Autovector pin is wired low (asserted) and any external device interrupt wins arbitration, the SIM supplies the Interrupt Vector Value of the Autovector associated with that external interrupt. This is the approach used in the present embodiment.

The System Integration Module (SIM), Queued Serial Module (QSM), and General Purpose Timer module (GPT) may be sources of internal interrupts. The sources of internal SIM interrupts are the Software Interrupt, the Periodic Timer, bus errors, illegal instructions, division by zero, un-initialized interrupts, and spurious interrupts. The OSM can generate interrupts to signal SPI Finished, SCI Transmitting, SCI Transmit Complete, SCI Receive, and SCI Line Idle. The interrupt sources from the GPT are Input Captures 1 through 3, Output Compares 1 through 4, the programmable Input Capture-4 or Output Compare 5, Timer Overflow, Pulse Accumulator Overflow, and Pulse Accumulator Input. To use these internal interrupt sources their respective modules must be configured for interrupts and the individual interrupts must be enabled.

In addition to handling the exemplary nine external interrupts, the SIM has seven interrupt sources and seven interrupt vectors. The Interrupt Vector Values and Interrupt Priority Levels for the Software, Bus Error, Illegal Instruction, Division by Zero, Un-Initialized, and Spurious interrupts are pre-defined in the exemplary embodiment. The Exception Vector Table (Table VI above) has the Interrupt Vector Values of these interrupts. The Interrupt Vector Value and Interrupt Priority Level are user defined for the Periodic Timer interrupt.

To configure the System Integration Module interrupts, the following steps may be used. First, in the SIM Module Configuration Register (SIMCR), set the Interrupt Arbitration field (IARB) to the interrupt arbitration number you have selected for the SIM module. Valid values are from 0001 (lowest priority) to 1111 (highest priority). Second, to use the Periodic Timer interrupt, configure the PIRQL and PIV fields In the Periodic Interrupt Control Register (PICR) by setting the PIRQL field to the selected Interrupt Level. Valid values are from 001 (lowest) to 111 (highest)or by setting the PIV field to the selected Interrupt Vector Number.

The Queued Serial Module consists of the Serial Communications Interface (SCI) and Queued Serial Peripheral Interface (QSPI) sub-systems. In the present embodiment, the SCI has four possible interrupt sources, but only one interrupt vector. The SCI interrupt sources are Transmit Data Register Empty, Transmit Complete, Receive Data Register Full and Idle Line Detected. When the Energy Information/Communication microprocessor 222 responds to an SCI interrupt, the SCI interrupt handler must determine the exact interrupt cause by reading the appropriate bits (TDRE, TC, RDRF, and IDLE) in the SCI Status Register (SCSR). The QSPI has three possible interrupt sources, but only one interrupt vector. These interrupt sources are QSPI Finished, Mode Fault and Halt Acknowledge. When the Energy Information/Communication microprocessor 222 responds to a QSPI interrupt, the OSPI interrupt handler must determine the exact interrupt cause by reading the appropriate bits (SPIF, MODF, and HALTA) in the QSPI Status Register (SPSR). The following steps may be used to configure the Queued Serial Module interrupts.

In the QSM Configuration Register (QMCR), set the IARB field to the interrupt arbitration number you have selected for the QSM module. Valid values are from 0001 (lowest priority) to 1111 (highest priority). In the QSM Interrupt Level Register (QILR), set the ILQSPI field is set to the selected Interrupt Level for the QSPI sub-system and set the ILSCI field to the selected Interrupt Level for the SCI sub-system. Valid values are from 001 (lowest) to 111 (highest). In the QSM Interrupt Vector Register (QIVR), the INTV field is set to the selected Interrupt Vector Number. The low order bit in the INTV field is cleared during an SCI interrupt and set during a QSPI interrupt. In the QSPI Control Register 2 (SPCR2), the SPIFIE bit may be set to enable QSPI interrupts. Finally, in SCI Control Register 1 (SCCR1) the TIE bit is set to enable Transmit Data Register Empty interrupts, the TCIE bit is set to enable Transmit Complete interrupts, the RIE is set to enable Receive Data Register Full interrupts, and the ILIE bit is set to enable Idle Line Detect interrupts.

The General Purpose Timer (GPT) Module consists of the capture/compare unit, the pulse accumulator unit and the pulse-width modulation unit. The GPT has 11 interrupt sources and 12 interrupt vectors. There are 3 Input Capture interrupts, 4 Out Compare interrupts, a programmable Input Capture 4 or Output Compare 5 interrupt, plus the Timer Overflow, Pulse Accumulator Overflow and Pulse Accumulator Input interrupts. Any one of these interrupt sources can be selected (adjusted) to have priority over all other GPT interrupt sources. The Interrupt Vector value for each interrupt source is created by combining a high nibble selected by the programmer, called the Interrupt Vector Base Address (IVBA), and a low nibble supplied by the GPT. Table VIII shows the GPT Source Number and Interrupt Vector Value for each GPT interrupt. The lower the GPT Source Number, the higher the priority of the interrupt.

GPT Interrupt Sources

TABLE VIII

| Interrupt Source | GPT Source Value | Vector Value |
| --- | --- | --- |
| Adjusted Channel | 0000 | IVBA: 0000 |
| Input Capture 1 (IC1) | 0001 | IVBA: 0001 |
| Input Capture 2 (IC2) | 0010 | IVBA: 0010 |
| Input Capture 3 (IC3) | 0011 | IVBA: 0011 |
| Output Compare 1 (OC1) | 0100 | IVBA: 0100 |
| Output Compare 2 (OC2) | 0101 | IVBA: 0101 |
| Output Compare 3 (OC3) | 0110 | IVBA: 0110 |
| Output Compare 4 (OC4) | 0111 | IVBA: 0111 |
| Input Capture 4/Output Compare 5 (IC4/IOC5) | 1000 | IVBA: 1000 |
| Timer Overflow (TO) | 1001 | IVBA: 1001 |
| Pulse Accumulator Overflow (PAOV) | 1010 | IVBA: 1010 |
| Pulse Accumulator Input (PAI) | 1011 | IVBA: 1011 |

The General Purpose Timer Module interrupts may be configured using the following procedure:

In the GPT Configuration Register (GOTMCR), set the IARB field to the interrupt arbitration number selected for the GPT module. Valid values are from 0001 (lowest priority) to 1111 (highest priority). In the GPT Interrupt Configuration Register (ICR) set the following fields: (a) set the interrupt Priority Adjust field (IPA) to the GPT Source Number of the GPT interrupt source you wish the module to give the highest priority; (b) set the Interrupt Priority Level field (IPL) to the selected Interrupt Priority Level of GPT interrupt requests, where valid values are from 000 (lowest) to 111 (highest): (c) set the Interrupt Vector Base Address field (IVBA) to the value of the high nibble of the Interrupt Vector Values the GPT module will use. Also enable the interrupts in the Timer Interrupt Mask Register (TMASK) as follows: (a) set PAII (TMASK, bit 4) to enable the Pulse Accumulator Input interrupt; (b) set PAOVI (TMASK, bit 5) to enable the Pulse Accumulator Overflow interrupt; (c) set TOI (TMASK, bit 7) to enable the Timer Overflow interrupt; (d) set ICI1 (TMASK, bit 8) to enable the Input Capture 1 interrupt; (e) set IC12 (TMASK, bit 9) to enable the Input Capture 2 interrupt; (f) set IC13 (TMASK, bit 10) to enable the Input Capture 3 interrupt; (g) set OCI1 (TMASK, bit 11) to enable the Output Compare 1 interrupt; (h) set OC12

(TMASK, bit 12) to enable the Output Compare 2 interrupt; (i) set OC13 (TMASK, bit 13) to enable the Output Compare 3 interrupt; 0) set OC14 (TMASK<Bit 14) to enable the Output Compare 4 interrupt; (k) set I4/O5I (Tmask, bit 15) to enable the Input Capture 4/Output Compare 5 interrupt. The exemplary interrupt Assignments are listed in Table IX.

TABLE IX

| Interrupt | Module & IARB | Level | Vector | Application |
| --- | --- | --- | --- | --- |
| OC1 | GPT:1111 | 6 | 40 | Initiates A/D conversion |
| IC1 | GPT:1111 | 6 | 41 | Signals A/D conversion complete |
| IC2 | GPT:1111 | 6 | 42 | Signals A/D data ready |
| IC3 | GPT:1111 | 6 | 43 | Trip Clock Signal from Protective $\mu$P |
| IC4 | GPT:1111 | 6 | 48 | Zero crossings for frequency calculation |
| SWI | SIM:1110 | N/A | 6 | Used by $\mu$C/OS for context switching |
| PIT | SIM:1110 | 4 | 60 | Generates the time tick for $\mu$C/OS |
| IRQ4 | SIM:1110 | 4 | 14 | RS-232 UART data transfer |
| SCI | QSM:1101 | 4 | 50 | RS-485 data transfer |
| QSPI | QSM:1101 | 4 | 51 | Protective $\mu$P/Metering $\mu$P data transfer |

Table X list the chip selects of the present embodiment.

TABLE X

| Chip Select | Base Address | Memory Block Size (bytes) | Assert Select On | Device |
| --- | --- | --- | --- | --- |
| Boot ROM | 0000h | | Reads | External EPROM select (high & low bytes) |
| 0 | | 256K | | not used |
| 1 | | | | not used |
| 2 | 60000h | 64K | Reads & Writes | External RAM select (high byte) |
| 3 | 60000h | 64K | Reads & Writes | External RAM select (low byte) |
| 4 | n/a | n/a | n/a | Port Bit used as LCD CS |
| 5 | 7D800h | 2K | Reads & Writes | LCD |
| 6 | 7E800h | 2K | Reads & Writes | A/D Converters |
| 7 | 7E000h | 2K | Writes | LCD Contrast Latch |
| 8 | 7F000h | 2K | Reads & Writes | RS-232 UART |
| 9 | 7F800h | 2K | Reads & Writes | Real Time Clock |
| 10 | 7F800h | 2K | Reads | Real Time Clock (output enable) |

Operating System of the Present Embodiment

All of the features described above for the Energy Information/Communications microprocessor 222 are implemented through a preemptive multi-tasking real-time program which controls microcomputer operation. In a multitasking scheme, the program is divided into blocks called tasks, each of which is written as though it has exclusive access to the processors time. The operating system is capable of directing the processor from one task to another (this is called context switching), and manages task execution on a priority basis. Task execution management is called scheduling, and the part of the operating system that does it is called a scheduler.

A preemptive multitasking system is one that is capable of interrupting a task before it has run to completion whenever a higher priority task is ready to run. The higher priority task preempts the lower priority task, and when it has finished or is suspended, the kernel returns control to the lower priority task. A multitasking approach is believed to have the following advantages: (1) tasks are scheduled according to their relative priorities since the operating system always schedules the highest priority task that is ready to run;(2) tasks that are not ready to run—those that are waiting for an event to occur—are dormant and do not consume processor time; and(3) tasks can be activated and deactivated as required for dynamic resource allocation. The program of the present embodiment consists of a main or background task and several interrupt handlers or foreground tasks. The main program uses sample values taken in response to a periodic interrupt and performs the calculations needed to generate the various monitoring values. The sampling interrupt routine samples all of the voltage and current signals over a one-second interval, squares the sample values and accumulates a sum of squares for use by the foreground task. Other interrupt handlers perform functions such as receiving communications packets from the host processor 140 and PC 117.

Each task is a section of code that performs a portion of the work of EID 200. Each task is assigned a priority, its own stack area. The respective stack area contains the task's stack and the state of the CPU registers at the time a context switch causes the task to become dormant. Exemplary tasks are described below. The software of the present embodiment is designed to be preemptive multitasking rather than loop controlled.

The scheduler determines when tasks will be executed. A Task is allowed to run until:(1) the task readies another task of higher priority;(2) an OS clock tick passes control to a higher priority task that is ready to run;(3) an interrupt service routine readies another task of higher priority; or(4) the task explicitly relinquishes control of the CPU by calling a time delay function. A task's CPU register set and its stack area is known as its context. When the scheduler decides to run a different task, it saves the context of the current task and retrieves the context of the task to be executed.

Preempting involves suspending a task to execute a higher priority task that has been prepared to run. An advantage of a preemptive system is that it is deterministic, since it can be determined when the highest priority task gets control of the Energy Information/Communications microprocessor 222. The exemplary embodiment uses a preemptive operating system. In a preemptive system, operations that are called by more than one task must be reentrant. A reentrant feature or operation can be interrupted at any time and resumed at a later time without data corruption. Reentrant operations must use only CPU registers and stack variables, or must disable interrupts when accessing global variable.

With respect to the keypad, the program polls for a key press using a periodic interrupt generated by the Programmable Interrupt Timer (PIT) as a keypad poll control time base. Once a key press has been confirmed, the function Set_Key_Flag is called, which validates the key press and queues the key press into the keypad buffer. The keypad task is then activated four (4) times a second. When activated the Keypad Task checks the keypad buffer, extracts any pending key press value from the keypad buffer and makes it available to the menu software. In this way, several key presses can be queued and acted upon as time permits. In addition, if a key is held down, the key press will be reentered into the queue at a predetermined rate.

As mentioned above, the Energy Information/Communications microprocessor 222 is connected to the Protective microprocessor 214 using the Serial Peripheral Interface (SPI) 258. The SPI data is sent in 32 byte packets. Each SPI packet contains a message type byte, a data length byte, 29 data bytes and an LRC (longitudinal redundancy check) byte. The SPI packet is arranged as follows: |MESSAGE TYPE|DATA LENGTH|DATA|LRC|. The MESSAGE TYPE byte indicates the type of data the packet contains. The DATA LENGTH byte indicates the number of bytes in the data field that contain valid data. The DATA bytes are the data that is being transmitted. The LRC byte contains the least significant byte of the sum of the message type, data length, and data bytes.

The SCI subsystem handles communication with the ACCESS master if circuit breaker 116 is part of an ACCESS system. In the present embodiment, this communication consists of uploading data and downloading settings. The uploaded data may consist of the breaker settings, status and current data plus the Protective microprocessor 214 and Energy Information/Communications microprocessor 222 settings, status and energy information data available from the Protective microprocessor 214 and Energy Information/Communications microprocessor 222. The circuit breaker and metering settings can be selected remotely and downloaded to circuit breaker 116. In the present embodiment, the ACCESS protocol operates on a serial, two-wire RS-485 network consisting of a single-bus master and up to 32 slave devices. The serial transmission format is asynchronous with one start bit, eight data bits, one stop bit and no parity. The data rate can range from 1,200 to 19,200 baud. A master device initiates all communication by sending a packet addressed to a slave device. The slave device responds with a packet if a response is required. No slave device initiates communication. Any data that does not meet the timing or structural requirements of the ACCESS protocol is ignored by all devices. Data in ACCESS format is sent in packets containing from 5 to 260 bytes, for example.

These packets are defined by framing bytes contained in their headers. These consist of a synchronization byte, an address byte, a message-type byte, a length byte (packets.data field length) and a LRC byte. The SCI packet is arranged as follows: |SYNC|DEVT|MSGT|LEN|DATA|LRC|.

The SYNC byte indicates the direction of the data transmission. Fourteen (14) hex is used for master to slave transmissions and twenty-seven hex is used for slave to master transmissions. The DEVT byte contains the address code for a specific device (direct addressing)or a general type of device (indirect addressing). The MSGT byte indicates what type of data the packet contains.

The LEN byte indicates the number of bytes in the data field. The DATA bytes are the data that is being transmitted. This field can contain up to 225 bytes. With indirect addressing, the first byte in this field is the device address. Finally, the LRC is the checksum byte. It contains the inverted sum of all the bytes except the SYNC byte. The UART handles EIA-232 communications with a locally connected IBM PC or other personal computer. This communication consists of uploading data and down loading settings. The uploaded data consists of the circuit breaker settings, status and current data plus the metering or energy information settings status and data. The circuit breaker and energy information settings can be selected from the PC and down loaded to the trip unit.

Timekeeping is performed by a real time clock 234 (RTC). The RTC 234 registers are memory-mapped I/O. They include six 8-bit time/date registers plus an 8bit command register. When reading or writing the time/date registers, a 0 is written to the TE Bit of the command register to freeze the time and date. This allows the data to be accessed without an essentially simultaneous update. This does not affect timekeeping because the RTC 234 contains internal and external time/date registers. The external registers are frozen and during a read or a write access. After the read or write, a 1 is written to the TE bit to allow the external time/date registers to be updated again. The RTC 234 is read once each second and the new date and time information is stored in the RAM 236. This information can then be accessed by any function, such as the Event Log, that has need of the date and time.

The hardware allows sampling of the voltage and current one phase at a time. The sampling process is interrupt driven, which allows the sampling to run in the background while other tasks run in the foreground. Analog-to-Digital conversion is managed by two General Purpose Timer interrupts and their associated service routines. The interrupts are Output Compare One (OC1) and Input Capture One (IC1). When the Energy Information module needs a new sample data set for a phase, OC1 is used to start each A/D conversion. The Energy Information module uses the calculated line frequency to determine the period needed between OC1 interrupts to give exactly 64 interrupts per cycle. It then asynchronously schedules the first OC1 interrupt. The OC1 interrupt service request (ISR) reads ADC 232A, and 232B to start a conversion and then the next OC1 interrupt. While it is believed to be preferable to start the conversions at essentially the same time, since both ADC 232*a* and 232B cannot be read at the same time due to bus contention, they may be read consecutively. In the present embodiment, the voltage conversion starts 2.026 $\mu$s or 0.04 degrees (at 60 Hz) after the current conversion.

The IC1 interrupt is activated when both ADC 232A and 232B complete their respective conversions. Energy Information/Communications microprocessor 222 retrieves the result of the A/D conversions, converts the raw voltage and current data into signed data and stores the result in RAM 236. When 384 voltage and current samples have been acquired (64 samples×6 cycles), Energy Information/Communications microprocessor 222 de-activates the OC1 interrupt and activates the Energy Information task. Thus, informing the Energy Information task that the voltage and current data sets for a particular phase are ready for processing.

When sampling phase A, the IC4 interrupt is enabled so that a zero crossing of the voltage signal for phase A causes an interrupt. When the zero crossing interrupt occurs, the value of the free running timer/counter TCNT is stored in an array. Once a second, the zero crossing array is used by a routine to determine the frequency. This routine calculates the average difference between all of the TCNT values stored in the array during sampling. This average TCNT delta and the TCNT period are used to calculate the line frequency for phase A using the formula shown below. Where System Clock Frequency=16.777 Mhz, TCNT Frequency=4.194 Mhz (System Clock 14), TCNT Period= 238 nSec, and $$Line\_Frequency = \frac{1}{2 \times Average\_TCNT\_Delta \times TCNT\_Period.}$$

If a phase A voltage signal is not available, the frequency is set to the programmed system frequency, 50 or 60 Hz. The Output Compare 1 (OC1) interrupt is used to start each A/D conversion for sample acquisition. The occurrence of this interrupt is determined by the value stored in the Timer Output Compare 1 register (TOC1). When the free running timer/counter TCNT equals the value in the TOC1 register, an asynchronous OC1 interrupt occurs.

Therefore, the sampling rate can be changed by modifying the value loaded in TOC1. For the FFT algorithm used for harmonic calculation to obtain sufficiently accurate results, it is desirable to take at least about 64 samples over one cycle. Therefore, the sample period is based on the line frequency determined from the phase A voltage signal. The following equations are used to calculate the offset to be added to TCNT and stored in the TOC1 register to correctly schedule the next OC1 interrupt, where:

$$OC1\_Offset = \frac{1}{Line\_Frequency \times TCNT\_Period \times Samples\_per\_Cycle}$$

and $TOC1 = TCNT + OC1\_Offset$.

Once each second the operating system activates a task to initiate sampling.

This task takes the line frequency based on the data collected by the IC4 interrupt routine. It then calculates the new offset to be used by OC1 in scheduling sampling interrupts and initiates the sampling of phase A voltage and current. Sampling continues for the next six cycles for a total of 384 samples (6×64). Each time a conversion is completed, the A/D converters activate the IC1 interrupt line. The IC1 interrupt service routine reads the conversion results and stores them. When an entire data set of 384 voltage and current samples is acquired, the IC1 ISR informs the operating system that the data is ready. When the operating system is informed the phase A data is ready, it activates the energy information task. The energy information task initiates the sampling of phase B and then processes the phase A data. An exemplary method for sampling current and voltage signals is shown in Table XI and an exemplary data memory requirement is shown in TABLE XII.

TABLE XI

| Phase Sampled | Task | Samples Taken | Sample Freq. | Start A/D Interrupt | Read A/D Interrupt |
|---|---|---|---|---|---|
| A | Initiate Sampling | 384 | 64/cycle | OC1 | ICI |
| B | Meter | 384 | 64/cycle | OC1 | ICI |
| C | Meter | 384 | 64/cycle | OC1 | ICI |
| N | Meter | 384 | 64/cycle | OC1 | ICI |

The sequence of events listed in the table will occur once each second. Six cycles will be sampled at 64 times per cycle. When a complete set of data for a phase has been acquired, the IC1 ISR "posts" the operating system to signal that the data set is ready for processing. For both current and voltage data, each sample requires 2 bytes of memory.

TABLE XII

| Source | Data Type | Bytes |
|---|---|---|
| Voltage A/D | Voltage | 768 |
| Current A/D | Current | 768 |
| Voltage Samples | Sum of Squared Voltage Samples | 4 |
| Current Samples | Sum of Squared Current Samples | 4 |
| | Total | 1544 |

Figure 11A:
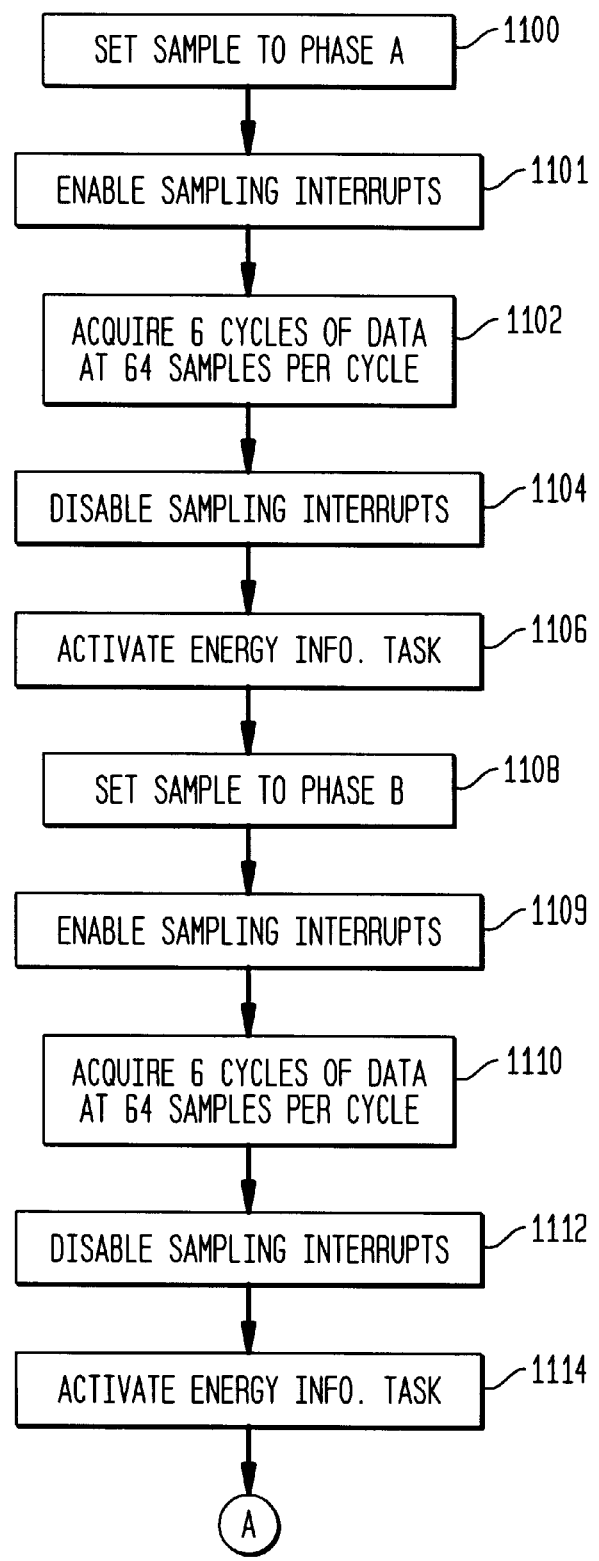
FIGS. 11A and 11B are flow charts outlining an exemplary Sampling Task of the present invention.
Figure 11B:
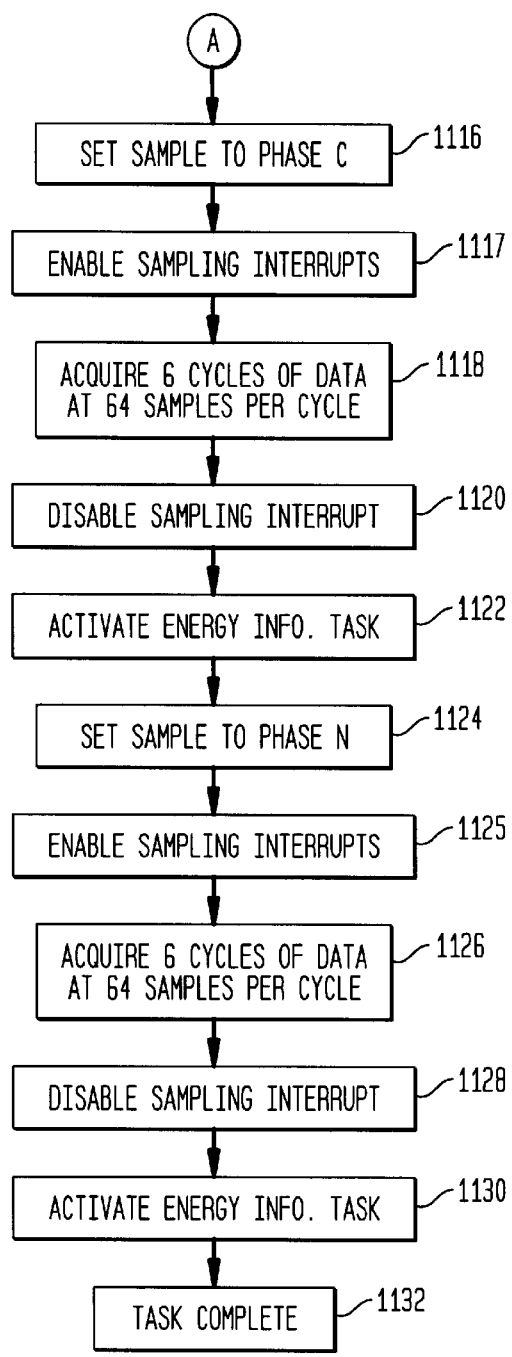

FIGS. 11A–11B are flowcharts outlining the ADC Sampling Interrupt. The ADC sampling interrupt maintains proper timing of the Energy Information Task (described below). A timer interrupt is used to select the phase to be sampled and set the sampling time interval. Sampling occurs 64 times per cycle based on the frequency calculation from the previous second. Whenever the frequency is unknown, the frequency is less than 35 Hz, or greater than 75 Hz, the sampling time interval is based on a selected system frequency. In the present embodiment, the selected system frequency is 50 Hz or 60 Hz.

It is believed that using a sampling rate of 64 samples per cycle enables faster harmonics calculations. As is well known, for the harmonics calculations to be sufficiently accurate, the determined frequency is used. Because the frequency is calculated from Phase A voltage samples in the present embodiment, if Phase A is non-functional and the other phases are at frequencies other than the programmed system frequency, the accuracy of the energy information data may not be sufficient.

Referring to FIG. 11A, at Step 1100, the Initiate Sampling Task (described below) starts the sampling of Phase A. At Step 1101, sampling interrupts are enabled. At Step 1102, ADC 232A, 232B acquire the data from 6 cycles of voltage and current, respectively, at 64 samples per cycle for phase A. At Step 1104, sampling interrupts are disabled. At Step 1106, Energy Information/Communications microprocessor 222 activates the Energy Information Task (described below). At Step 1108, the Energy Information Task changes the sampling to Phase B. At Step 1109, sampling interrupts are again enabled. At Step 1110, ADC 232A, 232B acquire the data from 6 cycles of voltage and current at 64 samples per cycle for Phase B. At Step 1112, sampling interrupts are disabled. At Step 1114, Energy Information/Communications microprocessor 222 activates the Energy Information Task.

Figure 12:
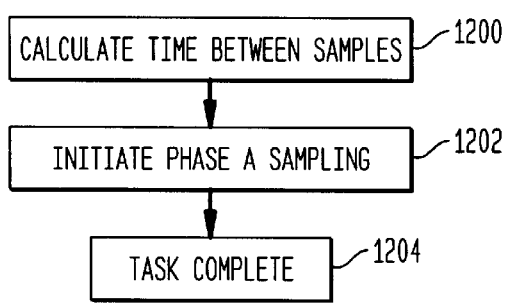
FIG. 12 is a flow chart outlining an exemplary Initiate Sampling Task of the present invention.

Referring now to FIG. 11B, the Energy Information Task changes the sampling to Phase C at Step 1116. At Step 1117, sampling interrupts are enabled. At Step 1118, ADC 232A, 232B acquire the data from 6 cycles of voltage and current at 64 samples per cycle for Phase C. At Step 1120, sampling interrupts are disabled. At Step 1122, Energy Information/Communications microprocessor 222 activates the Energy Information Task. At Step 1124, the Energy Information Task changes the sampling to Phase N. At Step 1125, sampling interrupts are enabled. At Step 1126, ADC 232A, 2328 acquire the data from 6 cycles of voltage and current at 64 samples per cycle for Phase N. At Step 1128, sampling interrupts are disabled. At Step 1130, Energy Information/Communications microprocessor 222 activates the Energy Information Task. At Step 1132, the ADC sampling task is complete. The ADC 232A, 232B will not be started again until the Initiate Sampling Task is subsequently activated FIG. 12 is a flowchart showing the Initiate Sampling Task, which updates the Energy Information Task once per second. Once a second the Initiate Sampling Task is activated using an operating system time delay. Once activated, this task calculates the sampling time interval that will be used for the current one second time interval based on the frequency that was calculated during the previous one second time interval. The sampling time interval is set such that the voltage and current will be sampled 64 times per cycle. The sampling that occurs immediately after EID 200 is activated is calculated based on the selected system frequency. As mentioned above, in the exemplary embodiment, if the calculated frequency is less than 35 Hz or greater than 75 Hz, the selected system frequency is used to determine the sampling time interval. The Initiate Sampling Task is activated after the Energy Information Task completes the processing of the Phase N samples. This ensures that all of the per second energy information tasks are complete. Referring to FIG. 12, the Initiate Sampling Task is shown. At Step 1200, the time between samples for a 64 sample per cycle sampling rate is calculated. At Step 1202, ADC 232A, 232B sampling for Phase A is initiated At Step 1204, the task is completed and awaits subsequent activation.

Figure 13A:
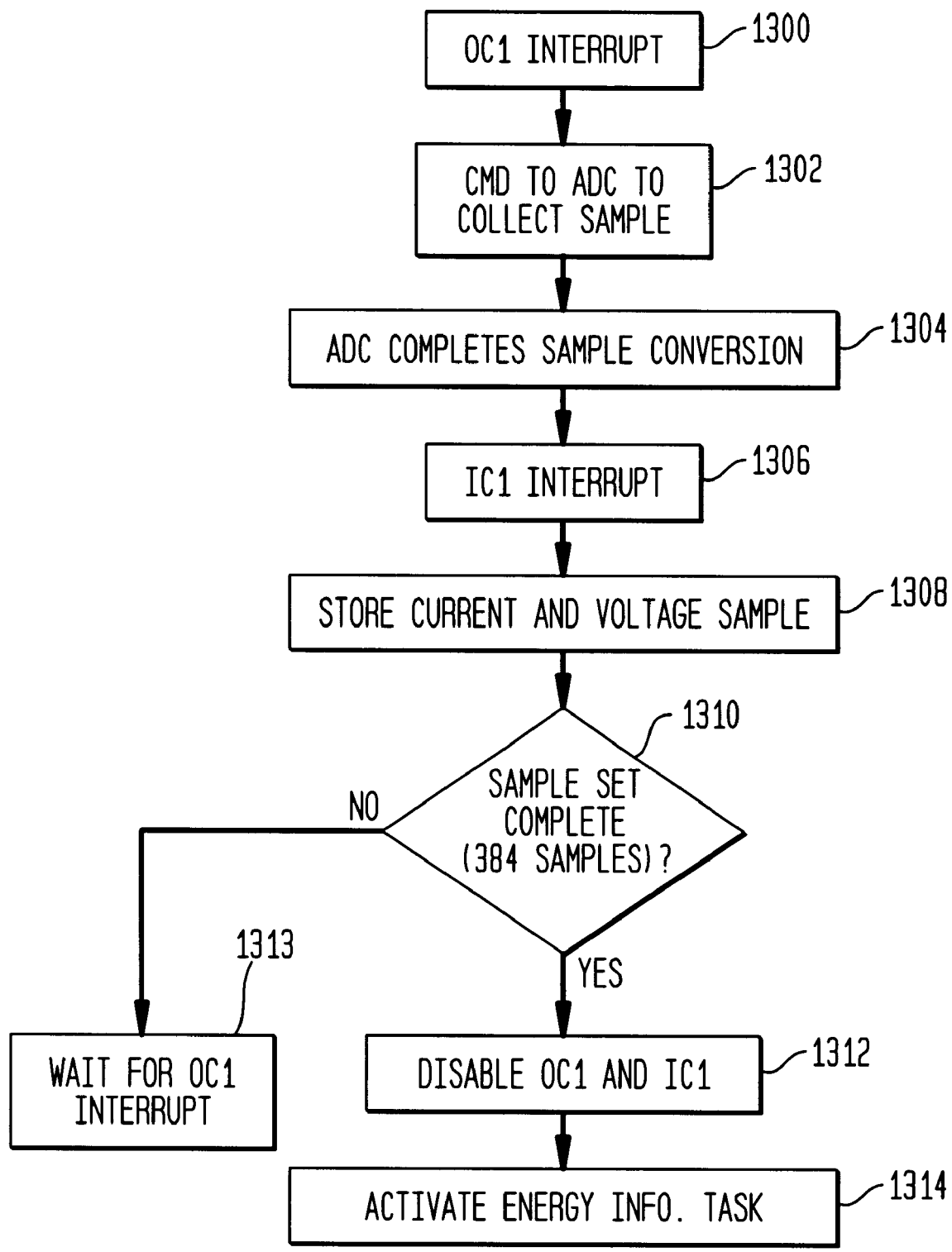
FIGS. 13A, 13B, and 13C are flow charts outlining an exemplary Meter Task of the present invention.
Figure 13B:
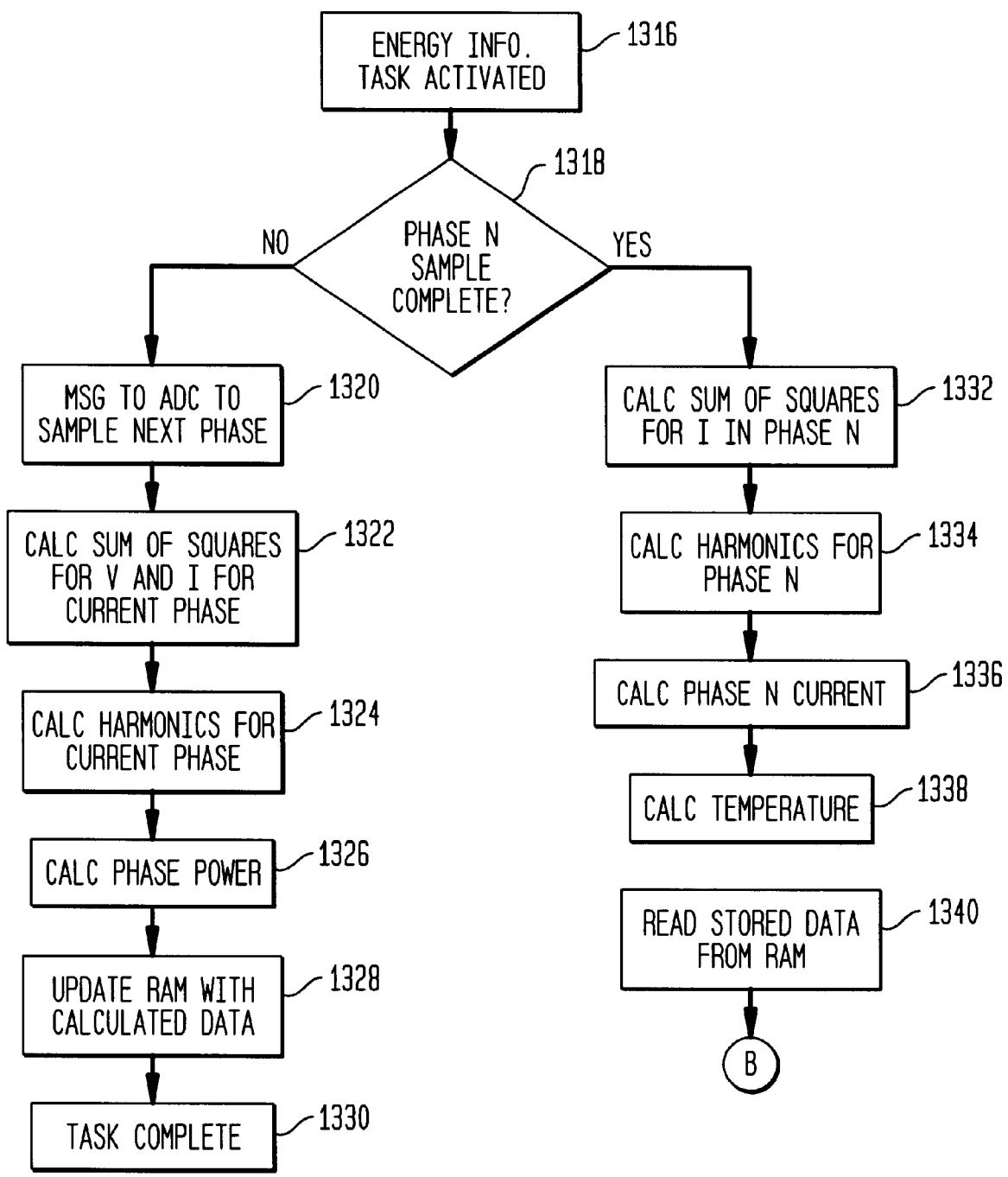
Figure 13C:
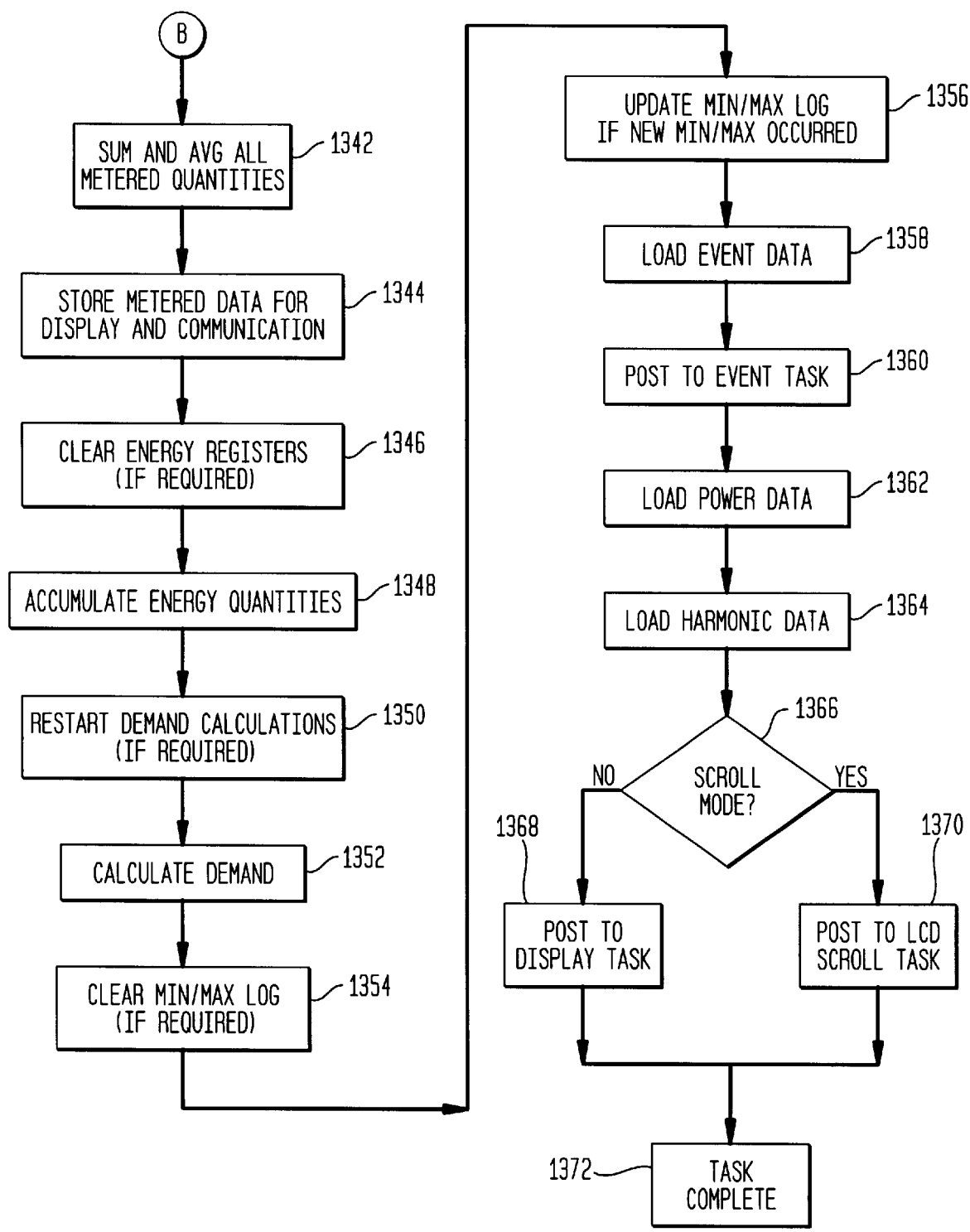

FIGS. 13A to 13C are flowcharts showing the Energy Information Task. The Energy Information Task has what are believed to be the most stringent timing constraints of any of the tasks in EID 200 because of the number of calculations that are performed every second. In the exemplary embodiment, the Energy Information Task uses approximately 500 to 600 ms of every 1000 ms process cycle. The Energy Information task does not occupy a contiguous portion of the 500 to 600 ms time, however, so that other tasks may be serviced without creating data latency problems and associated inaccuracies. In the present embodiment, it is believed that a significant and even a majority portion of time are allotted to the energy information harmonics task. This task is estimated to require approximately 90 ms per phase. In the present embodiment, the Energy Information Task is activated 4 times per second as a result of ADC signal 233 (FIG. 2C) indicating that ADC 232A, 232B has finished sampling a phase. To facilitate RMS computations, the system preferably uses the square root techniques of co-pending and commonly assigned case U.S. patent application Ser. No. 08/625,489, which is entitled "Fractional Precision Integer Square Root Processor And Method For Use With Electronic Circuit Breaker Systems," and which is incorporated by reference.

The energy information code essentially consists of two parts. The Energy Information task which operates in the foreground, and OC1/IC1 interrupt service routines which operate in the background. The background code (ISRs) collect the samples for the next phase while the foreground code (meter task) manipulates the samples collected for the last sampled phase. The background code is illustrated in FIG. 13A and the foreground code is illustrated in FIGS. 13B–13C.

Referring to FIG. 13A, at Step 1300 and OC1 interrupt occurs to activate the background sampling task. At Step 1302, a command is sent to ADC 232A, 232B to collect a sample. At Step 1304, ADC 232A, 232B collects a current and a voltage sample, respectively, for the currently sampled phase. At Step 1306, an IC1 interrupt is generated. At Step 1308, the current and voltage samples are stored. At Step 1310, a determination is made as to whether the sample set is complete, i.e., have 384 samples been taken. If the sample set is complete Step 1312 is entered, otherwise the task waits for another OC1 interrupt at Step 1313. Once 384 samples are collected, Step 1312 disables the OC1 and IC1 interrupts. At Step 1314, the Energy Information task is activated.

Referring to FIG. 13B, the foreground Energy Information task is outlined. At Step 1316 the Energy Information task is activated when the IC1 interrupt service routine determines a complete set of phase samples has been collected. At Step 1318, a determination is made as to which Phase was most recently sampled. If Phase N was most recently sampled the process continues at Step 1332, otherwise Step 1320 is executed. At Step 1320, ADC 232A, 232B is instructed to begin sampling the next phase. At Step 1322, the sum of squares for the current and voltage of the most recently sampled Phase is calculated. At Step 1324, the harmonics most recently sampled Phase is calculated. At Step 1326, the power of the most recently sampled Phase is calculated. At Step 1328, RAM 236 is updated with the data calculated in Steps 1322 through 1326. At Step 1330, the task is completed.

As mentioned above, if Step 1318 determines that the most recently sampled phase was Phase N, Step 1332 is entered. At Step 1332, the sum of the squares of the current samples of Phase N are calculated. At Step 1334,1 the harmonics of Phase N amps are calculated. At Step 1336, the phase current for Phase N is calculated. At Step 1338, the temperature of EID 200 is calculated. At Step 1340, the data stored in RAM 236 at Step 1328 for each of Phase A, B, and C is read.

Referring to FIG. 13C, at Step 1342 the data read from RAM 236 at Step 1340 is used to calculate the sums and averages to generate the metered quantities for display on LCD 24. At Step 1344, the data is stored and becomes available for display and communication. At Step 1346, the energy registers are cleared if necessary. At Step 1348, the energy quantities are accumulated. At Step 1350, the demand calculations are restarted if necessary. At Step 1352, the demand is calculated. At Step 1354, the minimax log is cleared if necessary. At Step 1356, the min/max log is updated if a new min/max event occurred. At Step 1358, event data is loaded and at Step 1360, the Event Task is posted to run at the next available processing slot. At Step 1362, the power data is loaded and at Step 1364, the harmonic data is loaded. At Step 1366, a determination is made as to whether the display is in the scroll mode. If display is in the scroll mode, Step 1370 is entered and the LCD Scroll Task is posted to run. Otherwise, Step 1368 is entered and the Display Task is posted to run. After one or the other is posted, Step 1372 is entered and the Meter Task is complete.

Figure 14A:
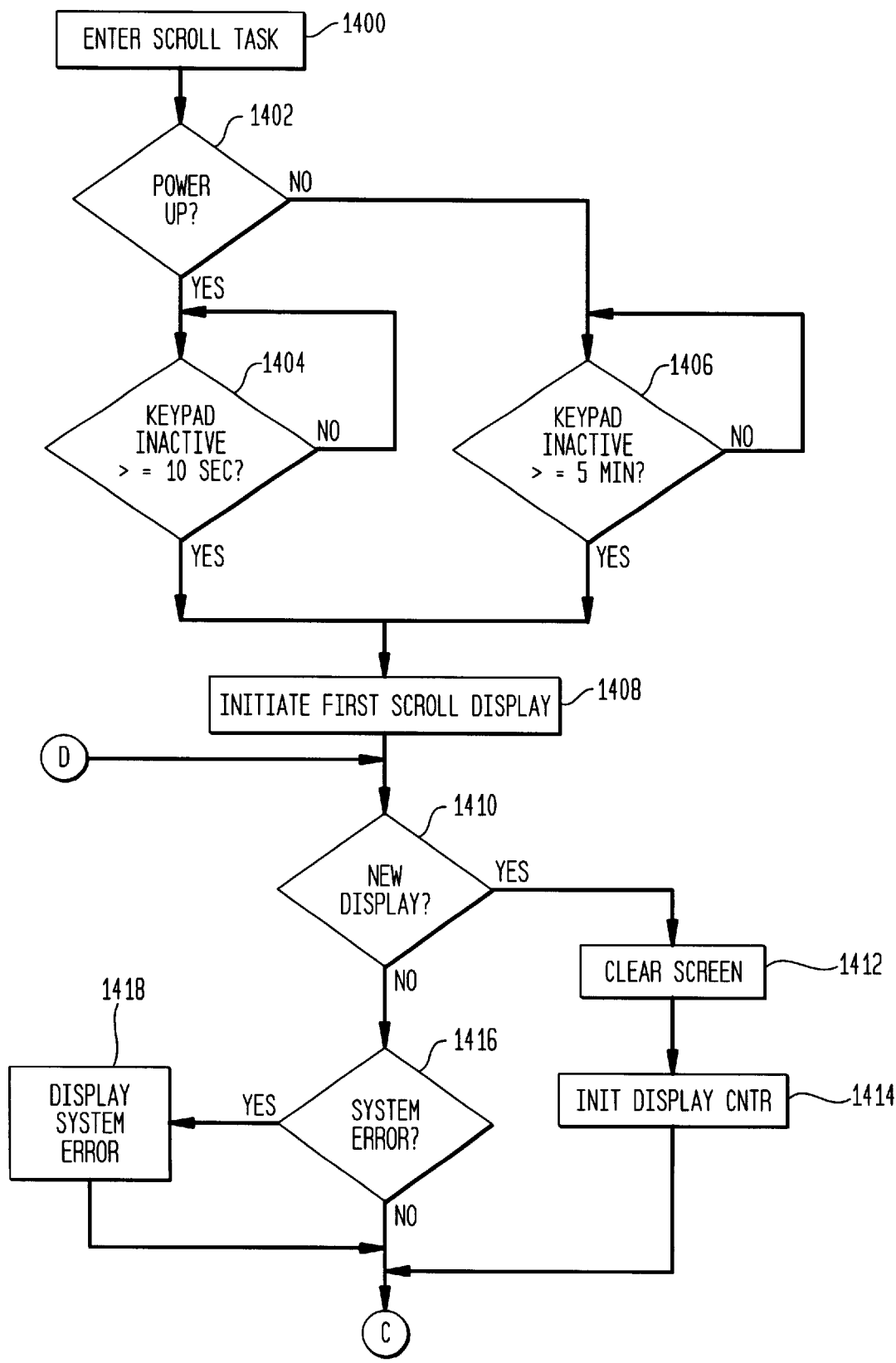
FIGS. 14A and 14B are flow charts outlining an exemplary LCD Scroll Task of the present invention.
Figure 14B:
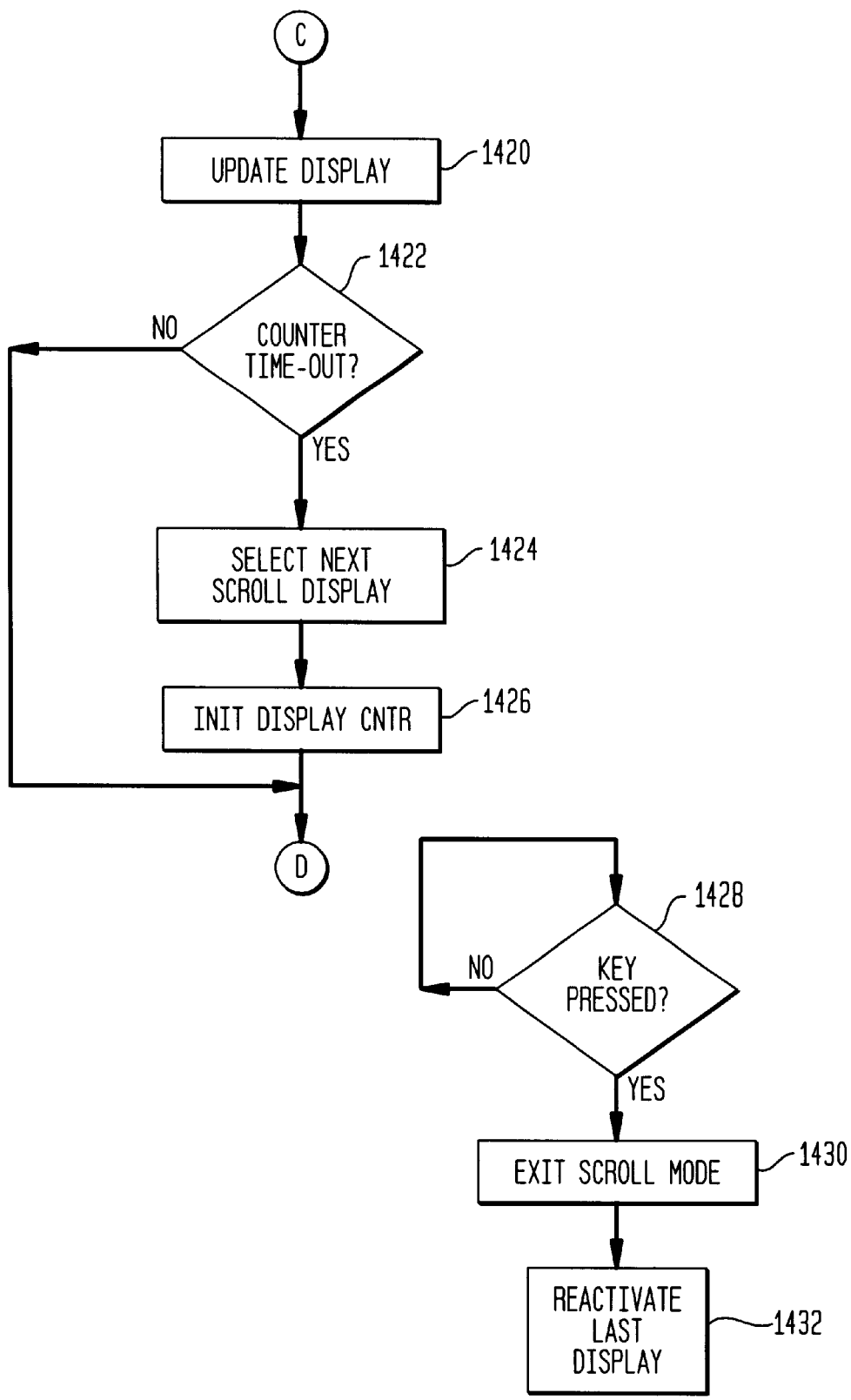

FIGS. 14A and 14B are flowcharts showing the LCD Scroll Task. The LCD Scroll Task (when in LCD scrolling mode) works in conjunction with the Display Task (when in fixed LCD mode) to provide information to LCD 240. The Energy Information Task activates the LCD Scroll Task once a second when the scrolling mode is active. In the present embodiment, four fixed LCD displays have been selected for display on LCD 240 while LCD 240 is scrolling. When the LCD 240 is in the scrolling mode a display will remain on the LCD 240 for approximately seven seconds. LCD 240 will then be changed to the next display in the scrolling list.

Referring to FIG. 14A, two ways are illustrated to enter the scrolling mode. At Step 1400, the scroll task is entered. At Step 1402, if power on is detected Step 1404 is entered, otherwise step 1406 is entered. At Step 1404, a determination is made if the keypad has been inactive for 10 seconds after power up. If this determination is satisfied the scrolling mode is entered at Step 1408. At Step 1406, a determination is made if the keypad has been inactive for 5 minutes. If this determination is satisfied, the scrolling mode is entered at Step 1408, otherwise Step 1406 is repeated. At Step 1408, the first scroll display is initiated. At Step 1410, a determination is made whether the scroll display is a new display. If the display is a new display Step 1412 is entered, otherwise Step 1416 is entered. At Step 1412 the LCD 240 is cleared to prepare for the new display. At Step 1414, the display counter is initiated. At Step 1416, a determination is made if the EID 200 has a system error. If a system error is detected Step 1418 is entered, otherwise processing proceeds to Step 1420 in FIG. 14B. At Step 1418, the display is updated with the system error display.

Figure 15:
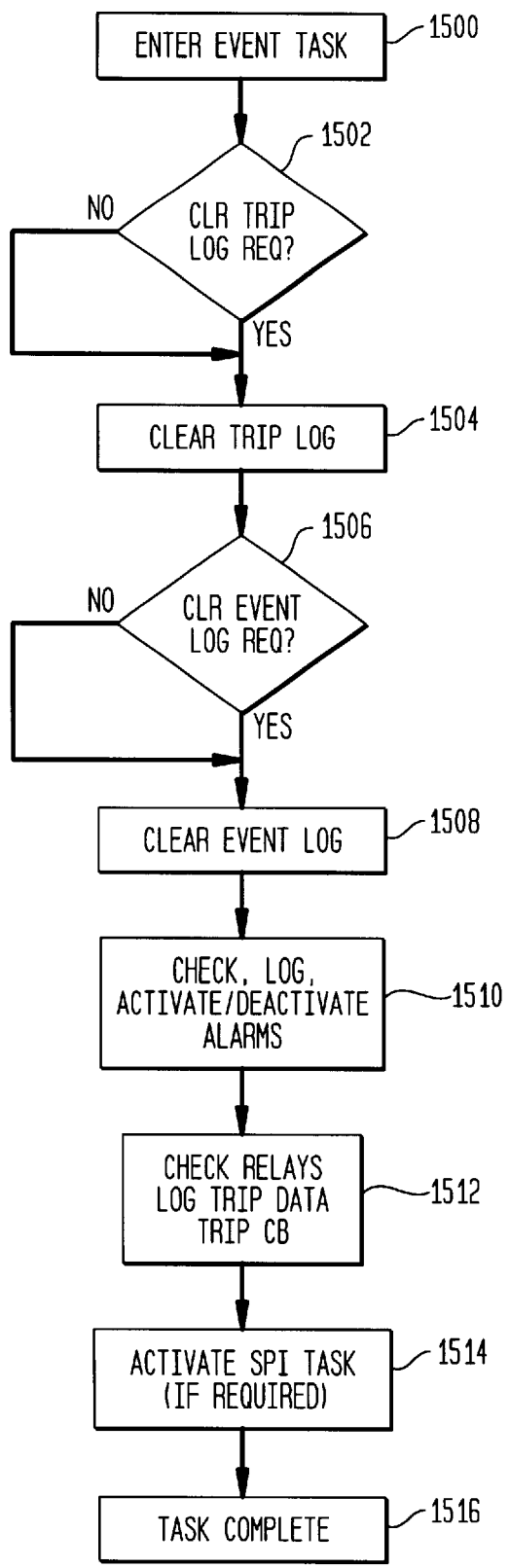
FIG. 15 is a flow chart outlining an exemplary Events Task of the present invention.

Referring now to FIG. 14B, at Step 1420, the LCD 240 is updated with the current scroll display. At Step 1422, the display counter is checked for a time-out. If a time-out is detected Step 1424 is entered, otherwise Step 1410 is reentered. At Step 1424, the next scroll display is selected. At Step 1426, the display timer is re-initiated, and Step 1410 is re-entered. During this process, a wait loop 1428 is running in the background to detect a keypad depression. When a keypad is depressed, Step 1430 is entered. At Step 1430, the display exits the scrolling mode. At Step 1432, the fixed display is reactivated displaying the last information prior to entry into the scroll mode. FIG. 15 is a flowchart showing the Events Task. The Events Task is activated once a second by the Energy Information Task. When activated, the Events Task maintains the states and delays for each alarm and relay function. The events task also clears the event and trip logs when requested and maintains the data written into the event and trip logs. When the Energy Information Task has completed calculating the most recent energy information data, the Energy Information Task loads the data into the Events Task. When activated, the Events Task checks the set points for each programmed alarm and relay function. When a set point is exceeded, the respective alarm or relay enters the wait state. If the delay time is exceeded, the alarm or relay function enters the active state. If an event causes several alarms to activate during a single event task, only the first alarm checked is initially entered into the event log. After the logged alarm is cleared, any other alarm that is in the active state will be logged. In this way, only one alarm at a time is logged in to prevent a single event, which may cause several alarms to become active, from overflowing the event log.

Referring to FIG. 15, the Events Task is illustrated. At Step 1500 the events task is entered. At Step 1502, a determination is made if a Clear Trip Log request is detected. If so, Step 1504 is entered, otherwise Step 1506 is entered. At Step 1504, the Trip Log is cleared. At Step 1506, a determination is made if a Clear Event Log request is detected. If so Step 1508 is entered, otherwise Step 1510 is entered. At Step 1508, the Event Log is cleared. At Step 1510, the alarms are checked, logged in the Event Log, and activated or deactivated as required. At Step 1512, the protective relays are checked. If necessary, relay alarm data is logged in the Event Log. Also, if necessary, relay trip data is logged in the Trip Log and the circuit breaker is tripped. At Step 1514, the SPI message task is activated if necessary and at Step 1516, the Events Task is complete.

Figure 16:
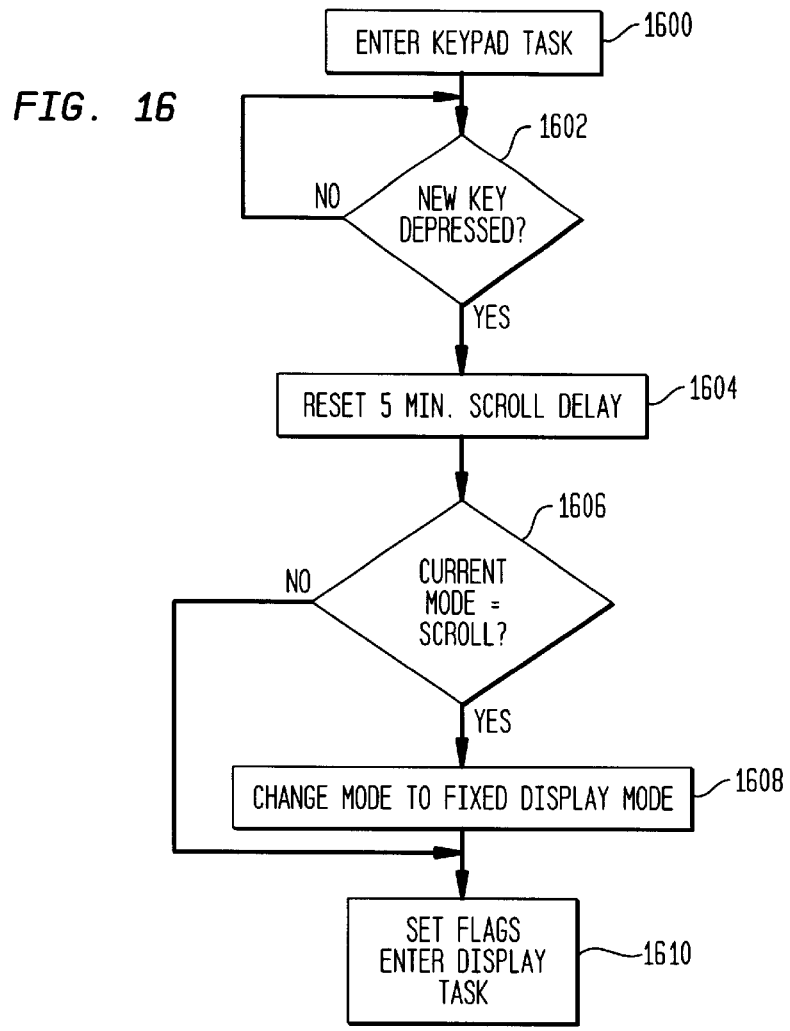
FIG. 16 is a flow chart outlining an exemplary Keypad Task of the present invention.

FIG. 16 is a flowchart outlining the Keypad Task. In the present embodiment, the Keypad Task is activated every 250 ms to determine if a key has been pressed. If a key is available, the Display Task or LCD Scroll Task is informed so that the display can be updated as required. If a key is pressed, the scroll delay is reset to 5 minutes and, if LCD 240 is currently in the scrolling mode, the display mode is changed to fixed display mode. At Step 1600, the Keypad Task is entered. At Step 1602, a determination is made whether a new key depression occurred. If a new key depression is detected Step 1604 is entered, otherwise Step 1602 is reentered. At Step 1604, the scroll delay is reset to 5 minutes. At Step 1606, the current display mode is determined. If the mode is the scrolling display mode, then step 1608 is entered, otherwise Step 1610 is entered. At Step 1608, the display mode is changed to the fixed display mode. At Step 1610, appropriate flags are set for other tasks and the display Task is entered.

Figure 17:
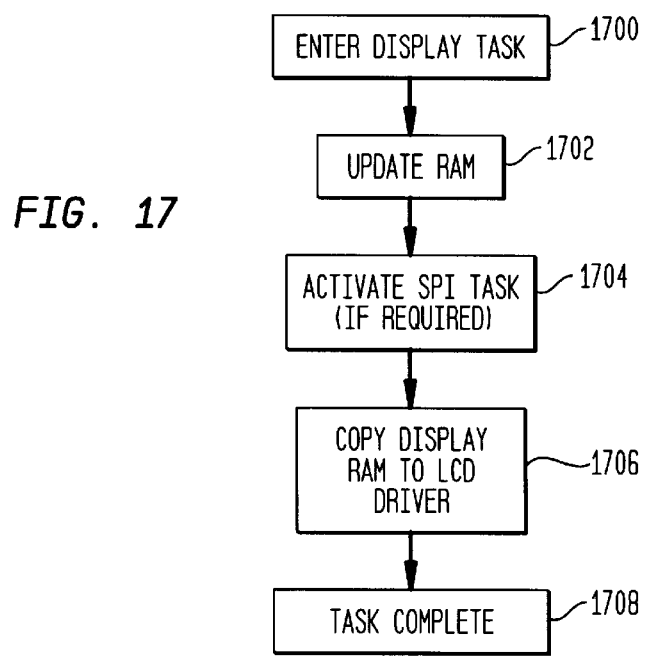
FIG. 17 is a flow chart outlining an exemplary Display Task of the present invention.

FIG. 17 is a flowchart outlining the Display Task. The Display Task is activated once per second when the display is in the fixed mode or on demand in response to depressing a key. Screens that contain changing data are updated every second. Screens that contain fixed information are updated only when a key is depressed. When starting at the Main Menu, lower level menus and information/set point screens are entered when the Enter Key 412 is depressed. Likewise, when starting at a lower level screen in the menu hierarchy, higher level screens are entered when the ESC key 414 is depressed. The Up key 408 and Down key 410 are used to change the values/set points of programmed data, for example. In particular, at Step 1700, the Display Task is entered. At Step 1702, the area of RAM 236 containing the display data is updated based on the current display and whether a key was pressed. At Step 1704, the SPI Message Task is activated if necessary. At Step 1706, the display RAM is copied to the LCD interface 240A. At Step 1708, the Display Task is completed.

Figure 18:
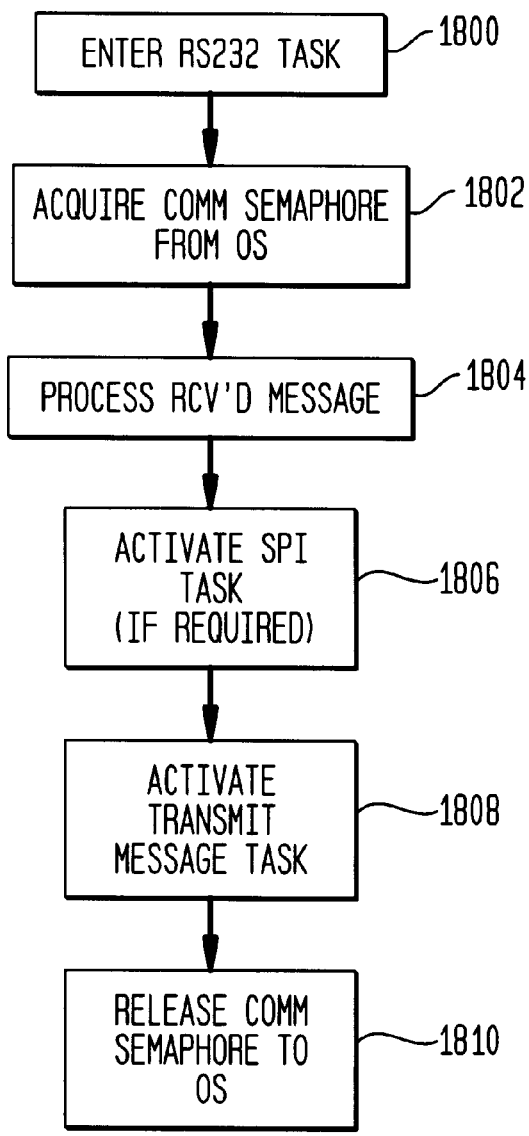
FIG. 18 is a flow chart outlining an exemplary RS232 Task of the resent invention.

FIG. 18 is a flowchart showing the RS232 Task, which determine., what response needs to be transmitted after an RS232 message is received.

Once the response is determined, the Transmit Message Task is activated. In the present embodiment, both the RS232 Task and the RS485 Task use the same functions to decode incoming messages and build the outgoing responses. The RS232 UART Interrupt 249 FIG. 2C receives and transmits data on the RS232 port 248. When the last message byte is received, the RS232 UART Interrupt activates the RS232 Task so that the response to the message can be determined. Likewise, after the RS232 Task builds the response message, it activates the Transmit Message Task which causes the RS232 UART Interrupt 249 to transmit the response out the RS232 port. The RS232 Task is activated by the RS232 UART interrupt 249 after a message has been received. Again, referring to FIG. 18, the RS232 Task is illustrated. At Step 1800, the RS232 task is entered as a result of RS232 UART interrupt 249. At Step 1802, the communications semaphore is acquired from the operating system (OS). At Step 1804, the received message is processed. At Step 1806, the SPI Message Task is activated as required. At Step 1808, the Transmit Message Task is activated to send the response message. At Step 1810, the communications semaphore is released to the OS.

Figure 19:
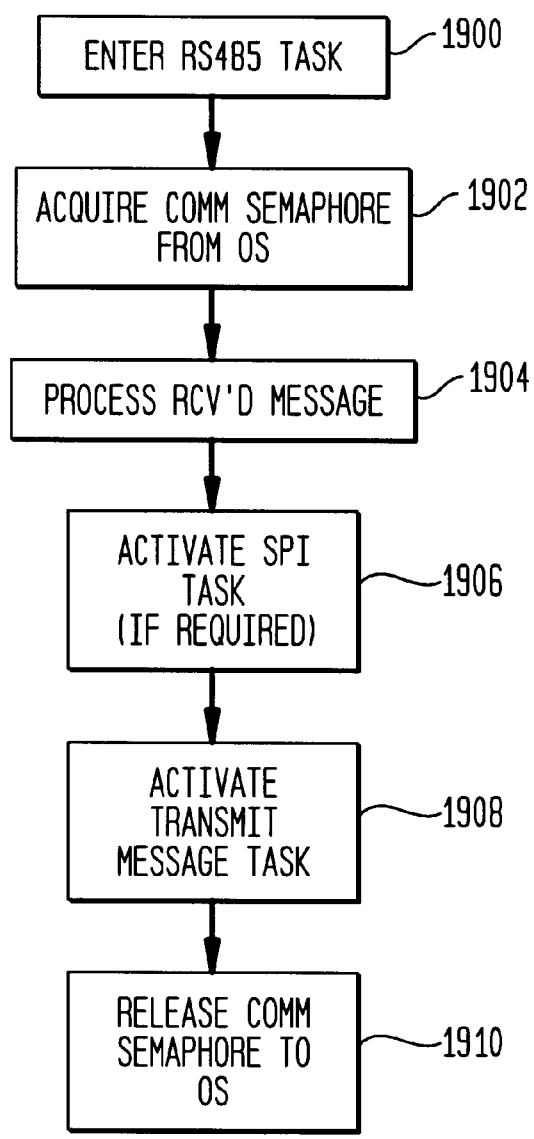
FIG. 19 is a flow chart outlining an exemplary RS-485 Task of the present invention.

FIG. 19 is a flowchart outlining the RS485 Task. The RS485 Task determines what response needs to be transmitted after a RS485 message is received. Once the response is determined, the Transmit Message Task is activated. As mentioned above, both the RS232 Task and the RS485 Task use the same features to decode incoming messages and build the outgoing responses. The Process RS485 Task is activated by the SCI interrupt after a message has been received. The RS485 UART Interrupt receives and transmits data on the RS485 port. When the last byte of a message is received, the RS485 UART Interrupt activates the RS485

Task so that the response to the message can be determined. Likewise, after the RS485 Task builds the response message, it activates the Transmit Message Task which causes the RS485 UARI Interrupt to transmit the response out the RS485 port. In particular at Step 1900, the RS485 task is entered as a result of an RS485 interrupt. At Step 1902, the communications semaphore is acquired from the OS. At Step 1904, the received message is processed. At Step 1906, the SPI Message Task is activated as required. At Step 1908, the Transmit Message Task is activated to send the response message. At Step 1910, the communications semaphore is released to the OS.

Figure 20:
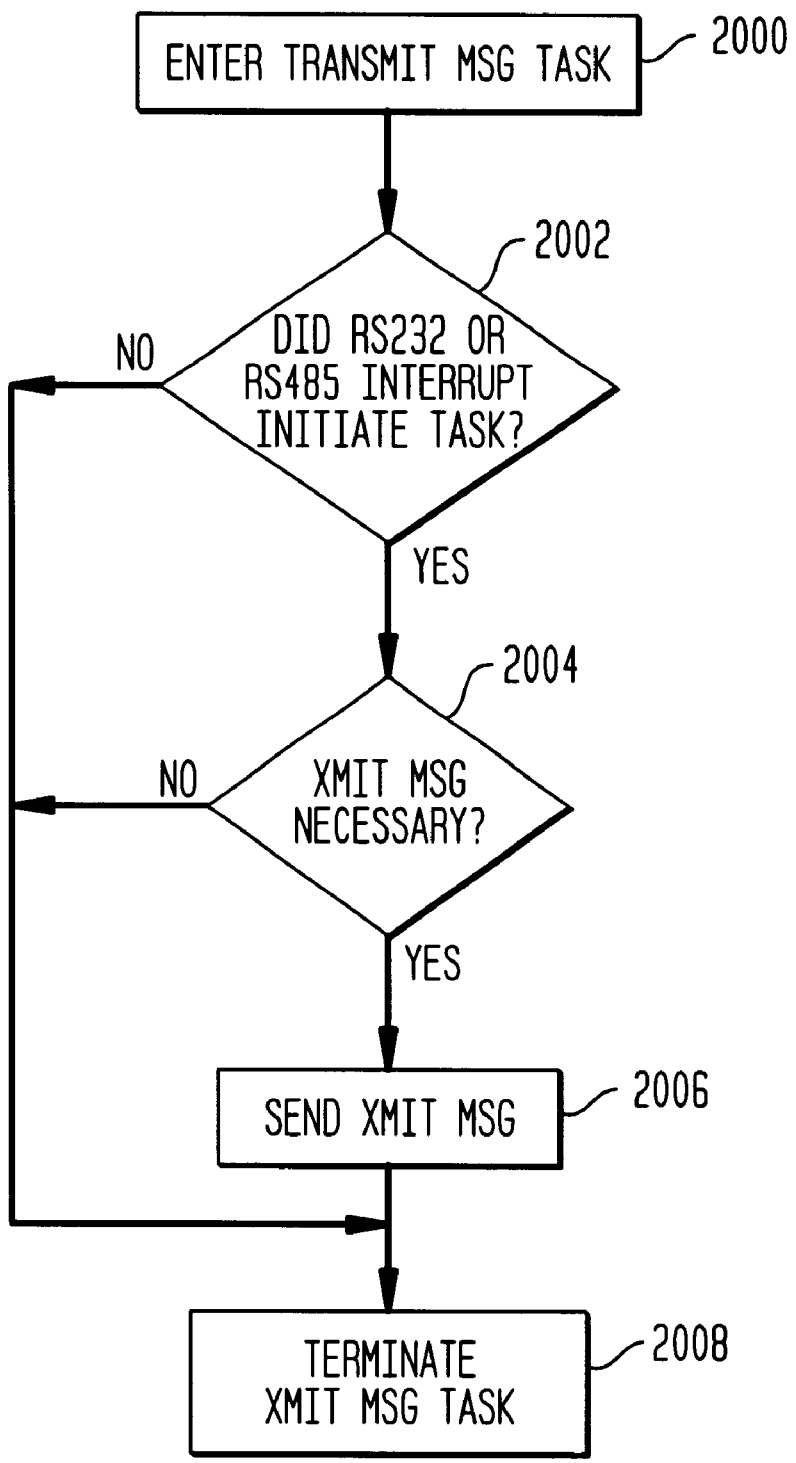
FIG. 20 is a flow chart outlining an exemplary Transmit Message Task of the present invention.

FIG. 20 is a flowchart showing the Transmit Message Task. The Transmit Message Task determines what response needs to be transmitted after a message is received. The Transmit Message Task is activated by the RS232 Task and the RS485 Task after an incoming message has been decoded and a response message has been determined. This task activates the RS232 UART 248A or RS485 transmitter 246A if a response is required. In particular, Step 2000, the Transmit Message Task is entered. At Step 2002, it is determined whether an RS232 or RS485 task initiated the Transmit Message Task. If so Step 2004 is entered, otherwise the task is terminated at Step 2008. At Step 2004, it is determined whether a transmit message is necessary. If so Step 2006 is entered, otherwise the task is terminated at Step 2008. At Step 2006, the transmit message is sent. At Step 2008, the Transmit Message Task is terminated.

Figure 21:
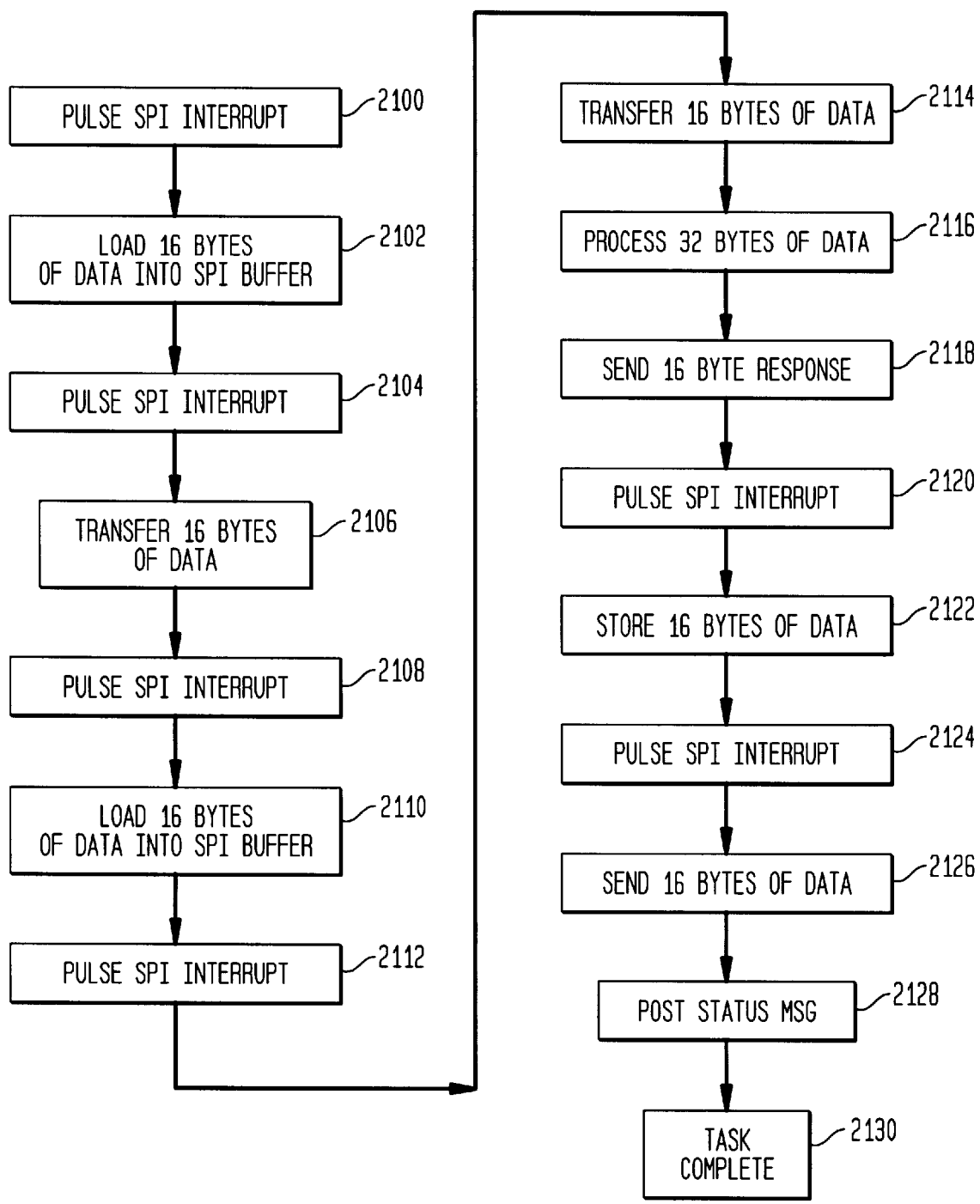
FIG. 21 is a flow chart outlining an exemplary SPI Message Task of the present invention.

FIG. 21 is a flowchart showing the SPI Message Task. The SPI Message Task handles Inter-processor communications between the Protective microprocessor 214 and Energy Information/Communications microprocessor 222. The SPI Message Task is activated by the tasks that need to send a message to the Protective microprocessor 214. In particular, at Step 2100 Energy Information/Communications microprocessor 222 initiates the data transfer by first pulsing SPI interrupt line 259. At Step 2102, Energy Information/Communications microprocessor 222 first loads 16 bytes of data into the SPI buffer and at Step 2104, pulses the interrupt line 259. At Step 2106, the Protective microprocessor 212 transfers the first 16 bytes of the message from the Energy Information/Communications microprocessor 222. At Step 2108, Energy Information/Communications microprocessor 222 again pulses interrupt line 259 to indicate that the data transfer is complete. At Step 2110, Energy Information/Communications microprocessor 222 loads a second 16 bytes of data into the SPI buffer and at Step 2112, pulses interrupt line 259. At Step 2114, Protective microprocessor 212 transfers the second 16 bytes of data.

At Step 2116, the 32 bytes of data are processed by the Protective microprocessor 214. At Step 2118, Protective microprocessor 214 sends 16 bytes of response data to Energy Information/Communications microprocessor 222. At Step 2120, Energy Information/Communications microprocessor 222 pulses the SPI interrupt line to suspend data transfer. At Step 2122, Energy Information/Communications microprocessor 222 stores the first 16 bytes of data and at Step 2124, pulses SPI interrupt line 259 to continue the data transfer. At Step 2126, Protective microprocessor 214 sends the last 16 bytes of data to Energy Information/Communications microprocessor 222. At Step 2128, a status message is posted to the calling task to indicate whether an error occurred during the SPI Task. At Step 2130, the sequence is complete.

Exemplary SPI messages that the Energy Information/Communications microprocessor 222 sends to the Protective microprocessor 214 include the following: (1) EEPROM Read—read an item from the Protective microprocessor's EEPROM; (2) EEPROM Write—write an item from the Protective microprocessor's EEPROM; (3) Update Status—the Energy/Communication and Protective boards swap status information; (4) Clear Trip Log—clear trip log data in the Protective microprocessor's EEPROM; (5) New Trip Log Entry—add new trip log entry to the Protective microprocessor's PROM 216; (6) Breaker Test—perform a breaker test; (7) System Information—get the rating plug value and protective code version; and (8) Trip Breaker—instruct Protective board to trip circuit breaker 116.

Figure 22:
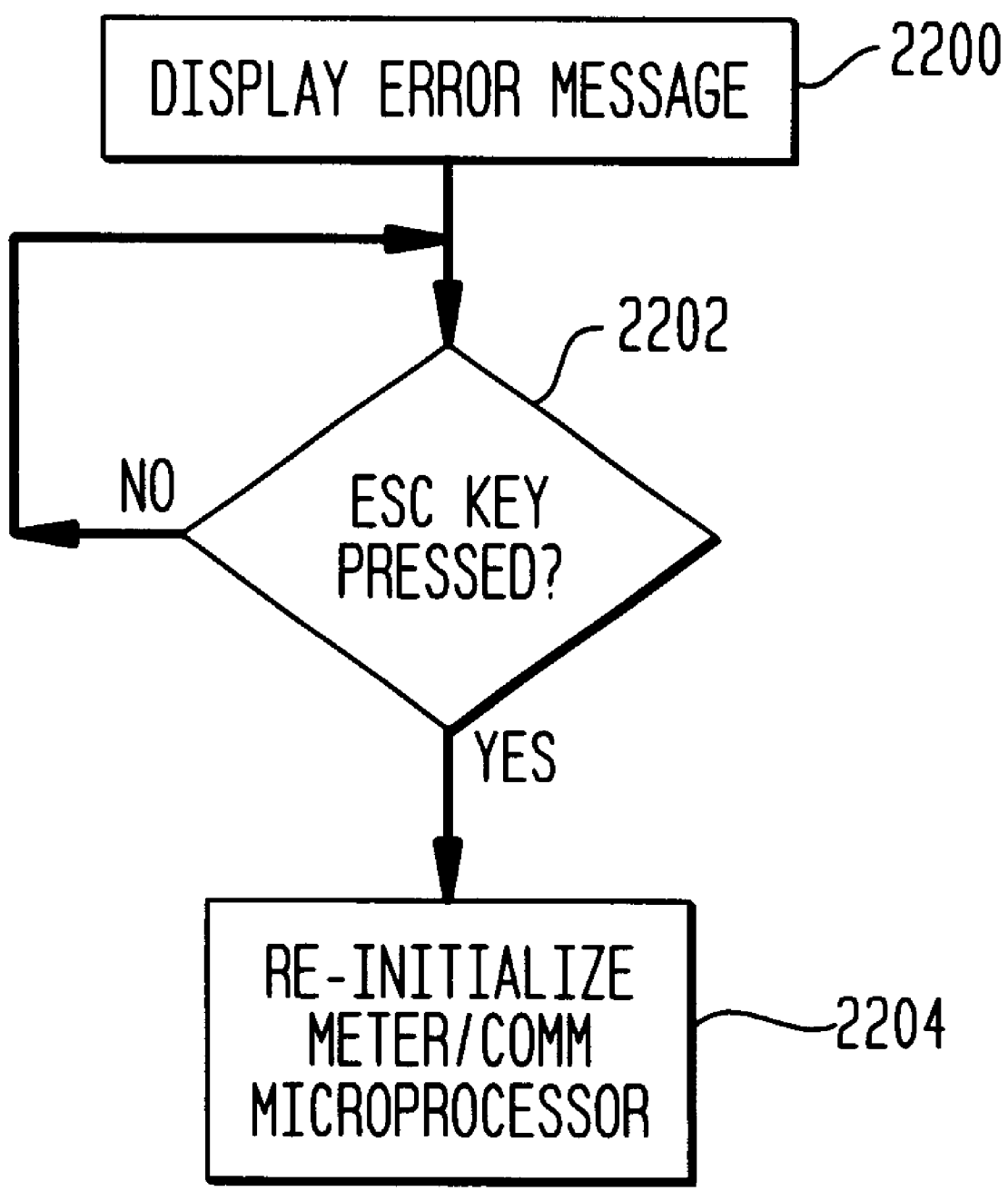
FIG. 22 is a flow chart outlining an exemplary Error Task present invention.
Figure 23B:
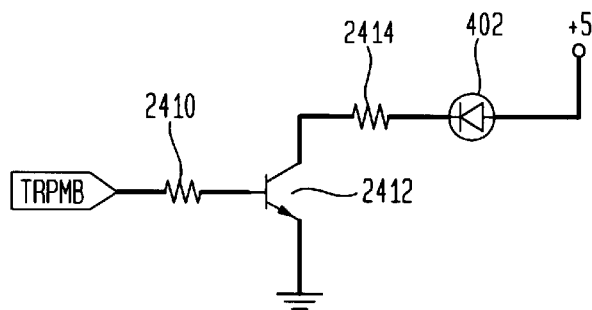
Figure 23C:
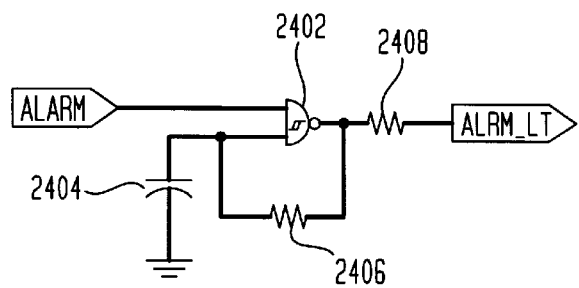
Figure 23D:
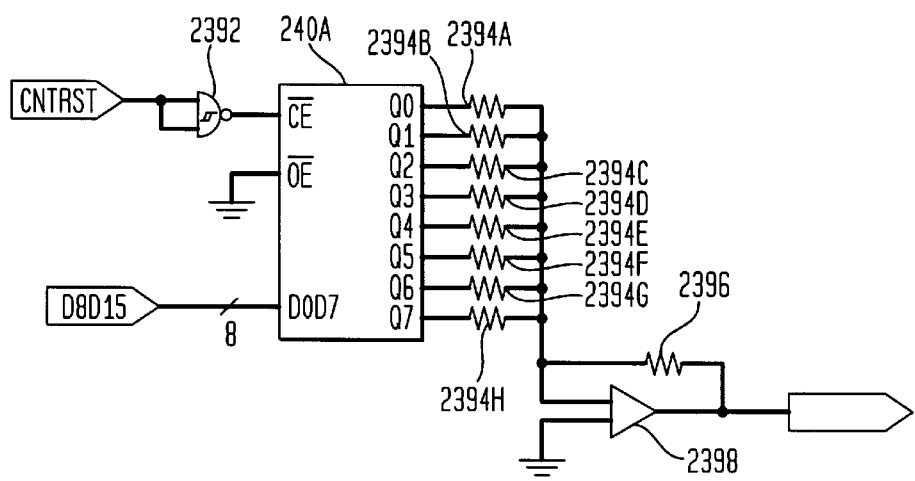
Figure 23E:
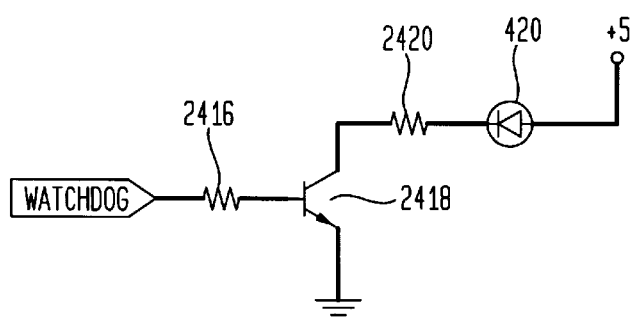
Figure 23F:
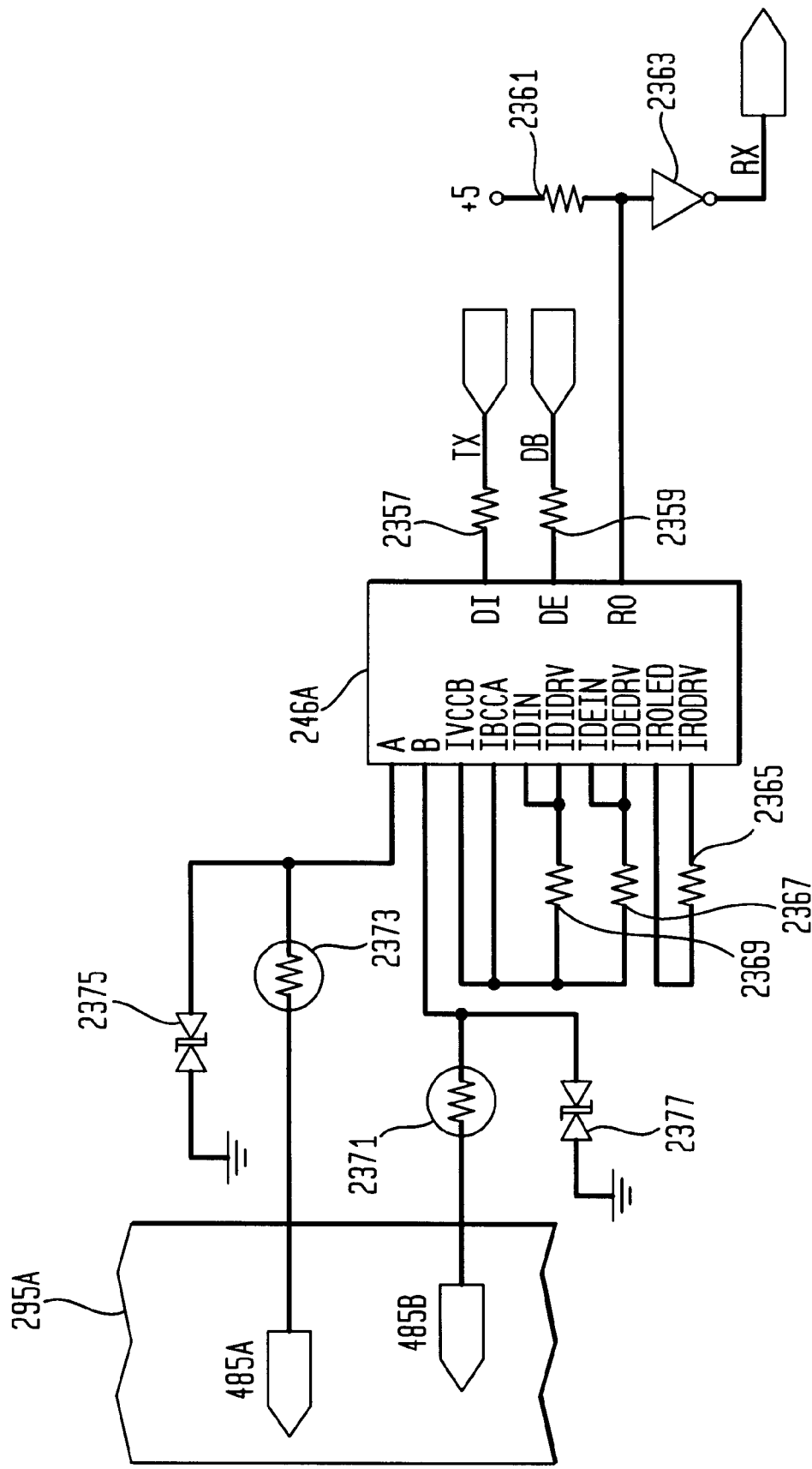
Figure 23H:
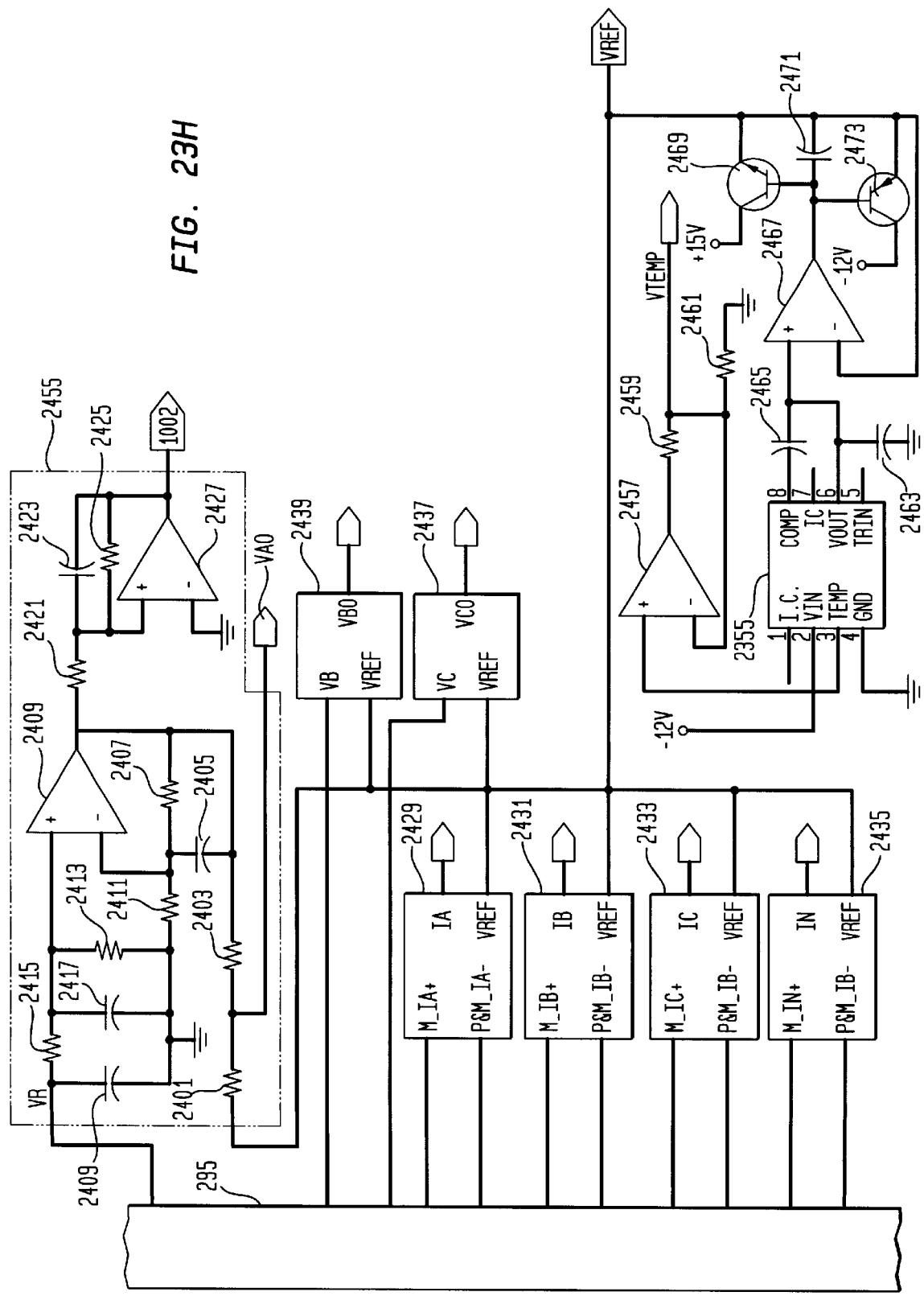
Figure 23I:
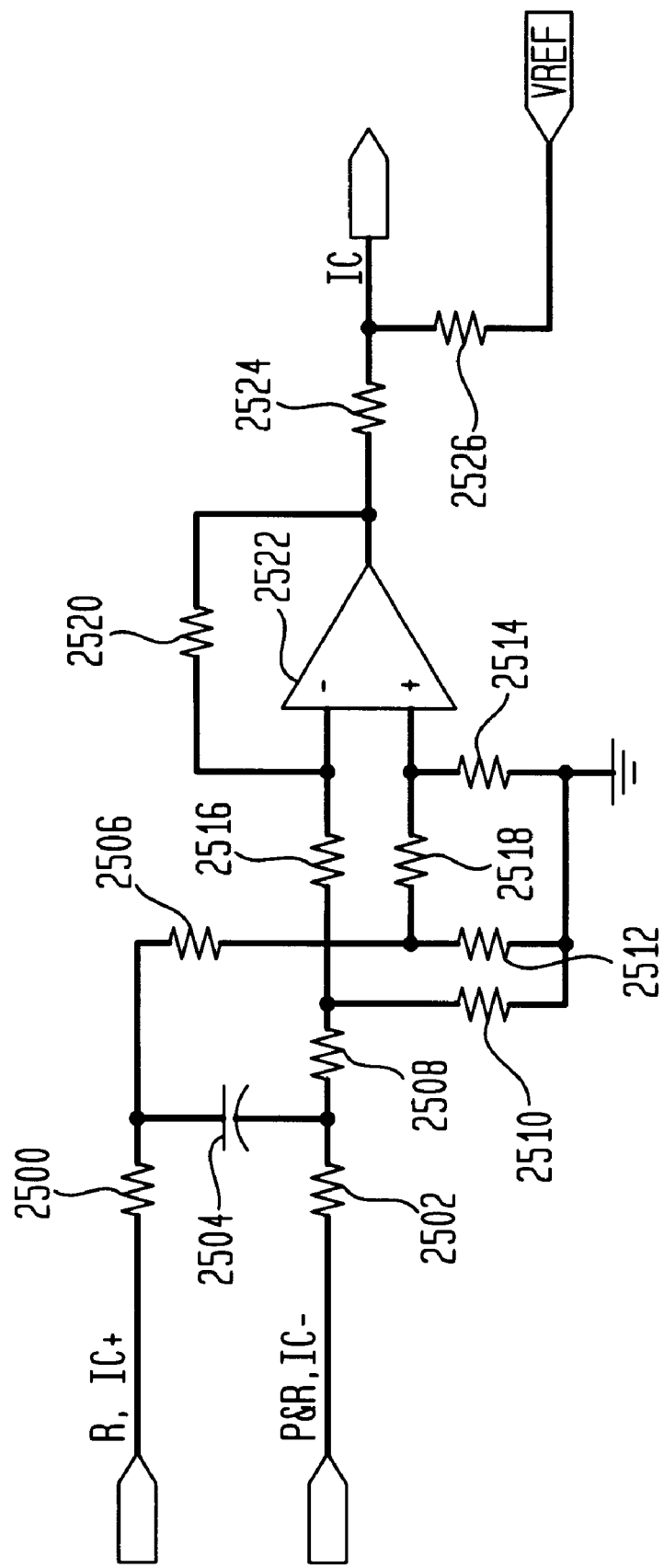

FIG. 22 is a flowchart showing the Error Task, which displays a predetermined error screen if a system error occurs. At Step 2200, the error type is displayed. At Step 2202, the task waits for the ESC key to be pressed. After the ESC key is pressed, Step 2204 is entered. At Step 2204, Energy Information/Communications microprocessor 222 is reinitialized. In the present embodiment, if an error occurs, one of 6 high level error values will be displayed on the error screen. If the high level error was caused by an SPI error, then the SPI error value will be displayed after the high level error value separated by a dot (.). For example, if the error screen displays 1.4 as the error number, this is an indication that a EEPROM write message failed as a result of a EEPROM programming failure. Exemplary High Level Error values are: (1) EEPROM write error; (2) Status message error; (3) Clear trip log error, (4) Trip log update error; (5) Breaker test error, and (6) Breaker trip error. Exemplary Low Level SPI Error values are SPI errors reported by protective processor, which include: (1) Invalid message type received; (2) Bad LRC received; (3) Invalid length byte received; (4) An EEPROM programming failure occurred; and (5) An invalid test was requested. Exemplary SPI receive errors detected by Energy Information/Communications microprocessor 222 include: (6) Bad message type error; (7) Bad LRC error, (8) EEPROM read message error; (9) EEPROM write message error, (10) Update Status message error; (11) Clear Trip Log message error; (12) New Trip Log Entry message error; (13) Breaker Test message error; (14) System Information message error; and (15) Trip Breaker message error.

While the present invention has been described in terms of the exemplary or present embodiment, as currently contemplated, it should be understood that the present inventions are not limited to the disclosed embodiments. Accordingly, the present inventions cover various modifications comparable arrangements, methods and structures that are within the spirit and scope of the claims.

What is claimed:

1. An energy information system for use with a circuit breaker coupled between a power source and a load, the energy information system comprising:

sensing means for sensing at least one of i) a voltage, and ii) a current flowing between the power source and the load through the circuit breaker;

detecting means for detecting transitions of a sensed voltage;

counting means for counting a number of times the circuit breaker trips and interrupts the current flow between the power source and the load;

measuring means for i) measuring the current flow through the circuit breaker when the circuit breaker trips and interrupts the current flow between the power source and the load and ii) determining a plurality of energy related parameters including a measure of at least one of the voltage, the current and the frequency based on an output from the detecting means, between the power source and the load;

input means for accepting a user input, the user input controlling at least one of the circuit breaker and a display means;

the display means for displaying at least one of the plurality of conditions of the circuit breaker responsive to the input means; and communication means coupled to the input means for selectively communicating at least one of the plurality of energy related parameters to a remote terminal.

2. The energy information system of claim 1, wherein the counting means includes:

a mechanical counter means for determining a first count value based on a total number of times the circuit breaker trips;

an interruption level counter means for determining a second count value, the second count value indicating a current range flowing between the power source and the load when the circuit breaker trips; and a fault counter means for determining a third count value, the third count values indicating a count of a fault condition that trips the circuit breaker.

3. The energy information system of claim 1, further comprising security means for selectively allowing access to control the energy information system.

4. The energy information system of claim 3, wherein said security means is a password entered using said input means.

5. The energy information system of claim 4, wherein the biasing means further comprises:

a generating means for generating a stable reference voltage; and a buffer means coupled to the generator for buffering the stable reference voltage and generating the predetermined biased value.

6. The energy information system of claim 1, wherein the sensing means further comprises:

converting means for converting the voltage of the power source to a lower voltage;

biasing means for biasing the lower voltage above a ground potential by a predetermined bias value to produce a full-wave biased voltage, wherein the measuring means processes the full-wave biased voltage to determine the plurality of conditions of the circuit breaker.

7. The energy information system of claim 1, wherein the sensing means has a voltage input range from about 50% to 125% of the voltage of the power source.

8. The energy information system of claim 1, wherein the display means displays the plurality of conditions in one of a plurality of languages based on a user selection.

9. The energy information system of claim 4, further comprising memory means f or storing a date of manufacture of the circuit breaker.

10. The energy information system of claim 9, wherein the date-of manufacture is at least one of i) displayed on the display means and ii) sent to the remote terminal by the communication means.

11. The energy information system of claim 10, wherein the demand is determined by calculating according to the following equation:

$$\frac{\sum_{n=1}^{T_{PRG}} \left( \frac{I_A + I_B + I_C}{3} \right)}{T_{PRG}} = AmpDemand$$

where $T_{PRG}$ is a programmable demand period, and $I_A$, $I_B$ and $I_C$ are phase currents for phases A, B and C, respectively.

12. The energy information system of claim 1, wherein the plurality of energy related parameters includes at least one of i) an energy demand based on at least one of the current and the voltage sensed by the sensing means over a predetermined period of time and ii) a plurality of RMS parameters measured over a range of harmonics of a fundamental frequency of the power source.

13. The energy information system of claim 12, wherein the predetermined period of time is between about 1 and 90 minutes, the period of time selectable by the user through at least one of the input means and the communications means.

14. The energy information system of claim 1, wherein the energy information system is adaptable for mounting within the circuit breaker.

15. The energy information system of claim 14, wherein the energy information system is field installable within the circuit breaker.

16. An energy information system for use with a circuit breaker coupled be en a power source and a load, the energy information system comprising:

a sensor to sense at least one of i) a voltage and ii) a current flowing between the power source and the load through the circuit breaker;

a transition detector to detect transitions of a sensed voltage from the sensor;

a counter coupled to the sensor to count a number of times the circuit breaker trips and interrupts the current flow between the power source and the load;

a energy information controller coupled to the sensor and counter to measure the current flow through the circuit breaker when the circuit breaker trips and interrupts the current flow between the power source and the load and for measuring a plurality of related parameters, including a measure of at least one of the voltage, the current and the frequency based on an output from the transition detector;

an input device coupled to the energy information controller to enter a user input for controlling at least one of the circuit breaker and a display;

the display coupled to the energy information controller to display at least one of the plurality of power related parameters responsive to the user input; and a communication port coupled to the energy information controller to selectively communicate at least one of the plurality of power related parameters to a remote terminal.

17. The energy information system of claim 16, wherein the counter further includes:

a mechanical counter to determine a first count value based on a total number of times the circuit breaker trips;

an interruption level counter to determine a second count value, the second count value indicating a current range flowing between the power source and the load when the circuit breaker trips; and a fault counter to determine a third count value, the third count value indicating a count of a fault condition indicative of a circuit breaker trip.

18. The energy information system of claim 17, wherein the second count value is a plurality of count values of respective ranges of current flows, the ranges of current flows selected from the group consisting of
   i) the current flow being less about than 100% of a trip rating of the circuit breaker;
   ii) the current flow being between about 100% and 300% of the trip rating of the circuit breaker;
   iii) the current flow being between about 300% and 600% of the trip rating of the circuit breaker,
   iv) the current flow being between about 600% and 900% of the trip rating of the circuit breaker; and
   v) the current flow being greater than about 900% of the trip rating of the circuit breaker.

19. The energy information system of claim 17, wherein the third count value includes at least one of the group consisting of:
   i) an overload fault count value;
   ii) a short time fault count value;
   iii) an instantaneous fault count value; and
   iv) a ground fault count value.

20. The energy information system of claim 17, wherein the energy information system is field installable within the circuit breaker.

21. The energy information system of claim 16, wherein the sensor comprises:
   a voltage transformer to convert a line voltage of the power source to a voltage lower than the line voltage; and
   a voltage shifter to bias the lower voltage above a ground potential by a predetermined voltage to produce a full-wave biased voltage signal,
   wherein the energy information controller measures the full-wave biased voltage signal to determine the plurality of energy related parameters.

22. The energy information system of claim 16, wherein the transition detector has a voltage input range from about 50% to 125% of the voltage of the power source.

23. The energy information system of claim 16, wherein the communication port comprises at least one of an RS-232 communication port and an RS485 communication port, each of the communication ports providing for upload and download of data between the remote terminal and the energy information controller.

24. The energy information system of claim 16, wherein the display displays the plurality of energy related parameters in one of a plurality of languages based on a user selection, the selection made through at least one of the input device and the communication port.

25. The energy information system of claim 16, further comprising a memory for storing a date of manufacture of the circuit breaker.

26. The energy information system of claim 25, wherein the date of manufacture is at least one of displayed on the display and sent to the remote terminal through the communication port.

27. The energy information system of claim 16, wherein the plurality of energy related parameters includes at least one of i) an energy demand based on at least one of the current and the voltage sensed by the sensor over a predetermined period of time and, ii) a plurality of RMS parameters measured over a range of harmonics of a fundamental frequency of the power source.

28. The energy information system of claim 27, wherein the range of harmonics includes up to at least about a 19th harmonic of the fundamental frequency.

29. The energy information system of claim 27, wherein the predetermined period of time is between about 1 and 90 minutes, the period of time selectable by the user through at least one of the input device and the communication port.

30. The energy information system of claim 27, wherein the demand is determined by calculating according to the following equation:

$$\frac{\sum_{n=1}^{T_{PRG}} \left( \frac{I_A + I_B + I_C}{3} \right)}{T_{PRG}} = AmpDemand$$

where
$T_{PRG}$ is a programmable demand period, and
$I_A$, $I_B$ and $I_C$ are phase currents for phases A, B and C, respectively.

31. The energy information system of claim 30, wherein the demand calculation is performed automatically about once a second.

32. The energy information system of claim 16, wherein the energy information system is adaptable for mounting within the circuit breaker.

33. The energy information system of claim 16, further comprising a security controller to selectively allow access to the energy information system by the input device.

34. An energy information system for use with a circuit breaker coupled between a power source and a load, the energy information system comprising:
   a sensor to sense at least one of i) a voltage and ii) a current flowing between the power source and the load through the circuit breaker;
   a transition detector to detect transitions of a sensed voltage from the sensor;
   a voltage shifter coupled to the sensor to bias the voltage above a ground potential by a predetermined voltage to produce a full-wave biased voltage waveform;
   a counter to determine
      i) a first count value based on a total number of times the circuit breaker trips;
      ii) a second count value indicating a current range flowing between the power source and the load when the circuit breaker trips, the current range based on percentage of a trip rating of the circuit breaker; and
      iii) a third count value indicating a count based on a predetermined fault condition of the circuit breaker;
   an energy information controller coupled to the sensor, the counter, the transition detector and the voltage shifter, the energy information controller measuring i) the current flow through the circuit breaker when the circuit breaker trips and ii) the full-wave biased voltage waveform to determine the plurality of energy related parameters of the circuit breaker;
   an input device coupled to the energy information controller to enter a user input for controlling at least one of the circuit breaker and a display;
   a memory to store a date of manufacture of the circuit breaker;
   the display coupled to the energy information controller to display at least one of i) the plurality of conditions and ii) the date of manufacture of the circuit breaker responsive to the user input, the plurality of energy related parameters including a) an energy demand; and b) a plurality of RMS parameters measured over a range of harmonics of a fundamental frequency of the power source based on at least one of the voltage, the current and the frequency over a predetermined period of time, a security controller to selectively allow access of the energy information system by the input device; and a communications port including at least one serial communications port, the communications port coupled to the energy information controller to selectively communicate with a remote terminal;

wherein the communication port provides for upload and download of data between the remote terminal and the energy information controller.

35. An energy information device for use with a circuit breaker having a trip unit, the energy information device coupled between a power source and a load, the device comprising:

a plurality of current sensors having an input coupled to respective ones of a plurality of power lines between the power source and the load;

a plurality of transformers coupled between the respective ones of the plurality of power lines and an analog to digital converter (ADC);

a transition detector having an input coupled to an output of one of the plurality of transformers;

an override circuit coupled to an output of the plurality of current sensors, an input of a power supply and a first microprocessor;

a trip circuit having a first input coupled to an output of the override circuit;

the first microprocessor further coupled to a first programmable read only memory (PROM), a second input of the trip circuit, and a second microprocessor; and the second microprocessor further coupled to an output of the transition detector, an output of the ADC, a clock circuit, a second PROM and a random access memory (RAM).

36. The energy information device of claim 35, further comprising:

a first digital input/output (I/O) interface coupled to the first microprocessor; and a second digital I/O interface coupled to the second microprocessor.

37. The energy information device of claim 35, further comprising a liquid crystal display (LCD) coupled to the second microprocessor.

38. The energy information device of claim 35, further comprising a test connector coupled to the second microprocessor.

39. The energy information device of claim 35, further comprising a rating plug coupled to the first microprocessor.

40. The energy information device of claim 35, further comprising:

a first signal conditioner coupled between the plurality of current sensors and the first microprocessor, and a second signal conditioner coupled between i) the plurality of current sensors and the plurality of transformers and ii) the ADC.

41. The energy information device of claim 35, wherein the transition detector comprises:

a filter having an input coupled to the output of one transformer to filter an AC signal from the transformer;

a comparator coupled to the filter to compare a filtered output of the filter to a voltage;

an amplifier for amplifying an output of the comparator; and, an inverter for inverting an output of the amplifier and producing a signal representative of an AC signal frequency, wherein transition information is supplied to the second microprocessor based on the AC signal frequency.

42. An energy information device for use with a circuit breaker having a trip unit, the energy information device coupled between a power source and a load, the device comprising:

a signal conditioner coupled to a plurality of power lines between the power source and the load providing conditioned signals based on an input signal representative of a current flowing between the power source and the load;

an override circuit coupled to an output of the signal conditioner;

a filter coupled to a first output of the override circuit to filter the first output of the override circuit;

a microprocessor coupled to an output of the filter;

a memory coupled to the microprocessor; and a trip circuit coupled to an output of the microprocessor and a further output of the override circuit, and generating a trip signal for the trip unit based on at least one of i) the further output of the override circuit and ii) the output of the microprocessor.

43. The energy information device of claim 42, further comprising a rating plug coupled to the microprocessor.

44. The energy information device of claim 42, wherein the input signal is a differential input signal and the override circuit converts the differential input signal into a single ended output signal.

45. An energy information device for use with a circuit breaker having a trip unit, the energy information device coupled between a power source and a load, the device comprising:

a first amplifier coupled to a plurality of power lines between the power source and the load, providing first amplified signals based on a first input signal representative of a plurality of currents flowing between the power source and the load;

a second amplifier coupled to the plurality of power lines between the power source and the load, providing second amplified signals based on a second input signal representative of a respective plurality of voltages provided by the power source to the load;

a transition detector coupled to an output of the second amplifier to detect a transition of a voltage signal based on one of the plurality of voltages, and generating a transition signal used in determining a frequency of the voltage signal;

a first analog-to-digital converter (ADC) coupled to an output of the first amplifier to generate a first digital output signal representative of the plurality of currents based on an offset value;

a second ADC coupled to an output of the second amplifier to generate a second digital output signal representative of the plurality of voltages based on the offset value;

an offset generator coupled to the first amplifier, the second amplifier, the first ADC and the second ADC, and generating the offset value;

a first clock generator for generating a clock signal to control a sample timing of the first ADC and the second ADC;

a microprocessor coupled to the first ADC and the second ADC, said microprocessor processing the first and second digital output signals of the first and second ADC, respectively;

a second clock generator coupled to the microprocessor for generating a system time base;

a first memory coupled to the microprocessor, the memory containing an executable program for the microprocessor;

a second memory coupled to the microprocessor for storing data from and providing data to the microprocessor; and a communications port coupled to the microprocessor for remote access of the microprocessor.

46. The energy information device of claim 45, wherein the transition detector comprises:

a filter having an input coupled to one output of the second amplifier to filter the voltage signal based on one of the plurality of voltages from the second amplifier;

a comparator coupled to the filter to compare a filtered output of the filter to a voltage;

an amplifier for amplifying an output if the comparator; and an inverter for inverting an output of the amplifier and producing transition information relating to a voltage signal frequency, wherein the transition information is supplied to the microprocessor, which determines the voltage signal frequency.

47. The energy information device of claim 45, wherein the communication port is at least one of an RS-232 port and an RS-485 port.

48. The energy information device of claim 45, wherein the communication port is coupled to a remote computer.

49. An energy information system mounted within a circuit breaker coupled between a power source and a load, the energy information system comprising:

a sensor to sense at least one of i) a voltage and ii) a current flowing between the power source and the load through the circuit breaker, the sensor having a voltage input range from about 50% to 125% of the voltage of the power source;

a voltage transformer to convert a line voltage of the power source to a voltage lower than the line voltage;

a transition detector to detect transitions of a sensed voltage from said sensor and to generate a transition signal, said transition detector comprising:
  i) a filter having an input coupled to an output of the voltage transformer to filter an AC signal from the transformer;
  ii) a comparator coupled to the filter to compare a filtered output of the filter to a voltage;
  iii) an amplifier for amplifying an output of the comparator; and
  iv) an inverter for inverting an output of the amplifier and producing a signal representative of a frequency of the AC signal;

a voltage shifter to bias the lower voltage above a ground potential by a predetermined voltage to produce a full-wave biased voltage waveform;

a mechanical counter to determine a first count value based on a total number of times the circuit breaker trips;

an interruption level counter to determine a second count value, the second count value indicating a current range flowing between the power source and the load when the circuit breaker trips, the interruption level counter includes a plurality of count values of respective ranges of current flows, the ranges of current flows selected from the group consisting of
  i) the current flow being less than about 100% of a trip rating of the circuit breaker;
  ii) the current flow being between about 100% and 300% of the trip rating of the circuit breaker;
  iii) the current flow being between about 300% and 600% of the trip rating of the circuit breaker;
  iv) the current flow being between about 600% and 900% of the trip rating of the circuit breaker, and
  v) the current flow being greater than about 900% of the trip rating of the circuit breaker;

a fault counter to determine a third count value, the third count value indicating a count of a fault condition that trips the circuit breaker, the fault condition being at least one of:
  i) an overload fault;
  ii) a short time fault;
  iii) an instantaneous fault; and
  iv) a ground fault;

an energy information controller coupled to the sensor, the transition detector, the interruption level counter, and the voltage shifter, the energy information controller measures i) the current flow through the circuit breaker when the circuit breaker trips and interrupts the current flow between the power source and the load, and ii) the full-wave biased voltage to determine a plurality of energy related parameters using an AC signal frequency based on the transition signal;

a keypad coupled to the energy information controller to enter a user input, the user input for controlling at least one of the circuit breaker and a display;

a memory to store a date of manufacture of the circuit breaker;

the display coupled to the energy information controller to display at least one of i) the plurality of energy related parameters and ii) the date of manufacture, of the circuit breaker responsive to the user input, the plurality of energy related parameters including:

a) an energy demand calculated according to the following equation:

$$\frac{\sum_{n=1}^{T_{PRG}} \left( \frac{I_A + I_B + I_C}{3} \right)}{T_{PRG}} = AmpDemand$$

where $T_{PRG}$ is a programmable demand period, and $I_A$, $I_B$ and $I_C$ are phase currents for phases A, B and C, respectively; and b) a plurality of RMS parameters measured over a range of harmonics of a fundamental frequency of the power source based on at least one of the voltage, the current and the frequency, over a predetermined period of time, the range of harmonics including up to at least about a 19th harmonic of the fundamental frequency;

a security controller for selectively allowing access of the energy information system by the keypad; and a communication port including at least one of an RS-232 communication port and an RS485 communication port, the communication ports coupled to the energy information controller to selectively communicate at least one of the plurality of energy related parameters and the date of manufacture to a remote terminal;

wherein the communication ports provide for upload and download of data between the remote terminal and the energy information controller;

the display displays the plurality of energy related parameters in one of a plurality of languages based on a user selection through at least one of the keypad and the communication port; and the energy information system is field installable within the circuit breaker.

* * * * *